(12) United States Patent
Hayashi et al.

(10) Patent No.: US 8,507,345 B2
(45) Date of Patent: Aug. 13, 2013

(54) SEMICONDUCTOR DEVICE AND MANUFACTURING METHOD THEREOF

(75) Inventors: Tetsuya Hayashi, Yokosuka (JP);
Hideaki Tanaka, Yokosuka (JP);
Masakatsu Hoshi, Yokohama (JP);
Saichirou Kaneko, Mukou (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 46 days.

(21) Appl. No.: 13/246,454

(22) Filed: Sep. 27, 2011

(65) Prior Publication Data
US 2012/0021579 A1     Jan. 26, 2012

Related U.S. Application Data

(62) Division of application No. 11/654,666, filed on Jan. 18, 2007, now Pat. No. 8,053,320, which is a division of application No. 10/947,264, filed on Sep. 23, 2004, now Pat. No. 7,173,307.

(30) Foreign Application Priority Data

| Sep. 24, 2003 | (JP) | P2003-331246 |
| Sep. 24, 2003 | (JP) | P2003-331262 |
| Mar. 9, 2004 | (JP) | P2004-065468 |
| Mar. 9, 2004 | (JP) | P2004-065958 |

(51) Int. Cl.
*H01L 21/336*     (2006.01)

(52) U.S. Cl.
USPC .... 438/270; 438/289; 438/298; 257/E21.066; 257/21.409; 257/E21.41; 257/E29.262

(58) Field of Classification Search
USPC ......... 438/197, 270, 289, 298; 257/E21.066, 257/E21.409, E21.41, E29.081, E29.104, 257/E29.262

See application file for complete search history.

(56) References Cited

U.S. PATENT DOCUMENTS

| 4,636,823 A | 1/1987 | Margalit et al. |
| 5,170,231 A * | 12/1992 | Fujii et al. ........... 257/77 |

(Continued)

FOREIGN PATENT DOCUMENTS

| JP | 06-053514 A | 2/1994 |
| JP | 06-314791 A | 11/1994 |

(Continued)

OTHER PUBLICATIONS

J. Tan et al., "High-Voltage Accumulation-Layer UMOSFET's in 4H-SiC," IEEE Electronic Device Letters, vol. 19, No. 12, Dec. 1998.

(Continued)

*Primary Examiner* — Matthew Landau
*Assistant Examiner* — Colleen E Snow
(74) *Attorney, Agent, or Firm* — McDermott Will & Emery LLP

(57) ABSTRACT

An aspect of the present invention provides a semiconductor device that includes a first conductivity type semiconductor body, a source region in contact with the semiconductor body, whose bandgap is different from that of the semiconductor body, and which formed heterojunction with the semiconductor body, a gate insulating film in contact with a portion of junction between the source region and the semiconductor body, a gate electrode in contact with the gate insulating film, a source electrode, a low resistance region in contact with the source electrode and the source region, and connected ohmically with the source electrode, and a drain electrode connected ohmically with the semiconductor body.

16 Claims, 35 Drawing Sheets

(56) References Cited

U.S. PATENT DOCUMENTS

| | | |
|---|---|---|
| 5,672,889 A | 9/1997 | Brown |
| 5,693,569 A | 12/1997 | Ueno |
| 5,696,396 A | 12/1997 | Tokura et al. |
| 6,033,969 A | 3/2000 | Yoo et al. |
| 6,057,558 A | 5/2000 | Yamamoto et al. |
| 6,150,693 A | 11/2000 | Wollesen |
| 6,246,077 B1 | 6/2001 | Kobayashi et al. |
| 6,262,439 B1 | 7/2001 | Takeuchi et al. |
| 6,426,248 B2 | 7/2002 | Francis et al. |
| 6,504,176 B2 | 1/2003 | Kitabatake et al. |
| 6,849,519 B2 | 2/2005 | Dong |
| 2002/0009867 A1 | 1/2002 | Numazawa et al. |
| 2003/0042491 A1 | 3/2003 | Kumar et al. |
| 2004/0079989 A1 | 4/2004 | Kaneko et al. |
| 2005/0045892 A1 | 3/2005 | Hayashi et al. |
| 2005/0095808 A1 | 5/2005 | Chiu et al. |
| 2006/0057795 A1 | 3/2006 | Chakihara et al. |

FOREIGN PATENT DOCUMENTS

| | | |
|---|---|---|
| JP | 09-199721 A | 7/1997 |
| JP | 10-173178 A | 6/1998 |
| JP | 10-233503 | 9/1998 |
| JP | 2003-218398 | 7/2003 |
| JP | 2003-318398 | 11/2003 |
| WO | WO 97/47045 | 12/1997 |

OTHER PUBLICATIONS

European Search Report issued in European Patent Application No. EP 04 02 2463.6 dated Dec. 16, 2009.

Afanasev, V. V., et al., "Intrinsic $SiC/SiO_2$ Interface States" Phys. Stat. Sol. (A) 162, 321 (1997), pp. 321-337.

\* cited by examiner

Si/4H-SiC ENERGY BAND (NON-CONTACT)

Si/4H-SiC ENERGY BAND (HETERO-JUNCTION)

OFF STATE    ON STATE

Si/4H-SiC ENERGY BAND (NON-CONTACT)

Si/4H-SiC ENERGY BAND (HETERO-JUNCTION)

SEMICONDUCTOR DEVICE AND MANUFACTURING METHOD THEREOF

RELATED APPLICAITONS

This application is a Divisional of U.S. application Ser. No. 11/654,666, filed on Jan. 18, 2007, now U.S. Pat. No. 8,053,320, which is a Divisional of U.S. application Ser. No. 10/947,264, filed on Sep. 23, 2004, now U.S. Pat. No. 7,173,307, which in turn claims the benefit of Japanese Application Nos. 2003-331246 and 2003-331262, filed on Sep. 24, 2003 and 2004-065468 and 2004-065958, filed on Mar. 9, 2004, the entire contents of each of which are hereby incorporated by reference.

BACKGROUND OF THE INVENTION

The present invention relates to a semiconductor device and a manufacturing method thereof, and particularly to a semiconductor which includes a heterojunction and a manufacturing method thereof.

It is known MOSFET which is made up of silicon carbide as a material as a related art of the invention. With regard to the MOSFET disclosed in Japanese Laid-open Patent Publication No. Hei 10-233503, an n– type drain region is formed on an n+ type silicon carbide substrate region. On the surface of the drain region, a P type well region (a base region) and an n+ type source region are formed. A gate electrode is arranged on the drain region with a gate insulating film placed in-between. A source electrode is formed in a way that the source electrode is arranged adjacent to the well region and the source region. Additionally, a drain electrode is formed on the rear of the silicon carbide substrate region.

The following discussion will provide an overview of operations of this MOSFET. For example, in a case that the gate electrode is grounded or applied with negative potential while the source electrode is grounded and the drain electrode is applied with positive potential, the drain region and the well region are put into a state of being reverse biased, and accordingly current is cut off in the device. Then, if the gate electrode is applied with adequate positive potential, an inversion type channel region is formed on an interface of the gate region which is opposite to the gate electrode. Hereby, since electrons flow into the drain region from the source region through the channel region, current runs from the drain electrode to the source electrode. In this manner, the MOSFET of the related art includes a switching function.

SUMMARY OF THE INVENTION

In the case of the above described MOSFET which is made up of silicon carbide as a material, however, defective crystalline structure, i.e. a quantity of interface states, exist on the interface of the well region underneath a gate insulating film in which the inversion type channel region is formed, and accordingly those work as an electron trap. This makes it difficult to improve the channel mobility.

In addition, when the drain electrode is applied with high voltage, electric field spreads not only in the drain region but also in the well region, and thus the electric field deletes. For this reason, the well region needs to have a prescribed thickness of its own in order to prevent the drain region and the source region from being punched through. In other words, the length of the well region underneath the gate insulating film in which the inversion type channel region is formed, i.e. the channel length, cannot be made shorter than a prescribed length.

Against the background, conventional MOSFETs have embraced some restraint on reduction in resistance in the inversion type channel region, resultantly an on state resistance The present invention has been made in order to solve the above described problems with the prior art. An object of the present invention is to provide a normally-off, voltage driven, high voltage withstanding field effect transistor which can reduce the resistance in the channel region.

An aspect of the present invention provides a semiconductor device that includes a first conductivity type semiconductor body, a source region in contact with the semiconductor body, whose bandgap is different from that of the semiconductor body, and which formed heterojunction with the semiconductor body, a gate insulating film in contact with a portion of junction between the source region and the semiconductor body, a gate electrode in contact with the gate insulating film, a source electrode, a low resistance region in contact with the source electrode and the source region, and connected ohmically with the source electrode, and a drain electrode connected ohmically with the semiconductor body.

Another aspect of the present invention provides a method of manufacturing a semiconductor device that includes (1) growing a source region on a surface of a semiconductor body, (2) growing a low resistance region contacting with the source region, (3) etching the low resistance region and the source region with the same mask pattern in a selective manner, and (4) forming a gate insulating film contacting with the low resistance region, the source region and the semiconductor body.

DETAILED DESCRIPTION OF EMBODIMENTS

Figure 1:
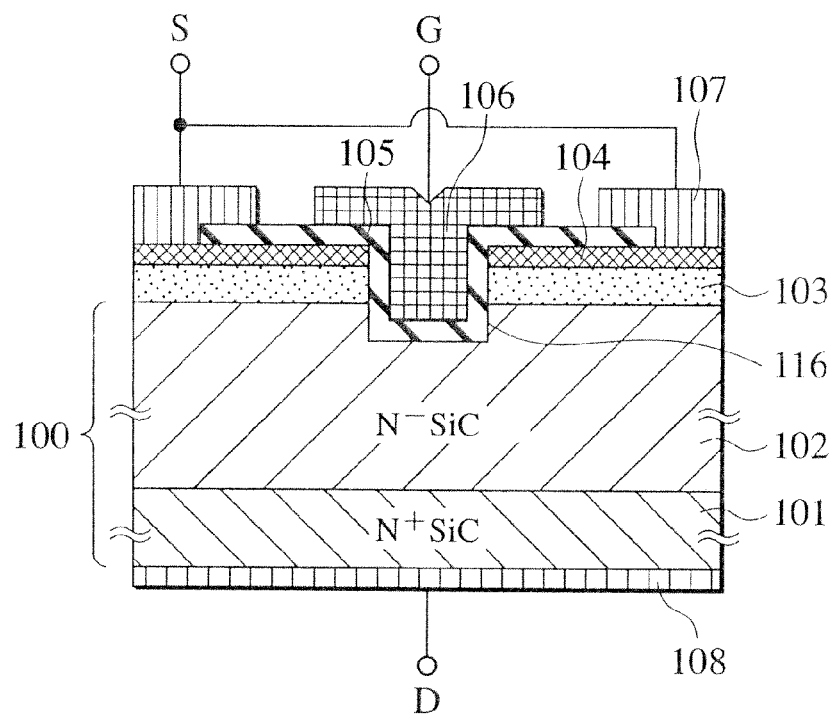
FIG. 1 is a sectional view of a semiconductor device of the first embodiment according to the present invention.

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

First Embodiment

FIG. 1 shows a semiconductor device of the first embodiment according to the present invention. The figure is a cross sectional view of two cells as structural units which face each other. A description will be provided for this embodiment, citing an example of a semiconductor device which uses silicon carbide as a material of the substrate.

For example, an n− type drain region 102 is formed on an n+ type substrate region 101 which is made up of silicon carbide whose polytype is 4H. In addition, a source region 103 which is made up of, for example, n− type polycrystalline silicon is formed on a main interface that is situated on the opposite side of the drain region 102 in relation to a junction interface between the drain region 102 and the substrate region 101. In other words, the contact between the drain region 102 and the source region 103 is formed of heterojunction which is made up of silicon carbide and polycrystalline silicon whose bandgaps are different from each other. Accordingly, an energy barrier exists in the junction interface. A low resistance region 104 which is made up of, for example, cobalt silicide is formed on the interface that is situated on the opposite side of the source region 103 in relation to the junction interface between the source region 103 and the drain region 102. In addition, a gate insulating film 105 which is made up of, for example, a silicon oxide film is formed in contact with the junction interface between the low resistance region 104 and the source region 103 and concurrently with the junction interface between the source region 103 and the drain region 102. Furthermore, a gate electrode 106 is formed on the gate insulating film 105 in a way that the gate electrode 106 is connected onto the gate insulating film 105. A source electrode 107 is formed on the source region 103 in a way that the source electrode 107 is connected onto the source region 103 with the low resistance region 104 placed in-between. A drain electrode 108 is formed on the silicon carbide substrate region 101 in a way that the drain electrode 108 is connected onto the silicon carbide substrate region 101.

Figure 2:
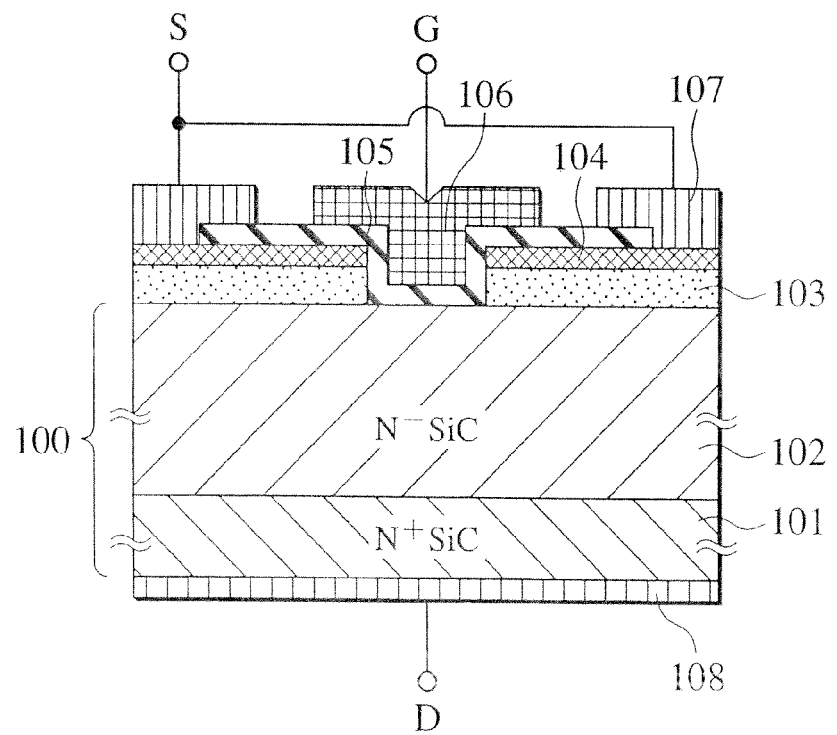
FIG. 2 is a sectional view of another semiconductor device of the first embodiment according to the present invention.

Incidentally, this first embodiment is described, citing an example of what is called a trench type structure. In the trench type structure, as shown in FIG. 1, the trench 116 is formed in the surface of the drain region 102, and the gate electrode 106 is formed in the trench 116 with the gate insulating film 105 placed in-between. This first embodiment, however, accepts what is called a planar type where, as shown in FIG. 2, no trench is formed in the drain region 102. Although a dent is provided in the middle of the surface of the gate electrode in the first embodiment, the surface may instead be planar.

Next, a description will be provided for a method of manufacturing the semiconductor device, made up of silicon carbide, according to the first embodiment of the present invention, as shown in FIG. 1, with reference to FIG. 3A to FIG. 4B.

Figure 3A:
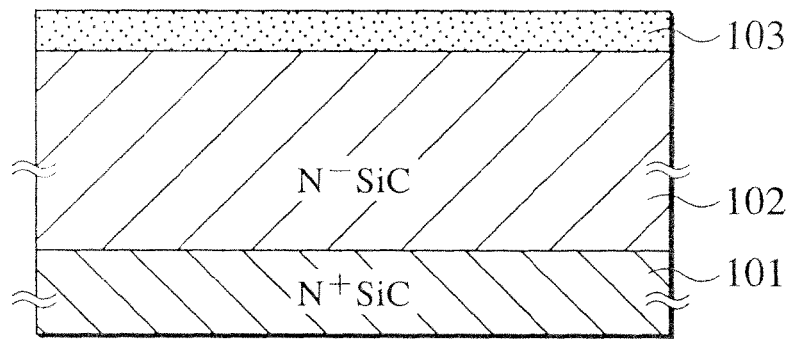
FIGS. 3A, 3B, 4A, and 4B are sectional views for explanation of manufacturing a semiconductor device of the first embodiment according to the present invention.

First, as shown in FIG. 3A, an n type semiconductor device made up of silicon carbide is formed by growing the n⁻ type drain region 102 epitaxially on the n⁺ type substrate region 101. On the surface of the substrate region, polycrystalline silicon is laid up, for example, by an LP-CVD method. Hereafter, an n⁻ type source region 103 is formed, subjected to phosphoric doping, for example, in a POCl₃ atmosphere. In this case, the concentration and thickness of impurities used for the drain region 102, for example, are $1\times10^{16}$ cm$^{-3}$, and 10 µm (micro meter(s)) respectively. The concentration and thickness of impurities used for the source region 103 are $1\times10^{16}$ cm$^{-3}$, and 0.5 µm (micro meter(s)) respectively.

Figure 3B:
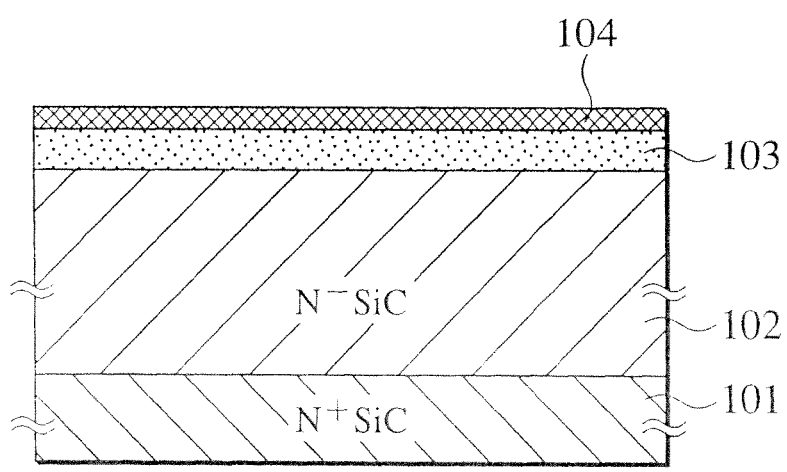

Next, as shown in FIG. 3B, cobalt is deposited on the source region 103. Processed thermally, chemical reaction is caused between polycrystalline silicon and cobalt, and makes polycrystalline silicon and cobalt into alloyed form. In this manner, a low resistance region 104 which is made up of cobalt silicide is formed thereon.

Figure 4A:
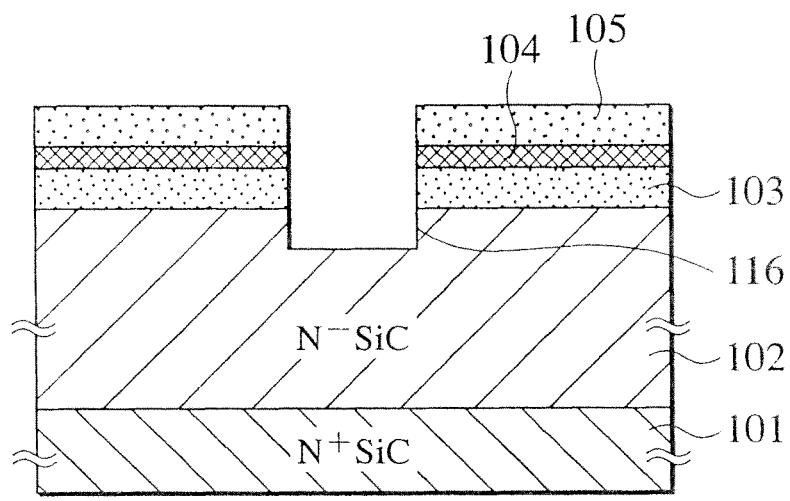

In addition, as shown in FIG. 4A, an oxide film is laid up on the low resistance region 104, and is made into a mask material 115 which is made up of the oxide film through lithographic and etching processes. Subjected to a reactive ion etching process, the low resistance region 104 is etched with the mask material 115 used as a mask, and concurrently the surfaces of the source region 103 and the drain region 102 are etched so that the trench 116 with a prescribed depth is formed.

Figure 4B:
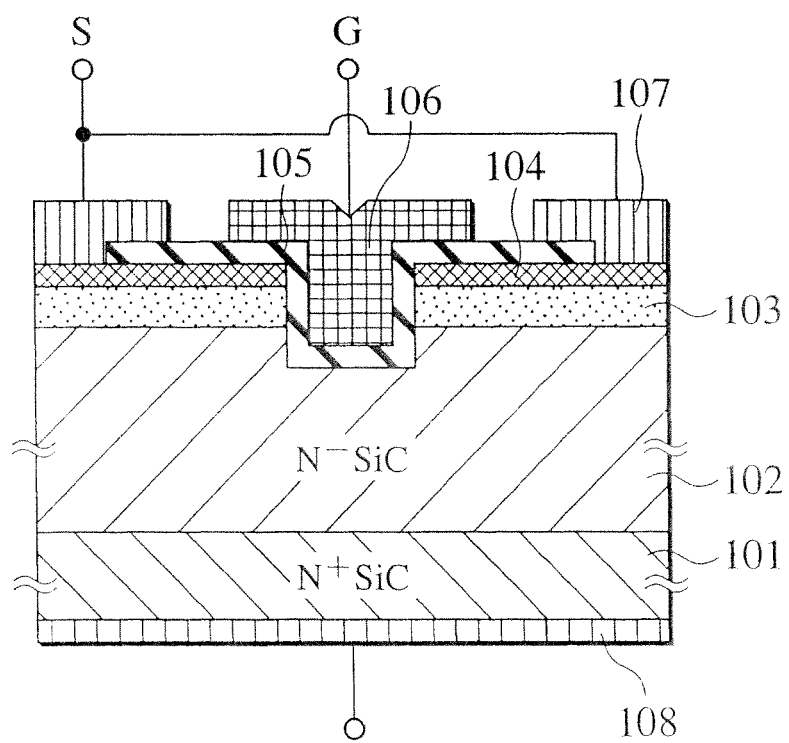

In the end, as shown in FIG. 4B, for example, the mask material 115 is washed off with Hydrofluoric acid solutions, and hereafter a gate insulating film 105 (a gate oxide film) is laid up on the upper surface of the low resistance region 104 and the inner wall of the trench 116. After that, the drain electrode 108 which is made of, for example, titanium (Ti) and nickel (Ni) is formed on the substrate region 101 which is situated on a rear side of the drain region 102. In addition, in the source region 103 which is situated on the front side of the drain region 102, a contact hole is made in a prescribed portion on the gate insulating film 105 through reactive ion etching processes. The source electrode 107 is formed by laying up titanium (Ti) and aluminum (Al), in order, on the low resistance region 104. Eventually, a semiconductor device made up of silicon carbide according to the first embodiment of the present invention is completed as shown in FIG. 1.

Specifically, the method of manufacturing the semiconductor device according to the first embodiment includes at least: a step (1) of laying up the source region 103 on the main surface of the semiconductor substrate; a step (2) of laying up the low resistance region 104 in a way that the low resistance region 104 is in contact with the source region 103; a step (3) of etching the low resistance region 104 and the source region 103 in a selective manner by use of the same mask pattern; and a step (4) of forming the gate oxide films 105 in a way that the gate oxide films 105 are in contact with the low resistance region 104, the source region 103 and the semiconductor body. With such a structure, semiconductor devices according to the first embodiment can be manufactured by use of employing conventional manufacturing technologies.

Next, a description will be given of operations of the semiconductor device. According to the first embodiment, the semiconductor device is used, for example by grounding the source electrode 107 and by applying positive potential to the drain electrode 108.

First, in a case that the gate electrode 106 is applied, for example, with a grounding potential, a condition that current is cut off in the gate electrode 106 is maintained. In other words, this is because an energy barrier against conductive electrons is caused in the heterojunction interface between the source region 103 and the drain region 102. Properties of the heterojunction between polycrystalline silicon and silicon carbide will be described with reference to FIG. 5 to FIG. 9.

FIG. 5 to FIG. 9 are diagrams to show energy band profiles of the semiconductor device. In each figure, the left half of a diagram shows the energy band profile of an n– type silicon which corresponds to the source region 103, and the right half of the diagram shows the energy band profile of 4H type n– type silicon carbide which corresponds to the drain region 102. Incidentally, according to the first embodiment, although a description has been provided for the example of the source region 103 which is made of polycrystalline silicon, FIG. 5 to FIG. 9 will describe the first embodiment with reference to energy band profiles of the silicon. In addition, in order to help understand properties of heterojunction, this description will cite an example of energy levels of the heterojunction in an ideal semiconductor device which does not include an interface state in the heterojunction interface.

Figure 5:
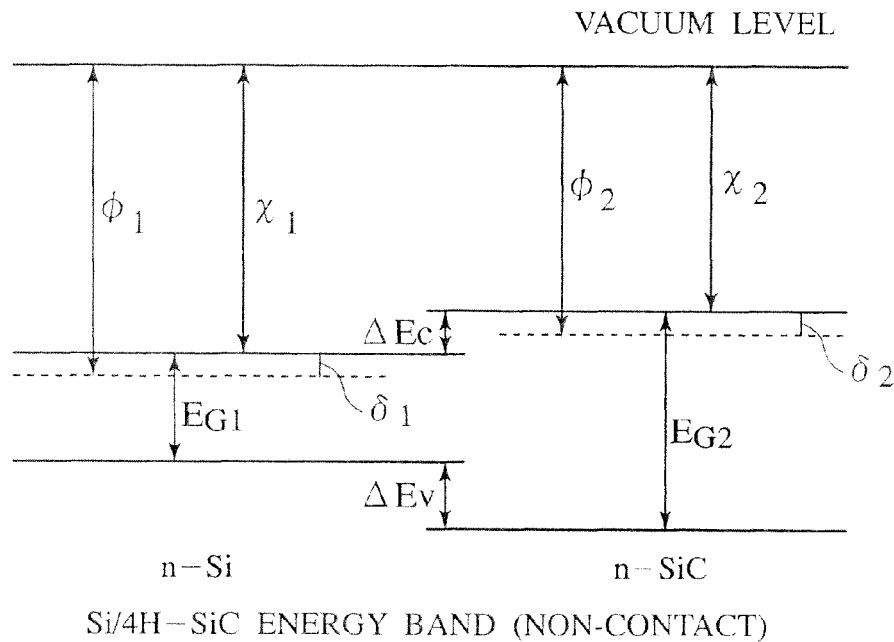
FIG. 5 shows energy band profiles which appears in a state that neither silicon nor silicon carbide is in contact with each other.

FIG. 5 shows energy band profiles which appears in a state that neither silicon nor silicon carbide is in contact with each other. In FIG. 5, with regard to silicon, electron affinity is denominated by χ; work function (energy difference between vacuum level and Fermi level) by φ1; Fermi energy (energy difference between conduction band and Fermi level) by δ1; and bandgap by EG1. Similarly, with regard to silicon carbide, electron affinity is denominated by χ12; work function (energy difference between vacuum level and Fermi level) by φ2; Fermi energy (energy difference between conduction band and Fermi level) by δ2; and bandgap by EG2. As shown in FIG. 5, an energy barrier ΔEC exists in a junction interface between silicon and silicon carbide due to the difference in electron affinity χ between silicon and silicon carbide, and the relationship between them can be expressed with a function (1):

$$\Delta EC = \chi 1 - \chi 2 \tag{1}$$

Figure 6:
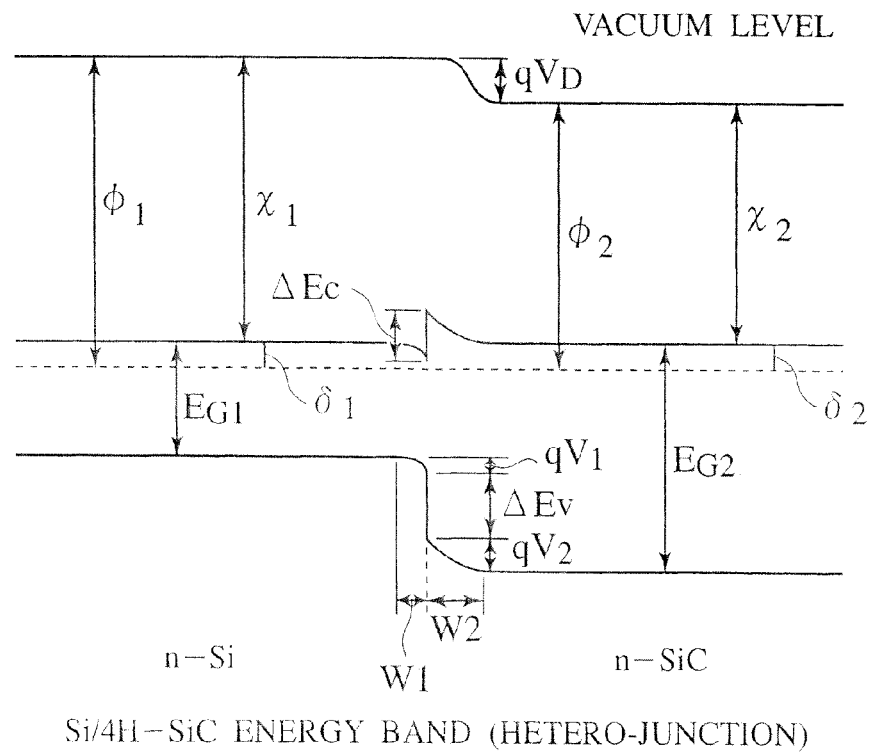
FIG. 6 shows energy band profiles which appear when silicon and silicon carbide are put in contact with each other so that heterojunction is formed of silicon and silicon carbide.

In addition, FIG. 6 shows energy band profiles which appear when silicon and silicon carbide are put in contact with each other so that heterojunction is formed of silicon and silicon carbide. An energy barrier ΔEC still exists after silicon and silicon carbide are put in contact with each other, as it is the case before silicon and silicon carbide are put in contact with each other. For this reason, it is assumed that an electron storage layer with a width W1 is formed in the junction interface on the side of silicon, and that, on the other hand, a depletion layer with a width W2 is formed in the junction interface on the side of silicon carbide. Here, diffusion potential which is caused in both junction interfaces is denominated by VD; an element of the diffusion potential on the side of silicon by V1; and an element of the diffusion potential on the side of silicon carbide by V2. Since VD is an equivalent to the energy difference between silicon and silicon carbide at Fermi levels, the relationship is expressed with functions (2) to (4):

$$VD = (\delta 1 + \Delta Ec - \delta 2)/q \tag{2}$$

$$VD = V1 + V2 \tag{3}$$

$$W2 = ((2 \cdot \in 0 \cdot \in 2 \cdot V2)/(q \cdot N2))^{1/2} \tag{4}$$

Here, ∈0 represents permittivity with vacuum, and ∈2 represents dielectric constant of silicon carbide. N2 represents concentration of ionized impurities of silicon carbide. These functions are given based on electron affinity measurements by Anderson, which is as a model of band incontinuity. These functions represent an ideal state, and do not take an effect of electrostriction into consideration.

Figure 7:
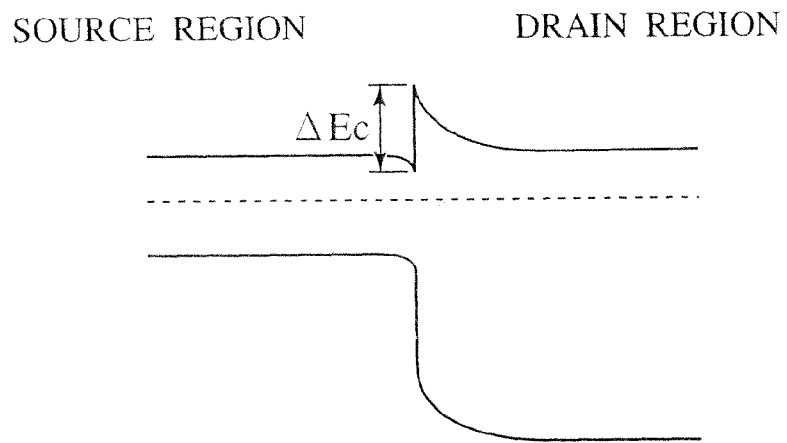
FIGS. 7, 8, and 9 show energy band profiles in the junction interface between the drain region 102 and the source region 103 which is in contact with the gate electrode 106 with the gate insulating film 105 placed in-between of the first embodiment according to the present invention.
Figures 8, 9:
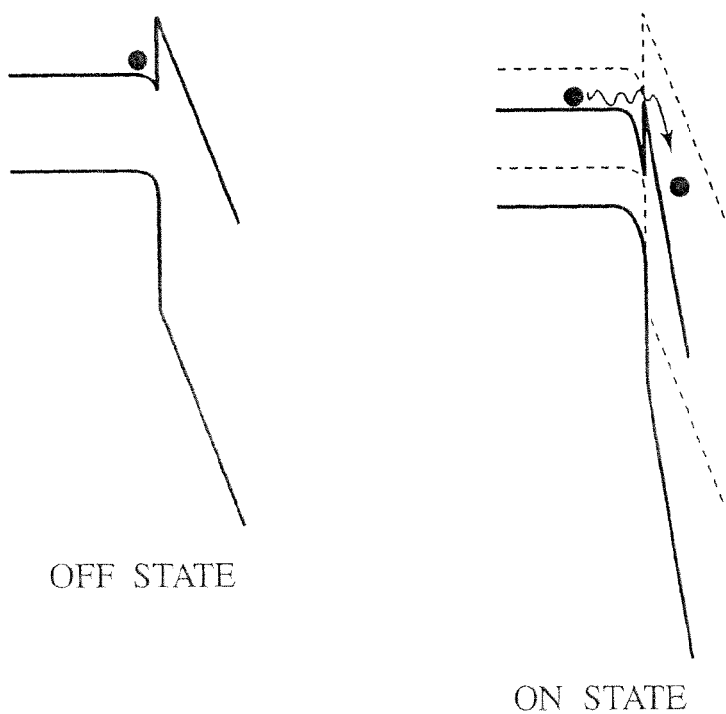

FIG. 7 to FIG. 9 are diagrams to show energy band profiles in the junction interface between the drain region 102 and the source region 103 which is in contact with the gate electrode 106 with the gate insulating film 105 placed in-between according to this first embodiment shown in FIG. 1 as described above. It is assumed that, as shown in FIG. 7, an energy band profile appears in what is called equilibrium in which none of the gate electrode 106, the source electrode 107 and the drain electrode 108 is applied with voltage. It is assumed that, as shown in FIG. 8, an energy band profile appears when the gate electrode 106 and the source electrode 107 are applied with a grounding potential and the drain electrode 108 is applied with adequate positive potential. As shown in FIG. 8, a depletion layer expands in the heterojunction interface on the side of the drain field 102 in response to drain potential applied. By contrast, conductive electrons present in the side of the source region 103 can not bridge the energy barrier ΔEC, the conductive electrons accumulate in the junction interface. This accumulation ends an electric line of force which corresponds to the depletion layer which expands over the junction interface on the side of silicon carbide, and seals the drain field on the side of the source region 103. For this reason, even if the thickness of the polycrystalline silicon of which the source region 103 is formed is, for example, as thin as approximately 20 nm, a state of cutting off current (withstanding voltage) can be maintained. If introduction of the conductivity type polycrystalline silicon or concentration of impurities decreases the electron density of the source region 103, higher performance of cutting off current can be realized.

Next, when the gate electrode 106 is applied with positive potential in order to convert from a cutoff state to a conduction state, the gate field expands up to the heterojunction interface in which the source region 103 and the drain region 102 is in contact with each other with the gate insulating film 105 placed in-between. For this reason, a layer which accumulates conductive electrons is formed in portions of the source region 103 and the drain region 102 in the vicinity of the gate electrode 106. In other words, the energy band profile in the junction interface between the source region 103 and the drain region 102 in the vicinity of the gate electrode 106 changes as indicated with solid lines in FIG. 9. The potential on the side of the source region 103 is suppressed downwards, compared with an energy band profile which appears in a state of being off indicated by broken lines, and accordingly the energy barrier on the side of the drain region 102 becomes steep. This enables conductive electrons to flow through the energy barrier.

This time, according to this embodiment, since the source region 103 and the source electrode 107 are connected with each other in the low resistance region 104, conductive electrons are supplied in low resistance from the source electrode 107 to the source region 103 in which conductive electrons accumulate by the gate field in the vicinity of the gate electrode 106. By this, the conductive electrons which have been cut off by the energy barrier flow from the source electrode 107 to the drain region 102 through the source region 103 which is in contact with the low resistance region 104 and the gate insulating film 105. In other words, a state of conduction is brought about.

In this way, the n− type source region 103, whose electron density is low, and whose cutoff performance is relatively high, is used while in a cutoff state. While in a conduction state, however, even the source region 103 is connected with the source electrode 107 through the low resistance region 104 with low resistance, although conductive electrons accumulate in the source region 103 by the gate field in the vicinity of the gate electrode 106. For this reason, conduction can be brought about in lower resistance in comparison with a case in which the source region 103 and the source electrode 107 are connected with each other directly without the low resistance region 104. Particularly, this effect can function efficiently by making the specific resistance of the low resistance region 104 smaller than that of the drain region 102.

In order to convert from a conduction state to a cutoff state, when the gate electrode 106 is applied with grounding potential again, the state that conductive electrons have accumulated in the heterojunction interface between the source region 103 and the drain region 102 is released, and concurrently tunneling in the energy barrier ceases. In addition, conductive electrons cease flowing from the source region 103 to the drain region 102, and conductive electrons which have existed in the drain region 102 flows to the substrate region 101 so that the conductive electrons are depleted, and hereby a depletion layer expands on the side of the drain region 102 from a portion of the heterojunction so that a cutoff state is brought about.

In addition, according to this embodiment, a conduction in the reverse direction (a return current operation) can be performed which, for example, grounds the source electrode 107 and applies negative potential onto the drain electrode 108, as in the case of the above described conventional architecture.

For example, when the source electrode 107 and the gate electrode 106 are applied with grounding potential and the drain electrode 108 is applied with positive potential which is higher than (qv, +qv2) shown in FIG. 6, the energy barrier against conductive electrons disappears. By this, conductive electrons flow from the drain region 102 to the source region 103, and thus a state of conduction in the reverse direction is brought about. At this time, unlike the conventional structure, the structure according to this embodiment causes conduction by use of conductive electrons only, without injecting holes. For this reason, while converting from a conduction state to a cutoff state, loss caused by reverse recovering current can be reduced.

It should be noted that, when the above described gate electrode 106 is used as a controlling electrode without being grounded, reverse conduction can be brought about if the drain electrode 108 is simply applied with potential which is slower than (qV1+qV2), as in the case of the conventional structure.

With the constitution shown in FIG. 1, as described above, this embodiment can perform the same operations as the above described conventional structure does. In addition, this embodiment has the following features in comparison with the conventional structure.

The semiconductor device according to this embodiment comprises: a first conductivity type semiconductor body which is formed of a substrate region 101 and a drain region 102; a source region 103 which is a first hetero-semiconductor region, which is in contact with a main surface of the semiconductor body, and whose bandgap is different from that of the semiconductor body; the gate electrode 106 which is in contact with a portion of junction between the source region 103 and the semiconductor body with a gate insulating film 105 placed in-between; a source electrode 107 which is connected with the source region 103 with the low resistance region 104 placed in-between for ohmic contact; and a drain electrode 108 which is connected with the semiconductor body ohmically.

As described above, while in a cutoff state, an energy barrier exists in a portion of heterojunction between the semiconductor body and the source region. For this reason, current does not flow between the drain electrode 108 and the source electrode 107. In addition, while in a conduction state, an energy barrier in a portion of heterojunction between the semiconductor body which is opposite to the gate electrode 106 and the source region is caused to be lower, by the gate field, a number of carriers are caused to flow. In other words, current flows between the drain electrode 108 and the source electrode 107. Since switching between current cutoff and current conduction is controlled in the portion of heterojunction between the drain region 102 and the source region 103 in such a way, the thickness of the interface region of the heterojunction which is needed for maintaining a cutoff state corresponding to what is called a channel length can be made small. Accordingly, a channel resistance, i.e. an on state resistance can be reduced.

In addition, control of conductivity over the semiconductor body is not required while manufacturing an element. For this reason, manufacturing processes can be simplified, and problems such as rough surfaces caused by a high temperature annealing process can be avoided. In addition, it is expected that an on state resistance can be improved.

Furthermore, an n− type source region 103 whose electron density is low, and whose cutoff performance is relatively high, is used while in a cutoff state. However, since a portion of the source region 103 which is opposite to the gate is connected ohmically with the source electrode 107 with the low resistance region 104 placed in-between, resistance between the source electrode 107 and the portion of the source region 103 which is opposite to the gate is caused to be lower while in a cutoff state, even though the n− type source region 103 whose electron density is low, and whose cutoff performance is relatively high is used. For this reason, the on state resistance can be reduced further. At this time, if the resistance of the low resistance region 104 is lower than, at least, that of the drain region 102, an effect of the reduced on state resistance can be brought about efficiently.

Additionally, unlike a conventional elements, holes which are minority carriers are not injected into the drain region 102, while in a reverse conduction state. This suppresses the cause of reverse recovery current while in the reverse recovery state.

Furthermore, according to this embodiment (exception for the construction shown in FIG. 2), trenches 116 are arranged in prescribed intervals in a main surface of the semiconductor body. The semiconductor body, the source region and the gate electrode 106 which accompanies the gate insulating film 105 are in contact with one another in the vicinity of the surface of the side wall of the trenches 116. This makes it easy to integrate the semiconductor device, and concurrently enables the gate field from the gate electrode 106 to expand in the portion of heterojunction between the semiconductor body and the source region efficiently while in a conduction state. For this reason, an energy barrier in the portion of heterojunction is caused to be further lower, and accordingly the on state resistance can be reduced.

Second Embodiment

Figure 10:
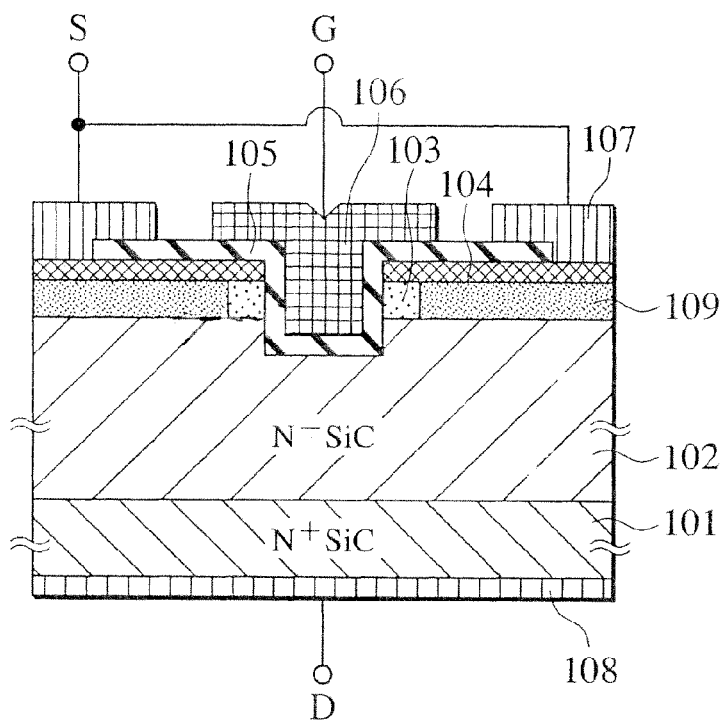
FIG. 10 is a sectional view of a semiconductor device of the second embodiment according to the present invention.

FIG. 10 shows a semiconductor device according to a second embodiment of the present invention. FIG. 10 is a cross sectional view corresponding to FIG. 1 of the first embodiment. For this second embodiment, descriptions of operations which are the same as operations which are performed as shown in FIG. 1 will be omitted, and detailed descriptions will be provided for features which are different from those which have been described in FIG. 1.

Features of the second embodiment are as shown in FIG. 10. A semiconductor device according to the second embodiment includes a withstanding voltage region 109 which is a second hetero-semiconductor region which is in contact with the semiconductor body and the source region 103 which is the first hetero-semiconductor region, and whose bandgap is different from that of the semiconductor body. Junction between the withstanding voltage region 109 and the semiconductor substrate is so formed that voltage withstanding in the portion of the junction is equal to, or higher than, at least that in the portion of junction between the source region 103 and the semiconductor body. In other words, part of the source region 103 shown in FIG. 1 is replaced, for example, with the withstanding voltage region 109 which is formed of p+ type polycrystalline silicon. Specifically, the withstanding voltage region 109 which is formed of p+ type polycrystalline silicon is formed in a way that the withstanding voltage region 109 is in contact with the drain region 102 and the source region 103. This means that, if a portion of heterojunction is formed between the drain region 102 and the p+ type withstanding voltage region 109 whose electron density is low, leakage current can be caused to be lower than that of a portion of heterojunction between the drain region 102 and the source region 103 while in a cutoff state. As a consequence, higher voltage withstanding can be available.

For this reason, the second embodiment can obtain higher cutoff performance while maintaining the effect of the reduced on state resistance which has been shown in the description of the first embodiment.

Furthermore, according to this embodiment, the source region 103 is formed of the first conductivity type, and the withstanding voltage region 109 is formed of the second conductivity type. These constructions enable effects according to the present invention to be realized with ease. It should be noted that the source region 103 and the withstanding voltage region 109 may be formed of the first conductivity type, and that concentration of impurities in the source region 103 may be caused to be equal to, or higher than, that of the withstanding voltage region 109. This enables effects according to the present invention to be realized with ease. The second embodiment, however, produces higher effects of voltage withstanding than the first embodiment. In addition, since the withstanding voltage region 109 is formed of a semiconductor material equivalent to that of the source region 103, manufacturing processes can be simplified.

Third Embodiment

Figure 11:
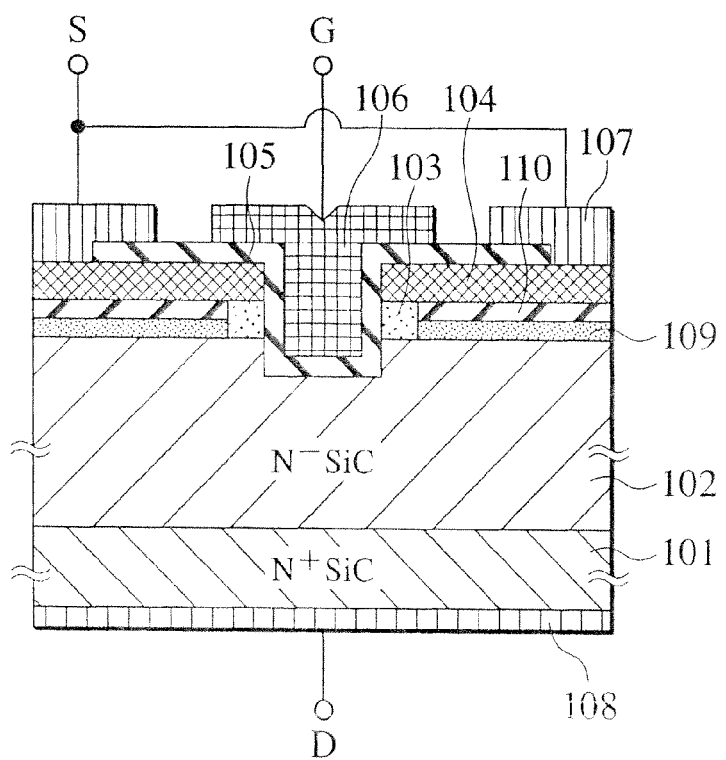
FIG. 11 is a sectional view of a semiconductor device of the third embodiment according to the present invention.

FIG. 11 shows a semiconductor device according to a third embodiment of the present invention. FIG. 11 is a cross sectional view corresponding to FIG. 10 of the second embodiment. For this third embodiment, descriptions of operations which are the same as operations which are performed as shown in FIG. 10 will be omitted, and detailed descriptions will be provided for features which are different from those which have been described in FIG. 10.

According to this third embodiment, as shown in FIG. 11, the source region 103 is formed of an n+ type whose properties include high conductivity, and the low resistance region 104 is formed of n+ type polycrystalline silicon which is the same material used for the source region 103 instead of, for example, cobalt silicide which has been used, as shown in FIG. 10, for the low resistance region 104. These constructions enable manufacturing processes to be simplified. In addition, an interlayer dielectric 110 is formed between the low resistance region 104 and the withstanding voltage region 109. Incidentally, although FIG. 11 shows that the positions of the extremities of the interlayer dielectric 110 match the positions of the extremities of the withstanding voltage region 109, it does not matter whether the interlayer dielectric 110 is larger or smaller than the withstanding voltage region 109. In other word, if the interlayer dielectric 110 is formed at least between any two of the low resistance region 104, the source region 103 and the withstanding voltage region 109, it also serves for the object of the embodiment.

Figure 12A:
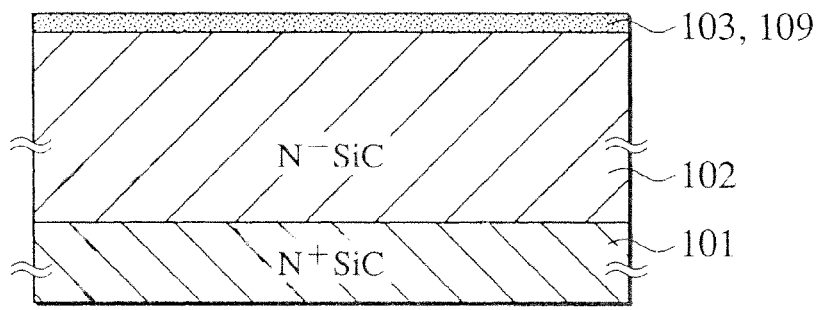
FIGS. 12A, 12B, 12C, 13A, and 13B are sectional views for explanation of manufacturing method of a semiconductor device of the second embodiment according to the present invention.

A method for manufacturing semiconductor devices, as shown in FIG. 11, according to a third embodiment of the present invention will be described with reference to drawings. First, as shown in FIG. 12A, an n+ type silicon carbide semiconductor body is formed by growing an n− type drain region 102 epitaxially on an n+ type substrate region 101. Then, polycrystalline silicon is laid up on the n+ type silicon carbide semiconductor body, for example, through LP-CVD processes. Thence, the semiconductor body is doped with boron, for example, in a BBr$_3$ atmosphere, and accordingly a p+ type withstanding voltage region 109 is formed. At this time, the concentration of impurities and thickness of the drain region 102 are $1\times10^{16}$ cm$^{-3}$ and 10 μm (micro meter(s)) respectively. The concentration of impurities and thickness of the withstanding voltage region 109 are $1\times10^{18}$ cm$^{-3}$ and 0.2 μm (micro meter(s)) respectively.

Figure 12B:
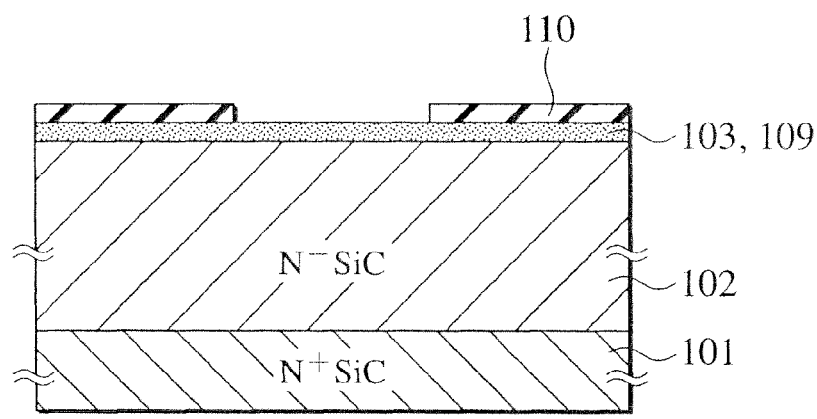

Next, as shown in FIG. 12B, an oxide film is laid up on the withstanding voltage region 109, and an interlayer dielectric 110 is formed through lithographic and etching processes on the oxide film.

Figure 12C:
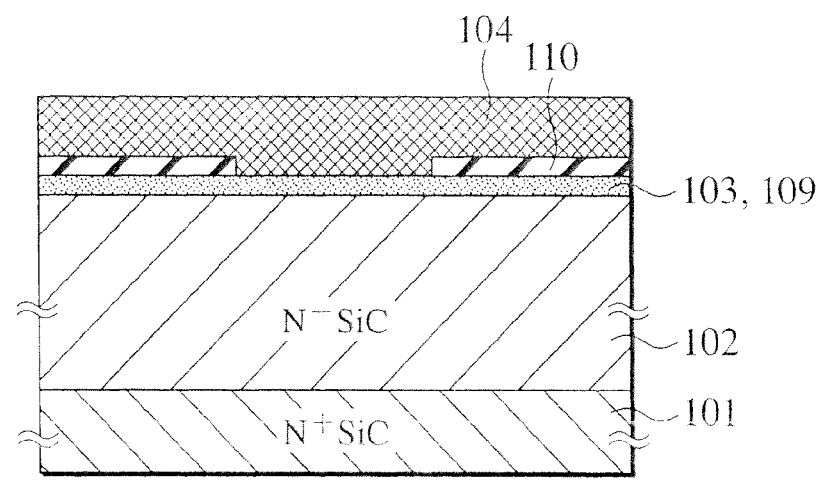

Then, as shown in FIG. 12C, polycrystalline silicon to be a low resistance region 104 is laid up again on the withstanding voltage region 109 and the interlayer dielectric 110.

Figure 13A:
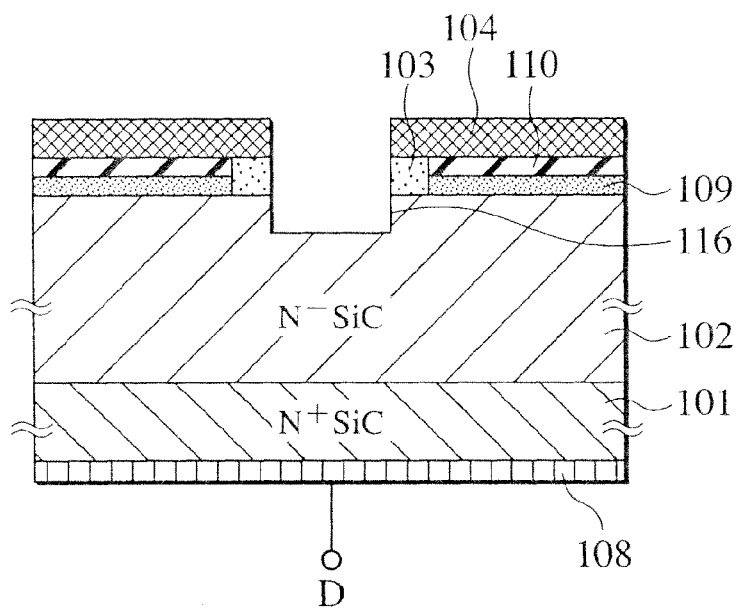

Hereafter, as shown in FIG. 13A, an oxide film is laid up on the low resistance region 104, and a mask material (not illustrated) is formed through lithographic and etching processes on the oxide film. Then, a trench 116 with a prescribed depth is formed through reactive ion etching processes which etches the low resistance region 104 and concurrently the surfaces of the source region 103 and the drain region 102. Then, the mask material is washed off with Hydrofluoric acid solutions, and hereafter an n+ type source region 104 and the low resistance region 104 are formed through being doped with phosphorus, for example, in a POCl$_3$ atmosphere. At this time, the concentration of impurities and thickness of the low resistance region 104 are, for example, $5\times10^{19}$ cm$^{-3}$ and 0.5 μm (micro meter(s)) respectively.

Figure 13B:
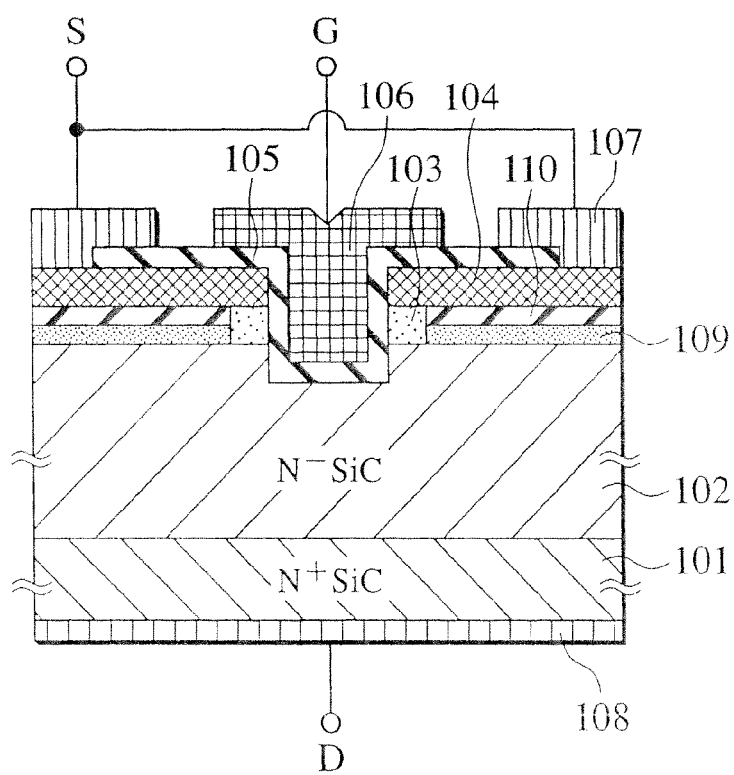

Finally, as shown in FIG. 13B, a gate insulating film 105 is laid up on the upper surface of the low resistance region 104 and the inner wall of the trench 116. Hereafter, a drain electrode 108 which is made up, for example, of Titanium (Ti) and Nickel (Ni) is formed on the substrate region 101 which is situated on a rear side of the drain region 102. In the source region 103 which is situated on the front side of the semiconductor device, a contact hole is made in a prescribed position on the gate insulating film 105 through reactive ion etching processes, and the source electrode 107 is formed by laying up Titanium (Ti) and Aluminum (AL) in order on the upper surface of the low resistance region 104. The silicon carbide semiconductor substrate as shown in FIG. 11 according to the third embodiment of the present invention is completed in this way.

In other words, a method for manufacturing the semiconductor device according to this embodiment comprises at least: a step (1) for laying up the source region 103 on the main surface of the semiconductor substrate; a step (2) for laying up the low resistance region 104 in a way that the low resistance region 104 is in contact with the source region 103; a step (3) for etching the low resistance region 104 and the source region 103 with the same mask pattern in a selective manner; and a step (4) for constructing the gate insulating film 105 in a way that the gate insulating film 105 is in contact with the low resistance region 104, the source region 103 and the semiconductor body. Between the step (1) and the step (2), the method for manufacturing the semiconductor device further comprises at least: a step for laying up the interlayer dielectric 110; and a step for etching the interlayer dielectric 110 in a selective manner.

Employing these constructions, the semiconductor device according to this embodiment can be realized by use of conventional manufacturing technologies with ease.

This embodiment makes it easier than the second embodiment to cause the on state resistance and the voltage withstanding to be compatible with each other in this way. This is because, when an element is formed, the construction of the interlayer dielectric 110 between the withstanding voltage region 109 and the low resistance region 104 enables the device to be formed while avoiding mixture of the materials used for the low resistance region 104, the source region 103 and the withstanding voltage region 109 as well as different conductivity types and concentrations of impurities thereof even in a case that the low resistance region is made up of polycrystalline silicon which is capable of being processed with relatively high temperature.

In addition, while in a cutoff state, leakage current which is generated between the drain region 102 and the withstanding voltage region 119 underneath the interlayer dielectric 110 can not flow into the low resistance region 104 directly, and accordingly this makes the passage for the conduction longer. As a consequence, generation of leakage current can be suppressed in the withstanding voltage region 109.

Fourth Embodiment

Figure 14:
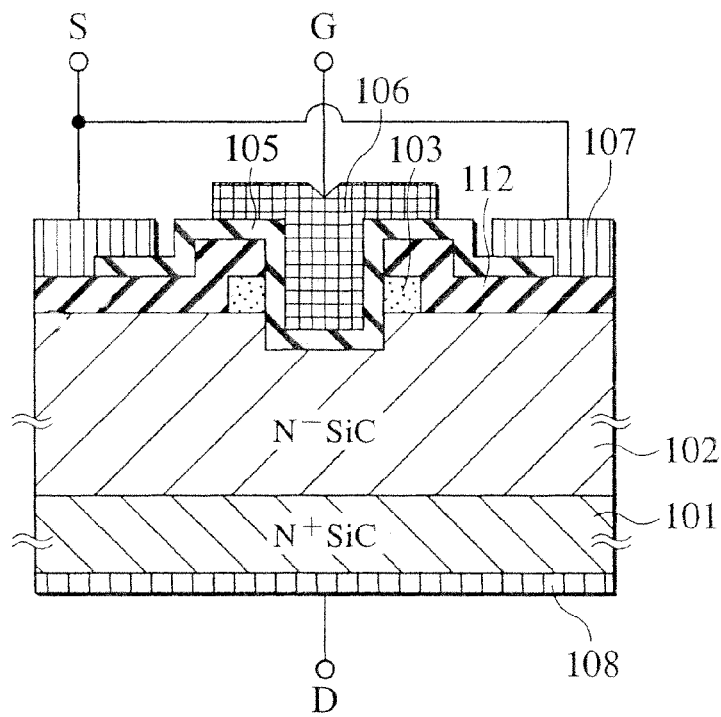
FIG. 14 is a sectional view of a semiconductor device of the fourth embodiment according to the present invention.

FIG. 14 shows a semiconductor device according to a fourth embodiment of the present invention. FIG. 14 is a cross sectional view corresponding to FIG. 10 of the second embodiment. For this fourth embodiment, descriptions of operations which are the same as operations which are performed as shown in FIG. 10 will be omitted, and detailed descriptions will be provided for features which are different from those which have been described in FIG. 10.

As shown in FIG. 14, the semiconductor device according to the embodiment includes a metallic region 112 which is in contact with a semiconductor body and a source region, and which makes Schottky junction with the semiconductor body. The semiconductor is configured so that voltage withstanding in the portion of the junction between the metallic region 112 and the semiconductor body is at least equal to, or larger than, that in the portion of the junction between the source region and the semiconductor body. In other words, the metallic region 112 which is made up, for example, of Nickel (Ni) is formed instead of the low resistance region 104 and the withstanding voltage region 109 in FIG. 10. Specifically, the metallic region 112 makes Schottky junction in the portion of the junction between the metallic region 112 and the drain region 102, and concurrently functions as a low resistance region which bridges between the source region 103 and the source electrode 107. As a consequence, since the low resistance region is made up of the same material that constitutes the metallic region 112, manufacturing processes can be simplified. The case that the metallic region 112 functions as the low resistance region has been described for this embodiment. It should be noted, however, that, if the portion in which the low resistance region is currently formed is assigned for a region other than the metallic region by use of a different material, it also serves for the object of this embodiment.

These constructions cause a depletion layer to expand in the Schottky junction interface on the side of the drain region 102 in response to drain potential applied while in a cutoff state. For this reason, conductive electrons which exist on the side of the metallic region 112 can not clear the Schottky barrier, and conductive electrons accumulate in the junction interface. Accordingly, this ends an electric line of force which matches the depletion layer that expands on the side of the silicon carbide ends, as in the case of the heterojunction. In addition, the drain field is sealed on the side of the metallic region 112. At this time, if a material used for the metallic region 112 is selected for the purpose of causing the energy barrier of the Schottky junction to be higher than that of the heterojunction made up of the withstanding voltage region 109 shown in FIG. 10, this enables a stronger cutoff property to be realized. Employing the constructions which are different from those of the second embodiment, this third embodiment can improve voltage withstanding while in a cutoff state, and concurrently can suppress leakage current while in a cutoff state.

The semiconductor device according to this embodiment includes a stronger conduction property, since the metallic region 112 does not have effect on the source region 103 which functions as a switch and concurrently operates as a low resistance region between the source region 103 and the source electrode 107, while in a conduction state.

Fifth Embodiment

Figure 15:
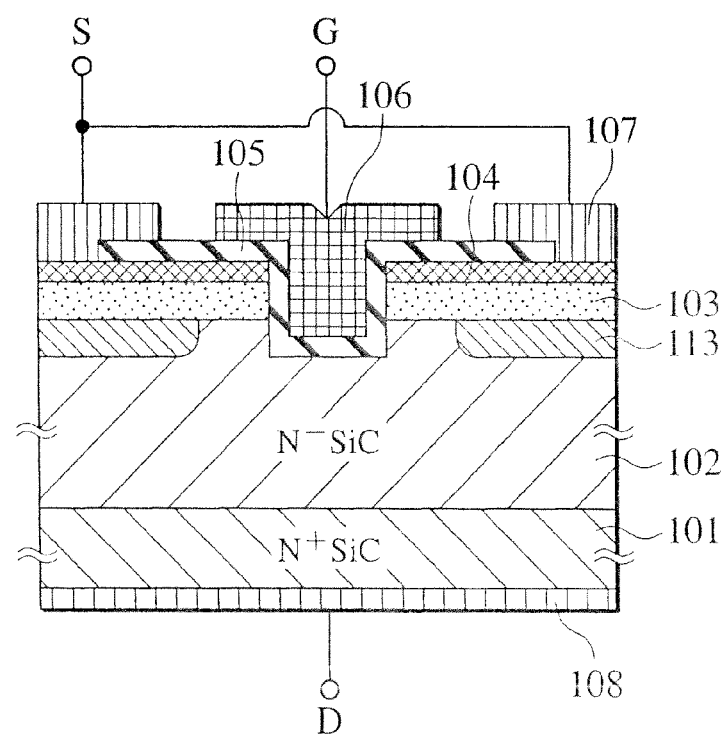
FIG. 15 is a sectional view of a semiconductor device of the fifth embodiment according to the present invention.

FIG. 15 shows a semiconductor device according to a fifth embodiment of the present invention. FIG. 15 is a cross sectional view corresponding to FIG. 1 of the first embodiment. For this fifth embodiment, descriptions of operations which are the same as operations that are performed as shown in FIG. 1 will be omitted, and detailed descriptions will be provided for features which are different from those that have been described in FIG. 1. According to this fifth embodiment, as shown in FIG. 15, a second conductivity type, p type or p+ type field relaxation region 113 is formed in a way that the field relaxation region 113 is in contact with the surfaces of the source region 103 and the drain region 102 in a prescribed distance away from a portion in which the gate electrode 106 and the source region 103 are opposite to each other.

Figure 16:
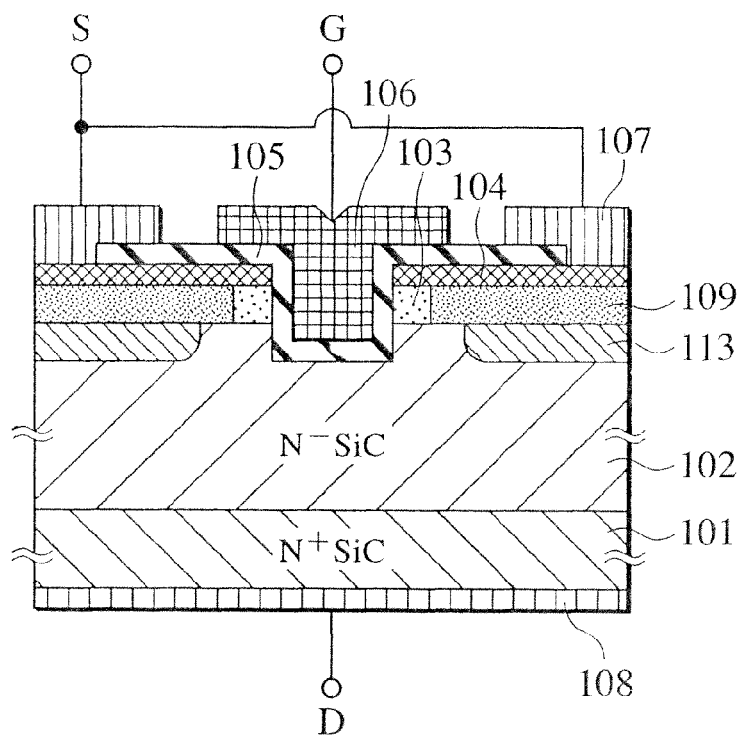
FIG. 16 is a sectional view of another semiconductor device of the fifth embodiment according to the present invention.
Figure 17:
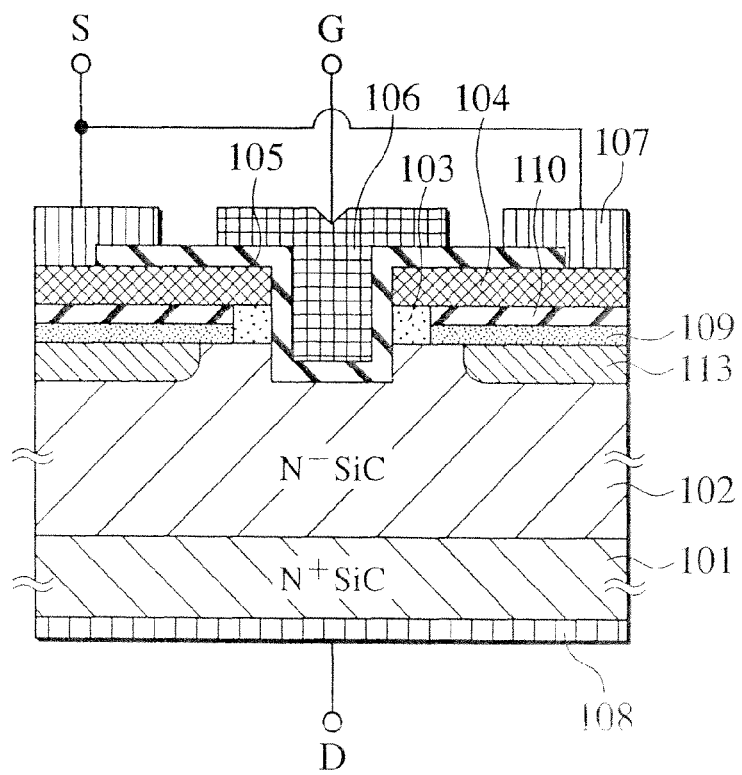
FIG. 17 is a sectional view of still another semiconductor device of the fifth embodiment according to the present invention.
Figure 18:
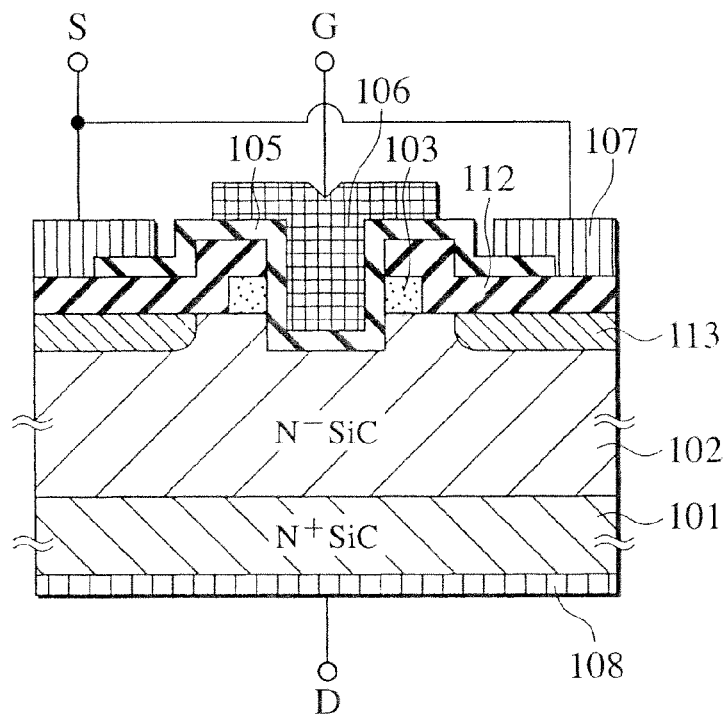
FIG. 18 is a sectional view of still another semiconductor device of the fifth embodiment according to the present invention.

While in a cutoff state, this construction causes a depletion layer to expand from the field relaxation region 113 between the field relaxation region 113 and the drain region 102 in response to drain potential, and hereby this construction causes the semiconductor body to be depleted. For this reason, leakage current can be reduced in comparison with the first embodiment, and consequently the cutoff property, i.e. voltage withstanding while in a cutoff state, is improved. It should be noted that application of this field relaxation region 113 is not limited to the construction of FIG. 1 according to the first embodiment, but the field relaxation region 113 can be applied to each construction according to the second, third and fourth embodiments as shown in FIG. 16 to FIG. 18. If the semiconductor device is configured so that the second conductivity type field relaxation region 113 is formed on the main surface of the semiconductor body in a way that the field relaxation region 113 is kept in a prescribed distance away from the portion in which the semiconductor body is in contact with the gate electrode 106 with the source region and the gate insulating film 105 placed in-between, and in a way that the field relaxation region 113 is in contact with at least one of the source region 103 (shown in FIG. 15), the withstanding voltage region 109 (shown in FIG. 16 and FIG. 17) and the metallic region 112 (shown in FIG. 18), it serves for the object of this embodiment.

Six Embodiment

Figure 19:
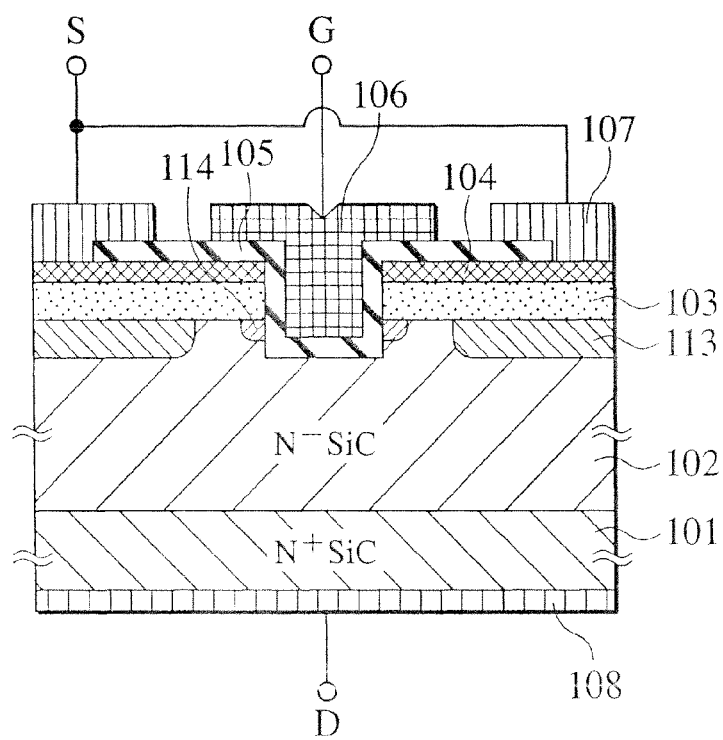
FIG. 19 is a sectional view of a semiconductor device of the sixth embodiment according to the present invention.

FIG. 19 shows a semiconductor device according to a sixth embodiment of the present invention. FIG. 19 is a cross sectional view corresponding to FIG. 15 of the fifth embodiment. For this fifth embodiment, descriptions of operations which are the same as operations that are performed as shown in FIG. 15 will be omitted, and detailed descriptions will be provided for features which are different from those that have been described in FIG. 15.

According to this sixth embodiment, as shown in FIG. 19, an n+ type conduction region 114 whose concentration is higher than that of a drain region 102 is formed in a prescribed portion of the drain region 102 where a gate electrode 106 and a source region 103 are in contact with each other with a gate insulating film 105 placed in-between. In other words, the first conductivity type conduction region 114 whose concentration of impurities is higher than that of a semiconductor body is formed on the main surface of the semiconductor body in a way that the conduction region 114 is in contact with the gate electrode 106 with the source region 103 and the gate insulating film 105 placed in-between.

While in a conduction state, this construction causes majority carriers, which is to flow from the source region 103 to the semiconductor body, to flow with ease in a conduction state. For this reason, the energy barrier in a portion of heterojunction between the source region 103 and the conduction region 114 is relaxed further, and accordingly a higher conduction property can be obtained. In other words, since the on state resistance becomes further smaller, the conduction performance is improved.

Figure 20:
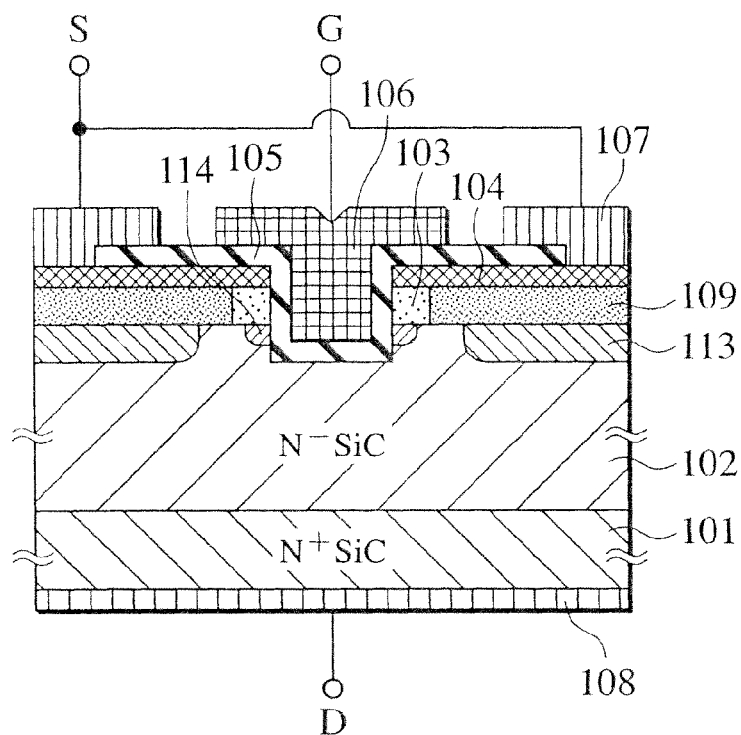
FIG. 20 is a sectional view of another semiconductor device of the sixth embodiment according to the present invention.
Figure 21:
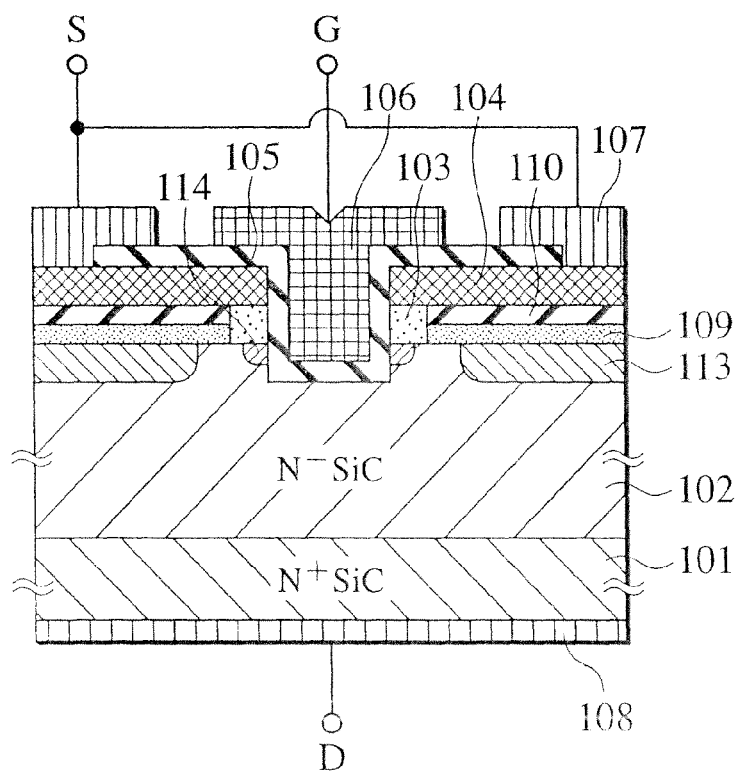
FIG. 21 is a sectional view of still another semiconductor device of the sixth embodiment according to the present invention.
Figure 22:
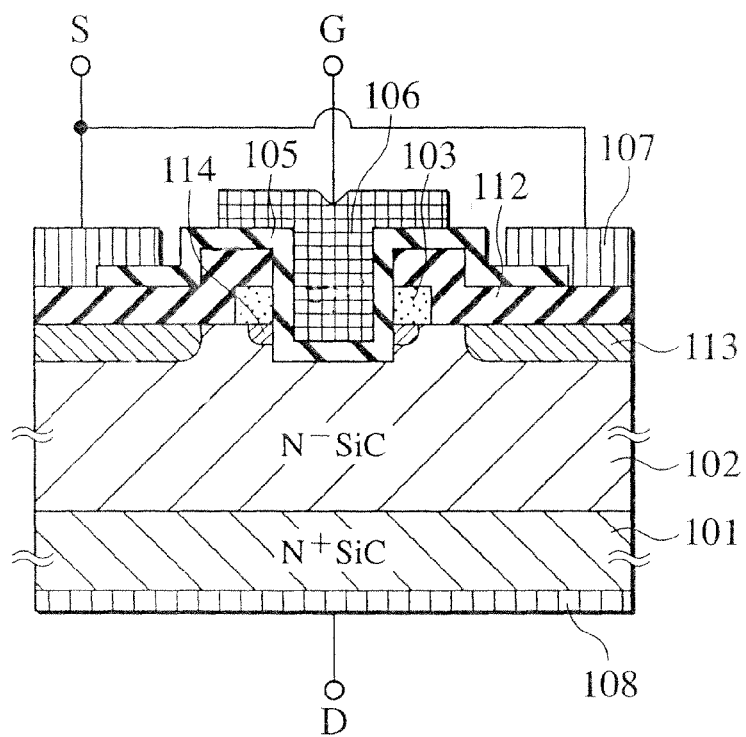
FIG. 22 is a sectional view of still another semiconductor device of the sixth embodiment according to the present invention.

It should be noted that application of this conduction region 114 is not limited to the construction of FIG. 15 according to the fifth embodiment. This conduction region 114 can be applied to each construction of FIG. 16 to FIG. 18, as shown in FIG. 20 to FIG. 22. In addition, this conduction region 114 can be also applied to the constructions corresponding to FIG. 1, FIG. 10, FIG. 11 and FIG. 14 which do not include the field relaxation region 113, although not illustrated.

The first to sixth embodiments have been described citing an example of a semiconductor device, i.e. a widegap semiconductor, whose substrate is made up of silicon carbide. (In this case, effects brought about by the present invention can be realized efficiently by a simple manufacturing method.) However, silicon, silicon germanium, gallium nitride, diamond and other semiconductor materials may be used for a substrate material. In addition, although all the embodiments have been described citing an example of silicon carbide which is 4H type as polytype, other polytypes such as 6H and 3C may be also can be used. Furthermore, although all the embodiments have been described citing an example of what is called a vertical structure transistor, in which the drain electrode 108 and the source electrode 107 are arranged in a way that the drain electrode 108 and the source electrode 107 are opposite to each other with the drain region 102 placed in-between, and in which drain current is caused to flow vertically, for example, the semiconductor device may be what is called a horizontal structure transistor, in which the drain electrode 108 and the source electrode 107 are arranged on the same main surface, and in which drain current is caused to flow horizontally.

In addition, all the embodiments have been described citing the case that polycrystalline silicon is employed as a material to be used for the source region 103, the withstanding voltage region 109 and the low resistance region 104. Whatever material can make heterojunction with silicon carbide may be used. In addition, the material is not limited to polycrystalline silicon, but monocrystalline silicon and amorphous silicon may be also used. These materials enable the semiconductor device to be realized with ease. Furthermore, although the embodiments have been described citing the case that n type silicon carbide is used for the drain region 102 and n type polycrystalline silicon is used for the source region 103, whatever combination of n type silicon carbide and p type polycrystalline silicon, p type silicon carbide and p type polycrystalline silicon as well as p type silicon carbide and n type polycrystalline silicon may be also used.

Additionally, although the first to sixth embodiments have been described citing the case that cobalt silicide and n+ type polycrystalline silicon are used as a material for the low resistance region 104, the low resistance region 104 may be made up of other single metals, alloys, compound metals and semiconductor materials. This enables the semiconductor device to be realized with ease. Furthermore, the low resistance region 104 may be made up of silicide such as tungsten silicide and nickel silicide. Employment of these generally used materials enables the semiconductor device to be realized with ease.

Furthermore, the fourth to sixth embodiments have been described citing the case that Nickel is used as a material for the metallic region 112. A material for the metallic region 114 is not limited to Nickel, but whatever material makes Schottky junction with the semiconductor body may be used. Specifically, titanium, gold platinum and the like which make Schottky junction may be used.

Seventh Embodiment

Next, a description will be provided for a seventh embodiment. The above described planar type MOSFET of silicon carbide is disclosed, for example, in V. V. Afanasev, M. Bassler, G. Pensl and M. Schulz, Phys. Stat, Sol(A) 162 (1997) 321. This disclosure has made it known that defective crystal structures, i.e. a quantity of interface states, are present in the interface between a gate insulating film and an inversion type channel region. By this, a quantity of interface states are present in the inversion type channel on the surface of a channel region, which has been formed by applying voltage onto a gate electrode, and these interface states function as electron traps. For this reason, channel mobility can not be increased, and consequently this causes a problem of increasing the on state resistance of the planar type MOSFET of silicon carbide. Against this background, with regard to this embodiment, a description will be provided for a semiconductor device which realizes low on state resistance with high voltage, and for a method for manufacturing the semiconductor device. Incidentally, all the embodiments have described the widegap semiconductors citing a case that polycrystalline silicon is a semiconductor material to be used for the widegap semiconductors whose bandgap is different from those of a silicon carbide semiconductor and a wide bandgap semiconductor.

Figure 23:
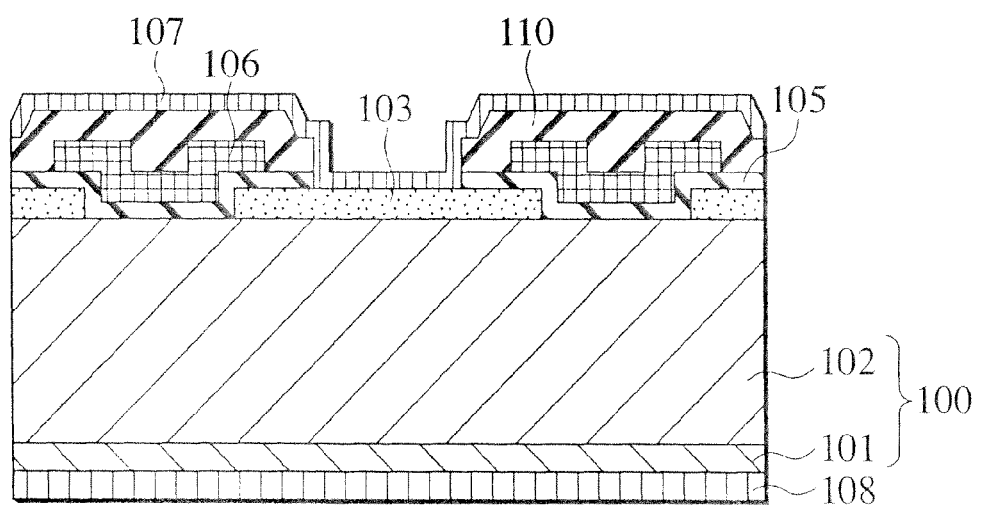
FIG. 23 is a sectional view of a semiconductor device of the seventh embodiment according to the present invention.

FIG. 23 shows a semiconductor device according to a seventh embodiment. The figure is a cross sectional view of two cells as structural units which are arranged in series. A drain region 102 is laid up on a substrate region 101 which is a drain region. In other words, a first conductivity type semiconductor body 100 is formed of the substrate region 101 and the drain region 102. A source region 103 which is made up of n type polycrystalline silicon is formed in a prescribed portion in the drain region 102. Incidentally, in this point, the drain region 102 and the source region 103 which is made up of n type polycrystalline silicon form a heterojunction, and energy barrier exists in the junction interface. In addition, a gate electrode 106 is formed, with a gate insulating film 105 of a deposited layer placed underneath, so that the gate electrode 106 is adjacent to a portion of junction between the drain region 102 and the source region 103 which is made up of n type polycrystalline silicon. The gate electrode 106 is covered by an interlayer dielectric 110. A source electrode 107 is formed in a way that the source electrode 107 is connected with the source region 103 which is made up of n type polycrystalline silicon. A drain electrode 108 is formed in the rear surface of the substrate region 101.

Next, a description will be provided for a method for manufacturing the semiconductor device, as shown in FIG. 23, according to the seventh embodiment of the present invention with reference to drawings.

Figure 24A:
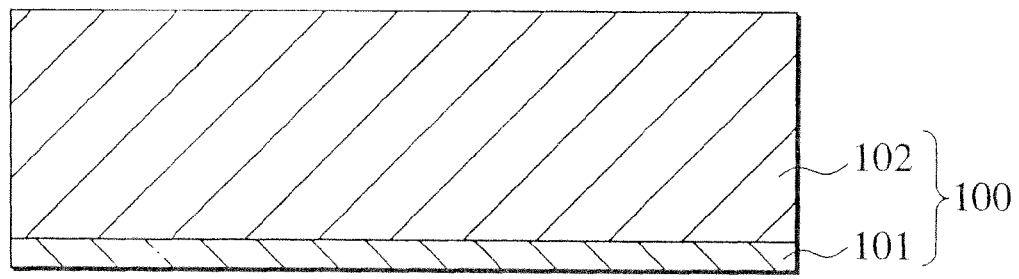
FIGS. 24A, 24B, 24C, 25A, 25B and 25C are sectional views for explanation of a manufacturing method of a semiconductor device of the seventh embodiment according to the present invention.

First, an n type semiconductor body 100 is prepared by forming an n− type drain region 102 on an n+ type silicon carbide substrate 101 as shown in FIG. 24A. Concentration and thickness of the drain region 102 are, for example, $1 \times 10^{16}$ cm$^{-3}$ and 10 µm (micro meter(s)) respectively.

Figure 24B:
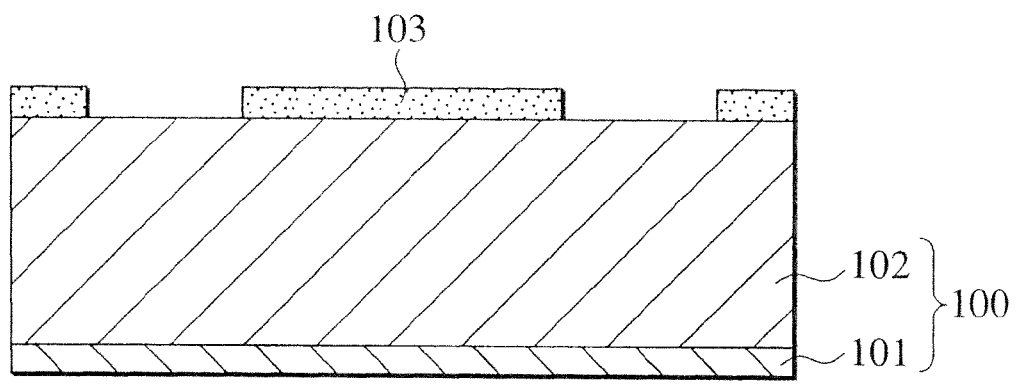

Next, a polycrystalline silicon layer is grown, for example, to a thickness of 5000 Å (angstrom(s)) through a low pressure CVD process, and hereafter the polycrystalline silicon layer is doped with impurities by diffusing phosphorus in a POCl$_3$ atmosphere at 800° C. (Celsius) for 20 minutes. After the doping, the source region 103 as shown in FIG. 24B is formed by etching a prescribed portion of the polycrystalline silicon layer through reactive ion etching processes.

Figure 24C:
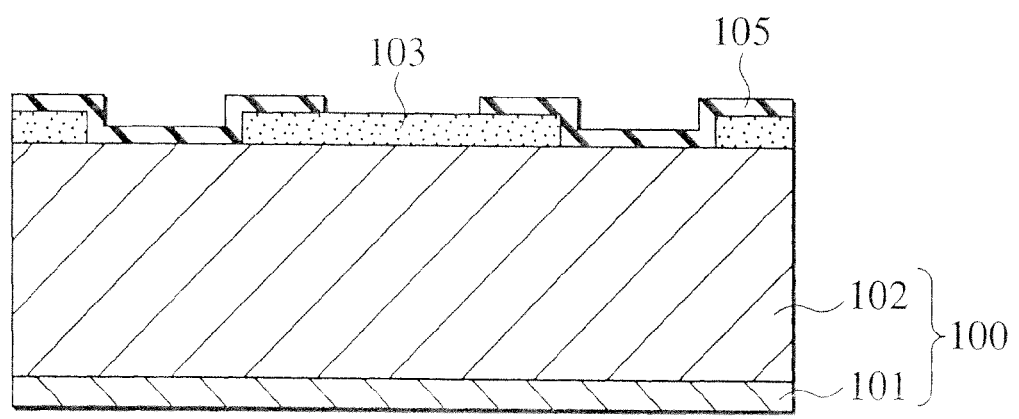

Next, as shown in FIG. 24C, a silicon oxide film is grown to a thickness of 500 Å (angstrom(s)) through atmospheric CVD processes, and hereby a gate insulating film 105 of the grown film is formed.

Figure 25A:
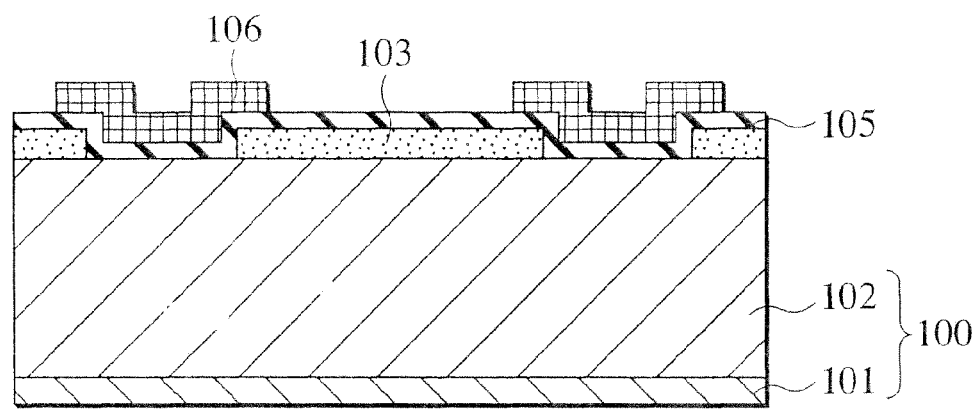

Then, a polycrystalline silicon layer is grown, for example, to a thickness of 3,500 Å (angstrom(s)) through a low pressure CVD process, and hereafter the polycrystalline silicon layer is doped with impurities by diffusing phosphorus in a POCl$_3$ atmosphere at 950° C. (Celsius) for 20 minutes. After the doping, a gate electrode 106 as shown in FIG. 25A is formed by etching a prescribed portion of the polycrystalline silicon layer through reactive ion etching processes.

Figure 25B:
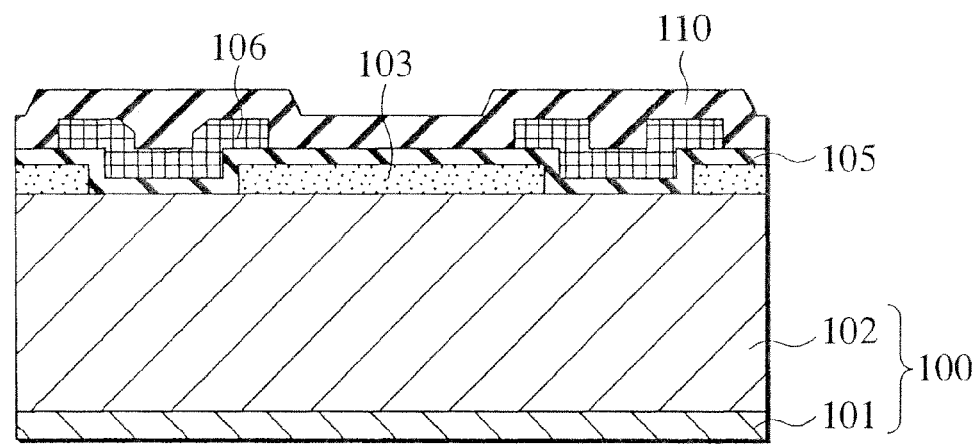

Thence, as shown in FIG. 25B, an interlayer dielectric 110 is formed by growing a silicon oxide film to a thickness of 1.0 µm (micro meter(s)) through a low pressure CVD process.

Figure 25C:
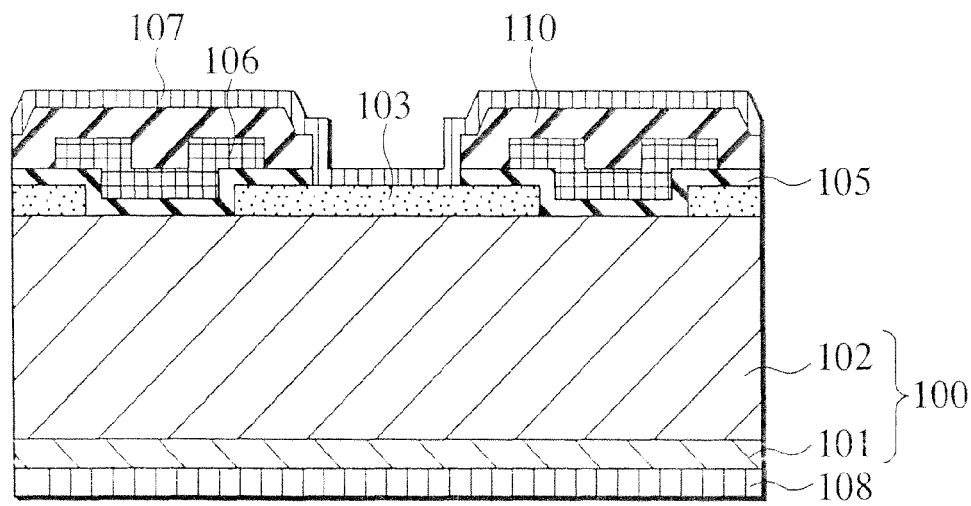

Finally, as shown in FIG. 25C, a drain electrode 108 is formed by growing a titanium nickel film in the rear surface of the n+ type silicon carbide substrate 101 through sputtering processes. Hereafter, a source electrode 107 is formed by making contact holes in prescribed portions of the interlayer dielectric 110 and the gate insulating film 105, and subsequently by growing an aluminum film thereon through sputtering processes. In this way, the semiconductor device, as shown in FIG. 23, according to the seventh embodiment of the present invention is completed.

Figure 26:
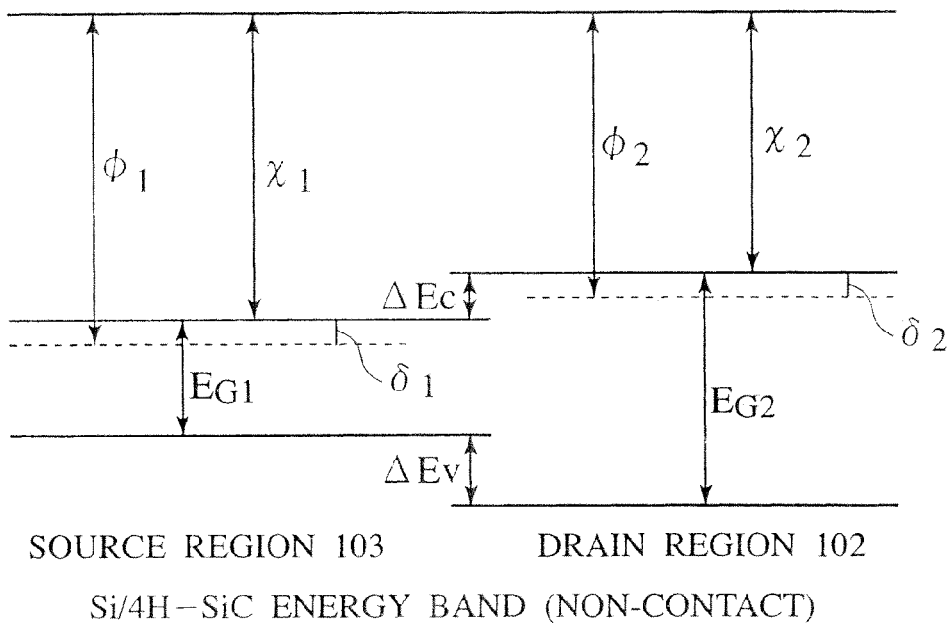
FIG. 26 shows energy band profiles which appears in a state that neither silicon nor silicon carbide is in contact with each other.
Figure 27:
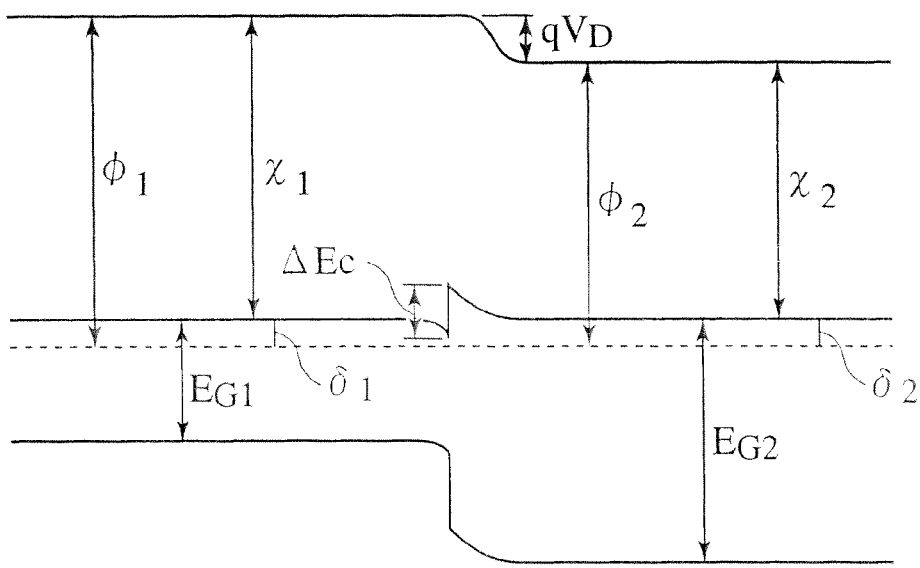
FIG. 27 shows energy band profiles which appear when silicon and silicon carbide are put in contact with each other so that heterojunction is formed of silicon and silicon carbide.
Figure 28:
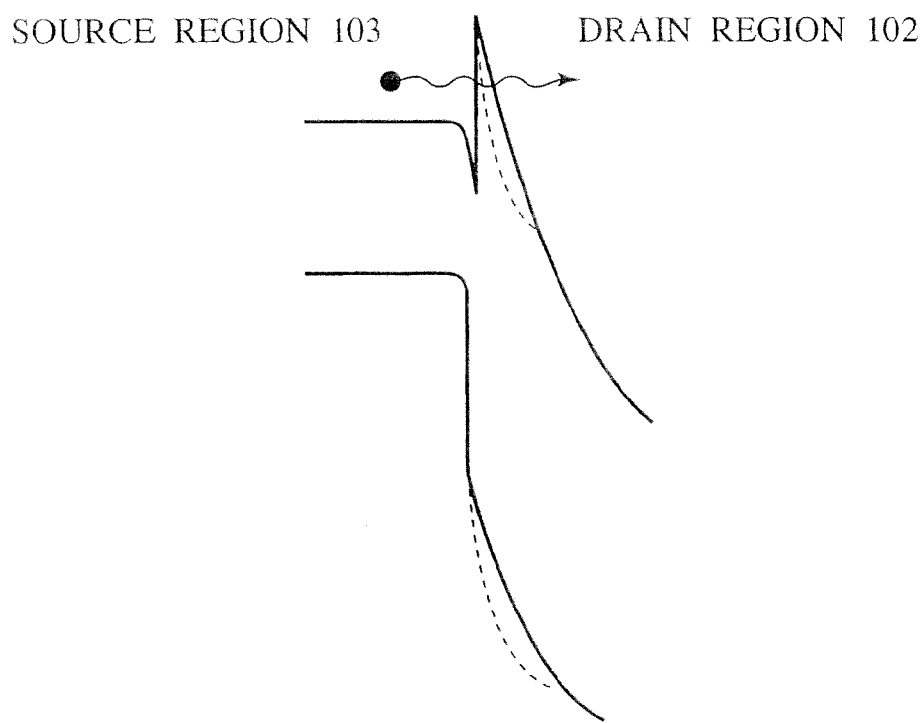
FIG. 28 shows energy band profiles in the junction interface between the drain region 102 and the source region 103.

Next, FIG. 26 to FIG. 28 will provide a detailed description for operations of the semiconductor device thus completed according to the seventh embodiment of the present invention.

FIG. 26 is a diagram to show an energy band profile of the semiconductor. In the figure, the left half of the diagram shows an energy band profile of n type silicon of which the source region 103 is made up, and the right half of the diagram shows an energy band profile of n type silicon carbide (4H-

SiC) of which the drain region 102 is made up. Although polycrystalline silicon is used as a material of which the source region 103 is made up in the seventh embodiment, this figure will describe the energy band profile of the semiconductor citing an energy band profile of silicon. Incidentally, in order to avoid a complicated explanation, this description will take up energy levels accompanying ideal heterojunciton, because interface states do not exist in the heterojunction interface.

FIG. 26 shows the energy band profile which appears while the n type silicon and the n type silicon carbide are not in contact with each other. In FIG. 26, with regard to silicon, electron affinity is denominated by $\chi 1$; work function (energy difference between vacuum level and Fermi level) by $\phi 1$; Fermi energy (energy difference between conduction band and Fermi level) by $\delta 1$; and bandgap by $E_{G1}$. Similarly, with regard to silicon carbide, electron affinity is denominated by $\chi 2$; work function by $\phi 2$; Fermi energy by $\delta 2$; and bandgap by $E_{G2}$.

When the silicon and the silicon carbide are brought into contact with each other and heterojunction is formed between the silicon and the silicon carbide, an energy band profile appears as shown in FIG. 27. An energy barrier $\Delta EC$ exists in an junction interface between silicon and silicon carbide due to the difference in electron affinity $\chi$ between silicon and silicon carbide. This is expressed with $$\Delta EC = \chi 1 - \chi 2$$

In the semiconductor device according to the seventh embodiment of the present invention, if the drain electrode 108 is applied with positive voltage Vd while the gate electrode 106 is grounded, an energy band profile in the heterojunction interface between the drain region 102 and the source region 103 which is made up of n type polycrystalline silicon is indicated roughly with solid lines in FIG. 28. A depletion layer expands on the side of the drain region 102 in response to the drain voltage Vd. On the other hand, electrons on the side of the source region 103 which is made up of n type polycrystalline silicon can not clear the energy barrier $\Delta EC$, and the electrons accumulate in the heterojunction interface between the drain region 102 and the source region 103 which is made up of n type polycrystalline silicon. Accordingly, no element current virtually flows. An electric line of force, which corresponds to the depletion layer that expands across the drain region 102, ends in the layer in which the electrons accumulate. As a result, electric field does not virtually extend towards the source region 103 which is made up of n type polycrystalline silicon. Consequently, even if the drain electrode 108 is applied with high voltage, the source region 103 which is made up of n type polycrystalline silicon does not break down before the other regions break down, and accordingly the cutoff state is maintained. In other words, the semiconductor device according to the seventh embodiment of the present invention has high drain voltage withstanding.

Next, if the gate electrode 106 is applied with positive voltage, electric field acts on the heterojunction interface between the drain region 102 and the source region 103 which is made up of n type polycrystalline silicon. This makes the energy barrier $\Delta EC$ in the heterojunction interface thinner as indicated with broken lines in FIG. 28. When this energy barrier $\Delta EC$ become sufficiently as thin as 100 Å (angstrom(s)), electrons pass through the energy barrier $\Delta EC$ as tunnel phenomenon. As a result, the tunnel phenomenon occurs and current starts flowing, even if the drain voltage Vd is lower than a prescribed voltage Vb.

Furthermore, if the gate electrode 106 is grounded and the application of the positive voltage is terminated, this makes the energy barrier $\Delta EC$ become as thick as it was before. Consequently, element current stops flowing.

The semiconductor device according to the seventh embodiment of the present invention performs switching operations as described above.

In addition, the semiconductor according to the seventh embodiment does not have a channel region which MOSFETs have, and this enables on state resistance to be lowered. In other words, low on state resistance can be realized.

As described above, the semiconductor device according to this embodiment comprises: the first conductivity type widegap semiconductor body which is formed of the widegap semiconductor that is formed by growing the drain region 102 on the substrate region 101; the source region 103 which forms heterojunciton with the widegap semiconductor body, and which is formed of a semiconductor material whose bandgap is different from that of the widegap semiconductor; the gate electrode 106 which is arranged with the gate insulating film 105 placed underneath in the portion of heterojunction between the widegap semiconductor body and the source region 103; the source electrode 107 which is formed in a way that the source electrode 107 is in contact with the hetero-semiconductor region; and the drain electrode 108 which is formed in a way that the drain electrode 108 is in contact with the widegap semiconductor body 3. In addition, the semiconductor according to this embodiment is configured in a way that the gate insulating film 105 is made up of the grown film.

If the gate electrode 106 is applied with positive voltage and the energy barrier $\Delta EC$ in the heterojunction is made thinner, carriers can pass through the thinner barrier (tunnel phenomenon). In other words, main current which flows in this semiconductor device can be managed if the thickness of the energy barrier $\Delta EC$ is controlled by the electric field from the gate electrode 106 while the drain electrode 108 is applied with positive voltage.

For the above described reason, the semiconductor device according to the present invention does have a channel region which MOSFETs have, and this enables on state resistance to be lowered. In addition, since the grown film is used for the gate insulating film 105, the thickness of the gate insulating film 105 is virtually even. Accordingly, both the drain region 102 which forms heterojunction and the source region 103 which is made up of n type polycrystalline silicon can be applied evenly with electric field by the gate electrode 106. As a result, the energy barrier $\Delta EC$ of the heterojunciton between the drain region 102 and the source region 103 which is made up of n type polycrystalline silicon can be made thinner effectively. In other words, main current which flows in the semiconductor device can be increased, and on state resistance can be further reduced.

In addition, the method for manufacturing the semiconductor device according to this embodiment comprises: a step for selectively forming the source region 103 which forms heterojunction with the widegap semiconductor body, which is made up of a semiconductor material whose bandgap is different from that of the widegap semiconductor, on the first conductivity type widegap semiconductor body which is made of the widegap semiconductor; a step for forming the gate insulating film 105 which is made of a grown film on the widegap semiconductor body and the source region 103; a step for forming the gate electrode 106 on the gate insulating film 105; a step for forming the source electrode 107 in a way that the source electrode 107 is in contact with the source region 103; and a step for forming the drain electrode 108 in a way that the drain electrode 108 is in contact with the widegap semiconductor body. This constitution enables the semiconductor device according to this embodiment to be realized with ease.

Furthermore, since silicon carbide whose dielectric breakdown field is high is used for the widegap semiconductor, a higher voltage semiconductor device can be realized.

Figure 29:
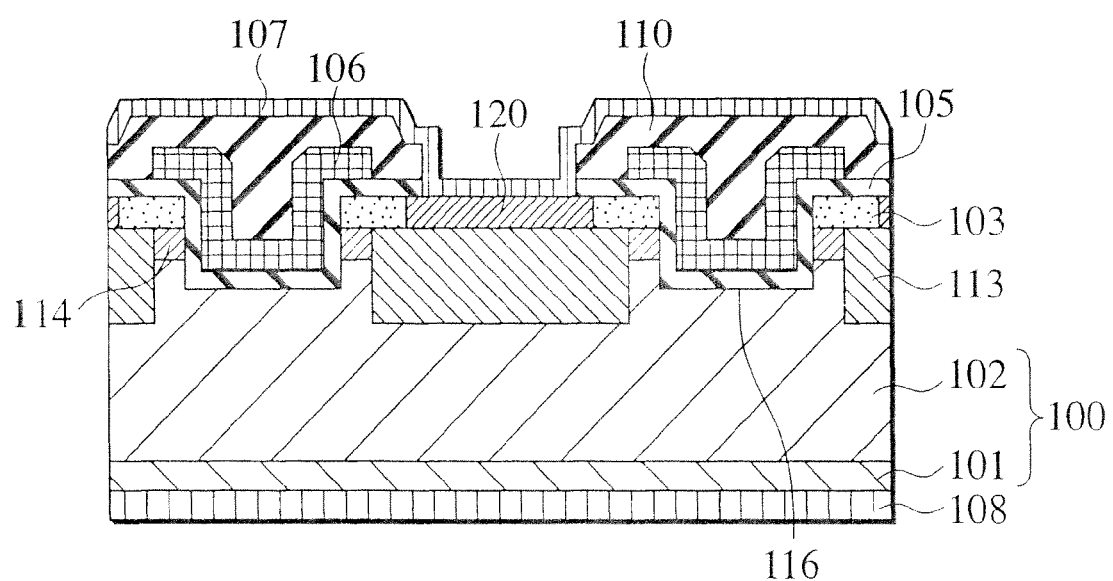
FIG. 29 is a sectional view of a semiconductor device of the eighth embodiment according to the present invention.

Additionally, polycrystalline silicon is used for a semiconductor material whose bandgap is different from that of a widegap semiconductor, processing such as etching and control of conductivity becomes easier. Incidentally, the same effect can be brought about when polycrystalline silicon and amorphous silicon are used instead of monocrystalline silicon Eighth Embodiment FIG. 29 shows a semiconductor device according to an eighth embodiment of the present invention. The figure is a cross sectional view of two cells as structural units which are arranged in series. A drain region 102 is laid up on a substrate region 101 to be the drain region. In other words, a first conductivity type semiconductor body 100 is formed of the substrate region 101 and the drain region 102. A field relaxation region 113 and a conduction region 114 whose concentration of impurities is higher than that of the drain region 102 are formed in a prescribed portion on the drain region 102. In addition, a source region 103 which is made up of n type polycrystalline silicon is formed in a prescribed portion on the drain region 102. It should be noted that, in this point, the drain region 102 and the source region 103 which is made up of n type polycrystalline silicon form heterojunction, and that an energy barrier ΔEC exists in the junction interface. In an outer periphery of the source region 103 which is made up of n type polycrystalline silicon, a trench 116 is formed in a way that the trench 116 penetrates through the source region 103 which is made up of n type polycrystalline silicon in the depth direction and reaches the drain region 102. Inside the trench 116 in the portion of the heterojunction between the drain region 102 and the source region 103 which is made up of n type polycrystalline silicon, a gate electrode 106 is formed with a gate insulating film 105 placed underneath. The gate insulating film 105 is made up of a silicon oxide film (TEOS film: tetraethylorthosilicate film; tetraethoxysilane film) which is grown by chemical vapor deposition with TEOS used for a material gas. The gate electrode 106 is covered by an interlayer dielectric 110. A source contact region 120 which is made up of high concentration of n+ type polycrystalline silicon is formed in a prescribed portion of the source region 103 which is made up of n type polycrystalline silicon. In other words, in the source region 103, a region whose concentration of impurities is different from that of the source region 103 is formed. A source electrode 107 is formed in a way that the source electrode 107 is connected with the source contact region 120 which is made up of n+ type polycrystalline silicon. A drain electrode 108 is formed in the rear surface of the substrate region 101.

Next, a description will be provided for a method for manufacturing the semiconductor device as shown in FIG. 29 according to the eight embodiment of the present invention, with reference to FIG. 30 to FIG. 32B.

Figure 30A:
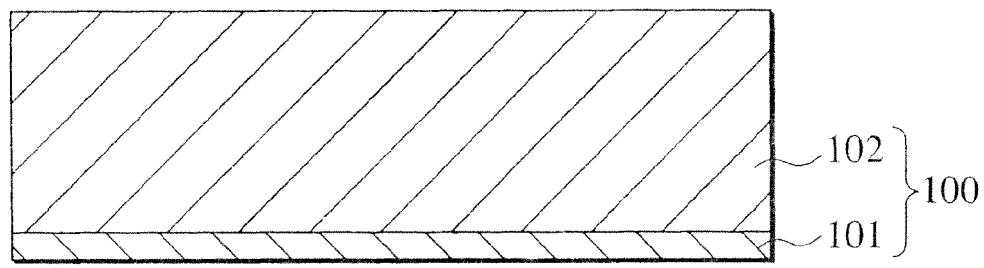
FIGS. 30A, 30B, 30C, 31A, 31B, 31C, 32A, and 32B are sectional views for explanation of a manufacturing method of a semiconductor device of the eighth embodiment according to the present invention.
Figure 30B:
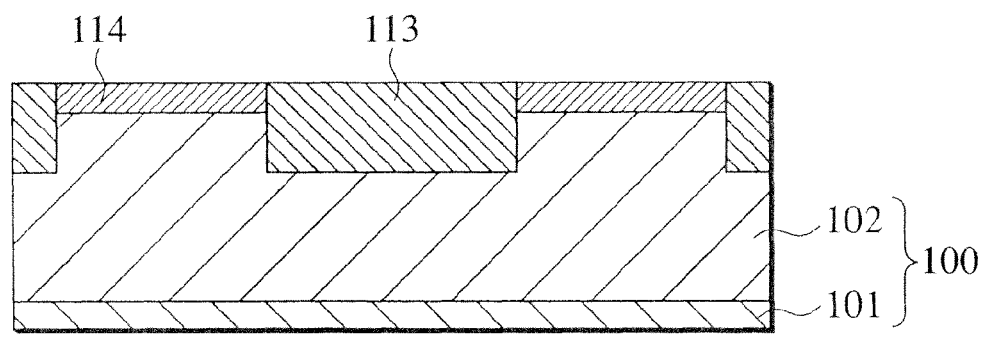

First, an n type semiconductor body 100 is prepared by forming an n− type drain region 102 on an n+ type silicon carbide substrate 101 as shown in FIG. 30A. Concentration and thickness of the drain region 102 are, for example, $1 \times 10^{16}$ cm$^{-3}$ and 10 μm (micro meter(s)) respectively. Next, by masking with an oxide film, aluminum (for forming a field relaxation region 113) is ion-implanted into a prescribed portion of the drain region 102, and hereafter the oxide film mask is removed with buffered hydrofluoric acid solutions (BHF solutions). In addition, similarly by masking with an oxide film, nitrogen (for forming a conduction region 114) is ion-implanted into a prescribed portion of the drain region 102, and hereafter the oxide film mask is removed with buffered hydrofluoric acid solutions (BHF solutions). After removing the oxide film mask, a thermal process is performed in an argon atmosphere at 1,600° C. (Celsius) for 30 minutes, and hereby the implanted aluminum and nitrogen are activated. By this, the field relaxation region 113 and the conduction region 114 are formed as shown in FIG. 30B. In this point, conditions for ion-implanting aluminum and nitrogen are as follows. With regard to the aluminum, acceleration energy is 20~360 KeV, and a total dose is $2.5 \times 10^{14}$ cm$^{-2}$. Regarding the nitrogen, acceleration energy is 30 KeV, and a dose is $6.0 \times 10^{12}$ cm$^{-2}$. Implantation temperature for each of the two is 800° C.

Figure 30C:
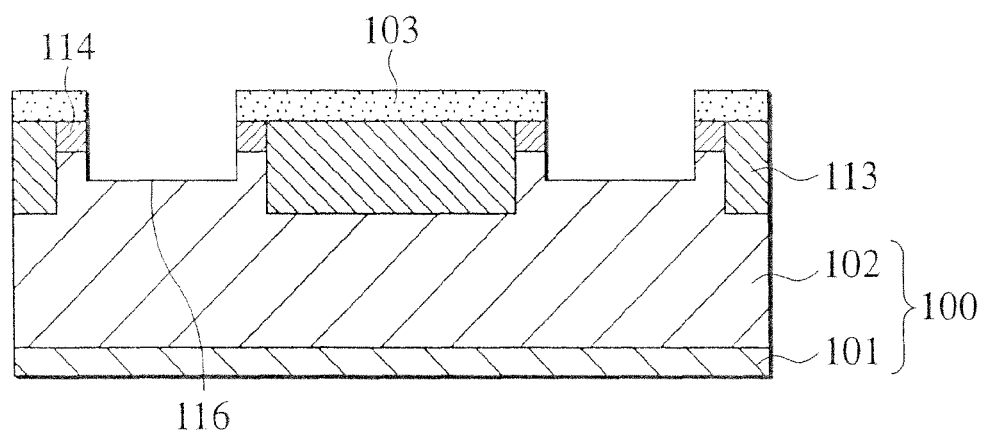

Next, a polycrystalline silicon layer is grown, for example, to a thickness of 5,000 Å (angstrom(s)) through a low pressure CVD process. Hereafter, the polycrystalline silicon layer is doped with impurities by diffusing phosphorus in a POCl$_3$ atmosphere at 800° C. (Celsius) for 20 minutes. After the doping, the source region 103 and a trench 116 as shown in FIG. 30C are formed by etching a prescribed portion of the polycrystalline silicon layer and the drain region 102 through reactive ion etching processes.

Figure 31A:
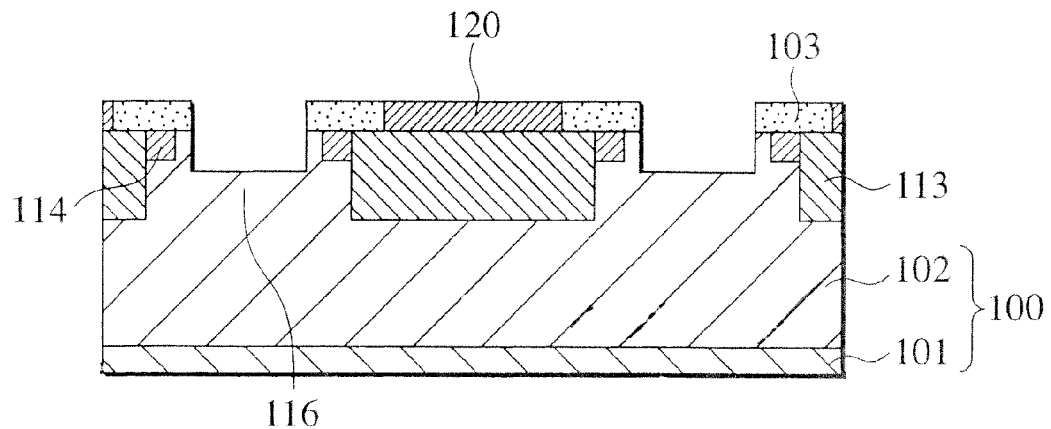
Figure 31B:
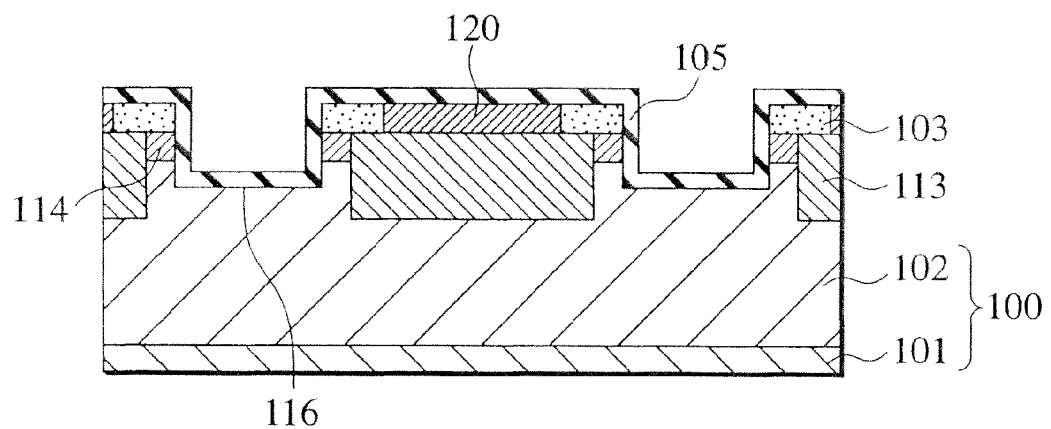

Then, by masking with an oxide film, arsenic is ion-implanted into a prescribed portion of the source region 103, and hereafter the oxide film mask is removed with buffered hydrofluoric acid solutions (BHF solutions). After removing the oxide film mask, a thermal process is performed in an argon atmosphere at 100° C. (Celsius) for 5 minutes, and the implanted arsenic is activated. By this, n+ type source contact region 120 as shown in FIG. 31A is formed. In this point, conditions for ion-implanting nitrogen are as follows. Acceleration energy is 30 KeV, and a dose is $5.0 \times 10^{14}$ cm$^{-2}$, for example. Implantation temperature is room temperature.

The gate insulating film 105 which is made up of a TEOS film is formed by growing a silicon oxide film to a thickness of 500 Å (angstrom(s)) through remote plasma CVD processes with TEOS used for a material gas.

Figure 31C:
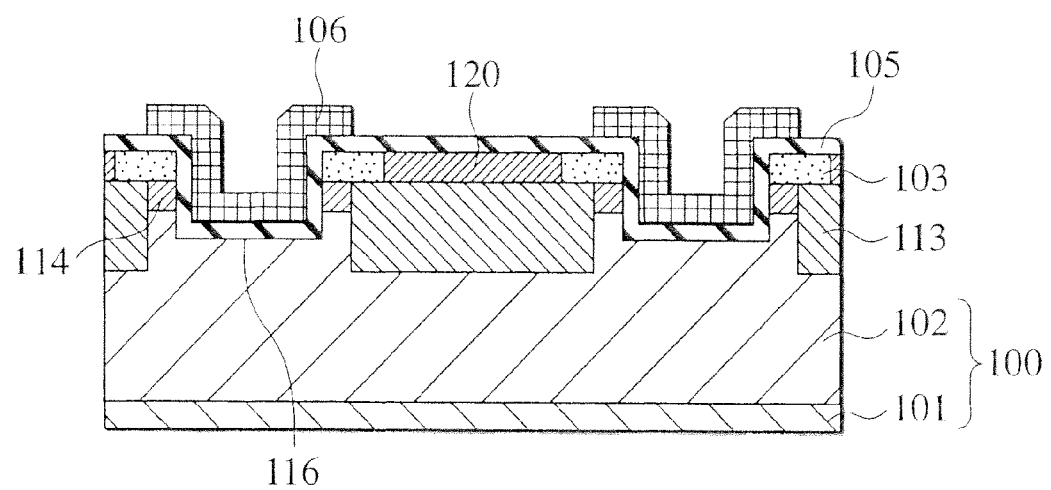

Next, a polycrystalline silicon layer is grown, for example, to a thickness of 3,500 Å (angstrom(s)) through a low pressure CVD process. Hereafter, the polycrystalline silicon layer is doped with impurities by diffusing phosphorus in a POCl$_3$ atmosphere at 950° C. (Celsius) for 20 minutes. After the doping, the gate electrode 106 as shown in FIG. 31C is formed by etching the polycrystalline silicon layer through reactive ion etching processes.

Figure 32A:
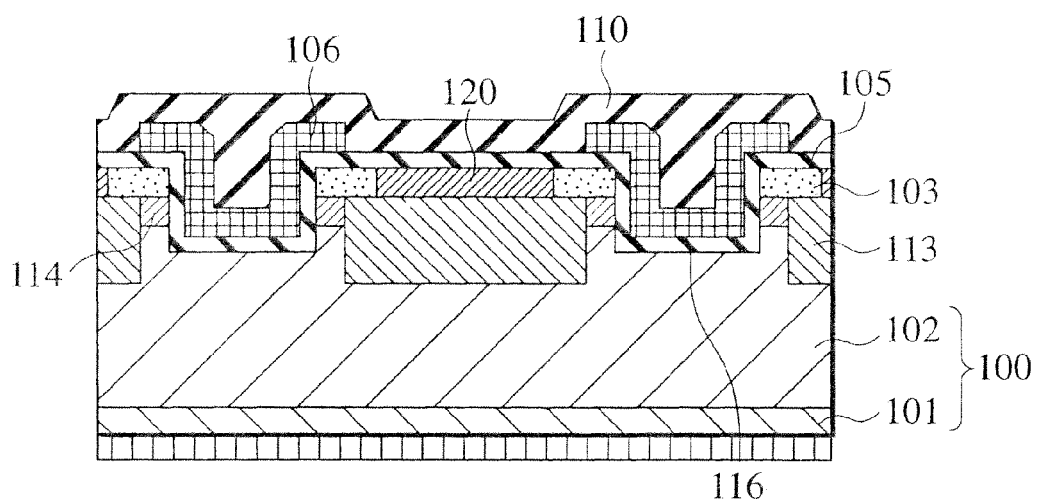
Figure 32B:
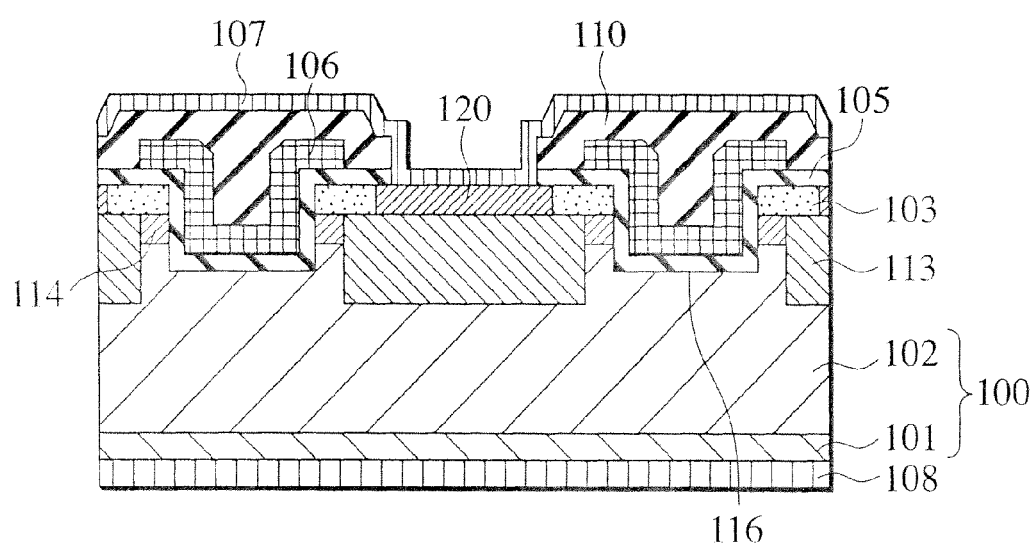

Thence, an interlayer dielectric 110 is formed by growing a silicon oxide film to a thickness of 1.0 μm (micro meter(s)) through a low pressure CVD process as shown in FIG. 32A. Finally, as shown in FIG. 32B, a drain electrode 108 is formed by growing a titanium/nickel film in the rear surface of the n+ type silicon carbide substrate 101 through sputtering processes. Hereafter, a source electrode 107 is formed by making contact holes in prescribed portions of the interlayer dielectric 110 and the gate insulating film 105, and subsequently by growing an aluminum film thereon through sputtering processes. In this way, the semiconductor device, as shown in FIG. 29, according to the eighth embodiment of the present invention is completed. The semiconductor device thus completed according to the eighth embodiment of the present invention comprises: the first conductivity type widegap semiconductor body which is formed of the widegap semiconductor that is formed by growing the drain region 102 on the substrate region 101; the source region 103 which forms heterojunciton with the widegap semiconductor body, and which is formed of a semiconductor material whose bandgap is different from that of the widegap semiconductor; the trench 116 which is formed in an outer periphery of the source region 103 in a way that the trench 116 penetrates through the source region 103 in the depth direction and reaches the widegap semiconductor body; the gate electrode 106 which is arranged with the gate insulating film 105 placed underneath inside the trench 116 in the portion of the heterojunction between the widegap semiconductor body and the source region 103; the source electrode 107 which is formed in a way that the source electrode 107 is in contact with the source region 103; and the drain electrode 108 which is formed in a way that the drain electrode 108 is in contact with the widegap semiconductor body. In addition, the semiconductor according to this embodiment is configured in a way that the gate insulating film 105 is made up of the grown film.

The semiconductor device according to this embodiment includes the trench gate structure in addition to the effects brought about by the seventh embodiment. For this reason, the semiconductor enables elements to be micronized, and also enables the on state resistance to be reduced. In addition, the gate insulating film 105 is formed in a way that the gate insulating film 105 is orthogonal to the heterojunciton interface between the drain region 102 and the source region 103 which is made up of n type polycrystalline silicon. This makes it possible to shorten the length of the electric line of force from the gate electrode 106 to the heterojunction interface between the drain region 102 and the source region 103 which is made up of n type polycrystalline silicon. For this reason, it is made possible to improve capability of controlling the thickness of the energy barrier ΔEC by the electric field from the gate electrode 106. In other words, application of lower gate voltage can make thinner the energy barrier ΔEC of the heterojunction between the drain region 102 and the source region 103 which is made up of n type polycrystalline silicon. Accordingly, main current can be controlled by the gate voltage with ease.

In addition, the field relaxation region 113 which is a second conductivity type widegap semiconductor region is formed, in a prescribed portion of the drain region 102 which is a part of the first conductivity type widegap semiconductor body, in a way that the field relaxation region 113 is connected with the source region 103. For this reason, while the gate electrode 106 and the source electrode 107 are grounded and the drain electrode 108 is applied with high voltage, electric field generated in the portion of the heterojunction between the drain region 102 and the source region 103 which is made up of n type polycrystalline silicon is relaxed by a depletion layer which extends from the PN junction interface between the drain region 102 and the field relaxation region 113. Accordingly, cutoff capability of elements is improved.

Furthermore, the conduction region 114 which is a first conductivity type widegap semiconductor region whose concentration of impurities is higher than that of the drain region 102 is formed, in a way that the conduction region 114 is connected (in contact) with the source region 103, in a prescribed portion of the drain region 102 which is a part of the widegap semiconductor body that is opposite to the gate electrode 106 with the gate insulating film 105 of a silicon oxide film (TEOS film) placed in-between. This makes smaller an expansion of the depletion layer, which is formed by diffusion potential between the source region 103 which is made up of n type polycrystalline silicon and the conduction field 114 whose concentration of impurities is higher than that of the drain region 102, to the conduction region 114 whose concentration of impurities is higher than that of the drain region 102. This causes the energy barrier ΔEC to be thinner. Consequently, application of lower gate voltage can make thinner the energy barrier ΔEC of the heterojunction, and main current can be controlled by the gate voltage more easily.

Moreover, a prescribed portion of the source region 103 which is made up of n type polycrystalline silicon includes a portion whose concentration of impurities is different. This brings an advantage that a portion whose concentration of impurities is different from that of the source region 103 can be created optionally in the source region 103, and enables the range of application of elements to be wider. In addition, according to this embodiment, the source contact region 120 which is made up of high concentration of n+ type polycrystalline silicon is formed in a prescribed portion of the source region 103. This enables the contact resistance of the source electrode 107 to be reduced, and accordingly enables the on state resistance to be reduced further.

Additionally, the silicon oxide film which is grown by chemical vapor deposition processes with TEOS used for a material gas is employed for the gate insulating film 105. This makes less defects cause in the gate insulating film 105 while growing the gate insulating film 105. Accordingly, reliability of the gate insulating film 105 is improved.

A method for manufacturing the semiconductor device according to this embodiment comprises: a step for forming the source region 103 which forms heterojunction with the widegap semiconductor body, which is made up of a semiconductor material whose bandgap is different from that of the widegap semiconductor, on the first conductivity type widegap semiconductor body which is made of the widegap semiconductor; a step for forming the trench 116 which penetrates through the source region 103 in the depth direction and reaches the widegap semiconductor body; a step for forming the gate insulating film 105 of the grown film at least inside the trench 116; a step for forming the gate electrode 106 at least on the gate insulating film 105 inside the trench 116; a step for forming the source electrode 107 in a way that the source electrode 107 is in contact with the source region 103; and a step for forming the drain electrode 108 in a way that the drain electrode 108 is in contact with the widegap semiconductor body.

This constitution enables the semiconductor device according to this embodiment to be realized with ease.

In addition, the field relaxation region 113 which is a second conductivity type widegap semiconductor region is formed in a part of the widegap semiconductor body. Hereafter, the source region 103 is formed in a way that the source region 103 is in contact with the field relaxation region 113. The formation of the field relaxation region 113 relaxes the electric field generated in the portion of the heterojunciton between the drain region 102 and the source region 103 which is made up of n type polycrystalline silicon by the depletion layer which expands from the PN junction interface between the drain region 102 and the field relaxation region 113 while the gate electrode 106 and the source electrode 107 are grounded and the drain electrode 108 is applied with high voltage. Accordingly, cutoff capability of elements is improved.

Additionally, the conduction region 114 which is a first conductivity type widegap semiconductor region whose concentration of impurities is higher than that of the widegap semiconductor body is formed in a part of the widegap semiconductor body. Hereafter, the source region 103 is formed in a way that the source region 103 is in contact with the conduction region 114. The formation of the conduction region 114 makes smaller an expansion of the depletion layer, which is formed by diffusion potential between the source region 103 which is made up of n type polycrystalline silicon and the conduction field 114 whose concentration of impurities is higher than that of the drain region 102, to the conduction region 114 whose concentration of impurities is higher than that of the drain region 102. This causes the energy barrier ΔEC to be thinner. Consequently, application of lower gate voltage can make thinner the energy barrier ΔEC of the heterojunction, and main current can be controlled by the gate voltage more easily.

Moreover, after forming the source region 103, a portion whose concentration of impurities is different from that of the source region 103 is formed in the source region 103. Hereafter, the above described gate insulating film is formed. This brings an advantage that a portion whose concentration of impurities is different from that of the source region 103 can be created optionally in the source region 103, and enables the range of application of elements to be wider. In addition, according to this embodiment, the source contact region 120 which is made up of high concentration of n+ type polycrystalline silicon is formed in a prescribed portion of the source region 103. This enables the contact resistance of the source electrode 107 to be reduced, and accordingly enables the on state resistance to be reduced further.

It should be noted that, although the aforementioned embodiment has been described with the first conductivity type region assigned as the n type region and with the second conductivity type region assigned as the p type region, the reverse assignment can be allowed. In other words, even if a first conductivity type region is assigned as the p type region and a second conductivity type is assigned as the n type region, the same effects can be obtained. In addition, one of the n type region and the p type region can be used for portions, e.g. a source region 103, which claims for the present invention do not assign with either of the conductivity types.

Moreover, although the widegap semiconductors have been described citing a case that silicon is a semiconductor material to be used for the widegap semiconductors whose bandgap is different from those of a silicon carbide semiconductor and a wide bandgap semiconductor, a material for any of the widegap semiconductors is not limited to the above described semiconductor materials. As a matter of course, diamond, gallium nitride and zinc oxide and the like can be used as a material for the widegap semiconductors. Germanium and gallium arsenide and the like can be used as a semiconductor material whose bandgap is different from those of the widegap semiconductors.

Ninth Embodiment

Next, a description will be provided for ninth and tenth embodiments. For example, in a case that a field effect transistor is manufactured, damages are caused on a silicon carbide epitaxial layer of each of a hetero-semiconductor and a semiconductor body by a dry etching process for forming a trench structure. If damages are caused on those, this causes a problem of deteriorating properties of the transistor since this heterojunction interface corresponds to a channel region which MOSFETs and the like have. By contrast, in a case that a wet etching process is employed instead of the dry etching process, this brings an advantage that damage which would be caused by an ion etching process is not caused. However, stability of the etching process is restrained, and the yields are also restrained. In addition, in a case that the wet etching process is employed, the wet etching process causes a problem of hindering a trench from being easily formed in a silicon carbide epitaxial layer, since silicon carbide is chemically extremely stable element.

A description will be provided for a semiconductor device and a method for manufacturing the semiconductor device according to these embodiments. The semiconductor device is a semiconductor device with low on state resistance whose hetero-semiconductor and semiconductor body are not damaged by the ion etching process. These embodiments can provide the method, for manufacturing the semiconductor device, which does not cause damages on either a hetero-semiconductor or a semiconductor body by the ion etching process, which manufactures a field effect transistor with low on state resistance.

Figure 33:
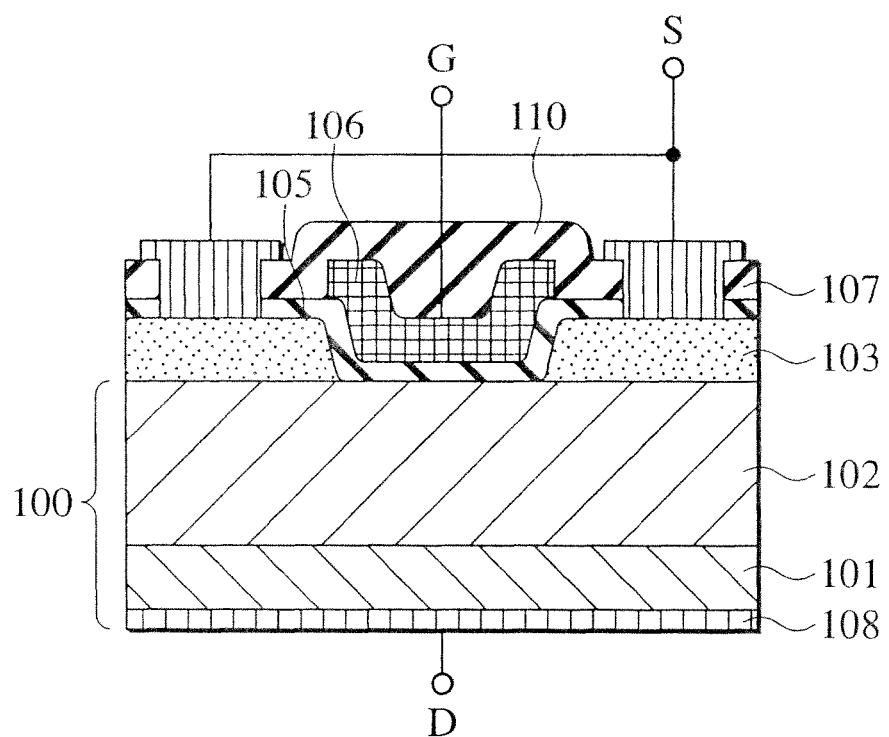
FIG. 33 is a sectional view of a semiconductor device of the ninth embodiment according to the present invention.

FIG. 33 shows a cross sectional view of the field effect transistor which is manufactured by the method according to the ninth embodiment of the present invention.

The field effect transistor shown in FIG. 33 comprises: a semiconductor body 100 which is formed of a substrate region 101 and a drain region 102; a source region 103 which forms heterojunciton with the drain region 102, and which is made up of a hetero-semiconductor material whose bandgap is different from that of the semiconductor body 100; a gate electrode 106 which is arranged with a gate insulating film 105 placed underneath in a way that the gate electrode 106 is adjacent to a portion of the junction between the drain region 102 and the source region 103; a source electrode 107 which is in contact with the source region 103; and a drain electrode 108 which is in contact with the substrate region 101 in the semiconductor body 100. The gate electrode 106, the source electrode 107 and the drain electrode 108 are connected with a gate terminal, a source terminal and a drain terminal respectively.

When the above described field effect transistor is manufactured, a layer of the aforementioned hetero-semiconductor material is formed on the drain region 102 of the semiconductor body 100. Then, only specified portions in the layer of the hetero-semiconductor material are oxidized in a selective manner, and hereafter the oxide films which are formed by the oxidation process is removed. Thence, the gate insulating film 105 and gate electrode 106 are formed on the portions where the oxide films are removed.

Figure 34A:
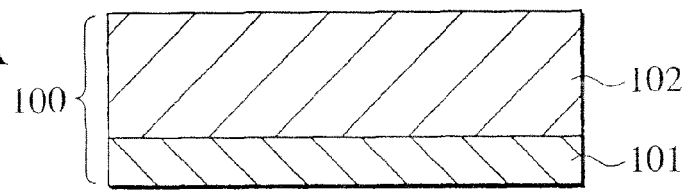
FIGS. 34A, 34B, 34C, 34D, 34E, 35A, 35B, 35C, and 35D are sectional views for explanation of a manufacturing method of a semiconductor device of the ninth embodiment according to the present invention.

Next, a description will be provided for steps to be taken in the manufacturing of the field effect transistor shown in FIG. 33 with reference to drawings. First, as shown in FIG. 34A, a silicon carbide body 100 is formed by growing a low concentration n type drain region 102 on a high concentration n type substrate region 101. In other words, a semiconductor body of silicon carbide (semiconductor body 100) is formed. Incidentally, concentration of impurities and thickness of the drain region 102 are, for example, $1 \times 10^{16}$ cm$^{-3}$ and 10 μm (micro meter(s)) respectively.

Figure 34B:
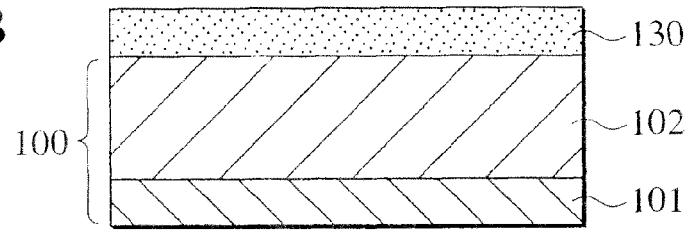

Next, shown in FIG. 34B, a layer of polycrystalline silicon 130 which is a hetero-semiconductor material is grown on the drain region 102 through a low pressure CVD process or the like. In this point, thickness of the polycrystalline silicon 130 is, for example, 500 nm. Instead of this, the polycrystalline silicon 130 may be polycrystalline silicon which is recrystallized by a laser anneal process or the like after being grown by an electron beam evaporation process, a sputtering process or the like. A monocrystalline silicon with preferable crystalline properties which is grown heteroepitaxially by a molecular beam epitaxial process may be used instead of the polycrystalline silicon 130.

Figure 34C:
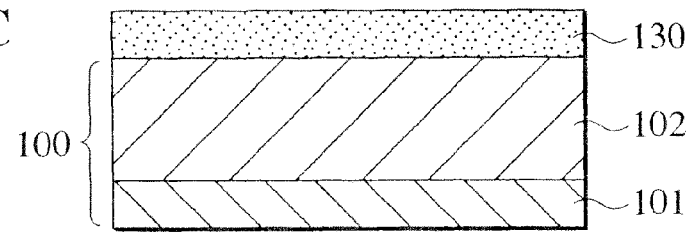

Then, as shown in FIG. 34C, the polycrystalline silicon 130 is doped with phosphorus through a solid phase diffusion process with POCl$_3$. Conditions for the diffusion are, for example, at a temperature of 800° C. (Celsius) and for 20 minutes. Although the conductivity type of the polycrystalline silicon 130 has been described as n type, the type may be p type which is obtained by a solid phase diffusion process with boron. In addition, a combination of an ion implantation process with a thermal process for activation after the ion implantation process may be used for the doping.

Figure 34D:
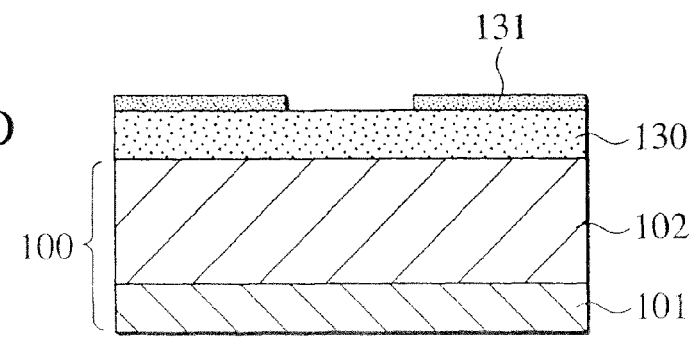

Thence, as shown in FIG. 34D, a silicon nitride film 131 to be an antioxidant film is grown on the surface of the layer of the polycrystalline silicon 130 which is a hetero-semiconductor material through a low pressure CVD process or the like. In this point, the thickness of the silicon nitride film 131 is, for example, 100 nm. Incidentally, although the antioxidant film has been described as the silicon nitride film 131, whatever material may be used if the material has a property of barrier inhibiting oxidation and if a film made up of the material can be removed easily. Hereafter, lithographic and etching processes transfer patterns onto the silicon nitride film 131 which is an antioxidant film. This causes the surface of the layer of the polycrystalline silicon 130, which is the hetero-semiconductor material, to be partially covered by the antioxidant film.

Figure 34E:
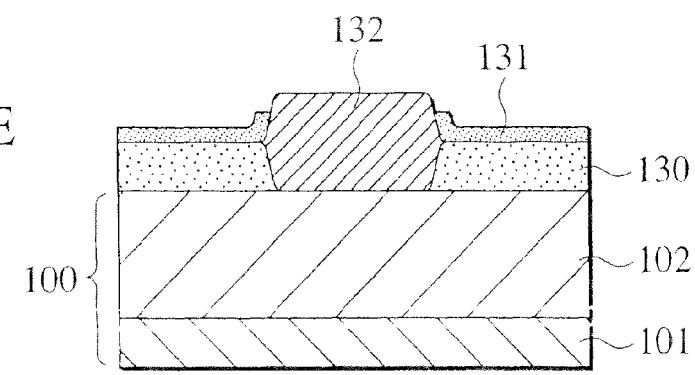

Next, as shown in FIG. 34E, an oxidation film 132 is formed by thermally oxidizing the layer of the polycrystalline silicon 130 which is the hetero-semiconductor material that is not covered by the silicon nitride film 131 which is an antioxidant film. This thermal oxidation process is performed, for example, at a temperature of 1,000° C. (Celsius), in a mixed combustion atmosphere of $H_2O$ and $O_2$, and with a mixing ratio of $H_2O$ to $O_2$ standing at 3:7. In this point, although the thermal oxidation process has been described citing an example of what is called a wet oxidation process, a dry thermal oxidation process, a pyrogenic oxidation process, a stream oxidation process and the like may be used instead.

Figure 35A:
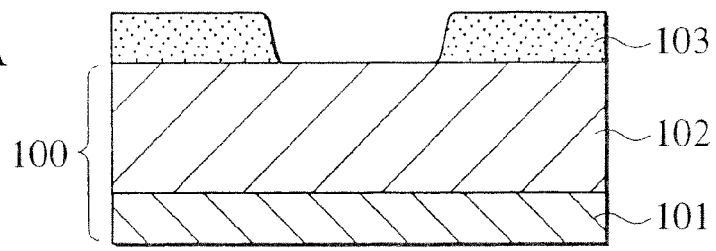

Then, as shown in FIG. 35A, after the silicon nitride film 131 which is an antioxidant film is removed, for example, with phosphoric acid solutions, the oxidation film 132 which is formed, for example, of mixed solutions of ammonium fluoride and hydrofluoric acid is removed. In this way, the source region 103 is formed.

Figure 35B:
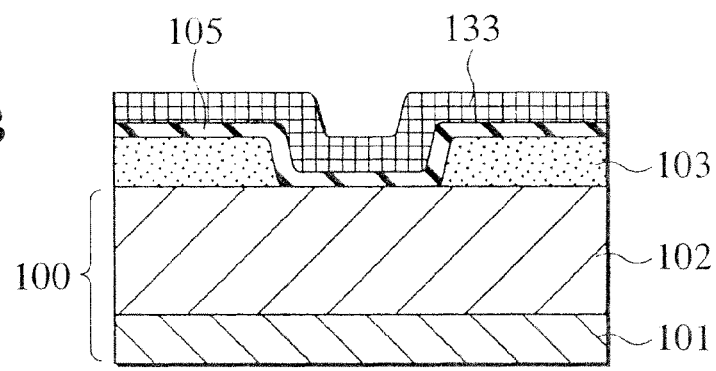

Next, as shown in FIG. 35B, a silicon oxide film is grown as the gate insulating film 105 by a plasma CVD process or the like, and hereafter a polycrystalline silicon layer 133 to be the gate electrode 106 is grown through a low pressure CVD process or the like. Subsequently, the polycrystalline silicon layer 133 to be the gate electrode 106 is doped with phosphorus through a solid phase diffusion process with $POCl_3$ Conditions for the diffusion are, for example, at a temperature of 950° C. (Celsius) and for 20 minutes. Although the doping has been described citing an example of the solid phase diffusion process, a combination of an ion implantation process with a thermal process for activation after the ion implantation process may be used for the doping.

Figure 35C:
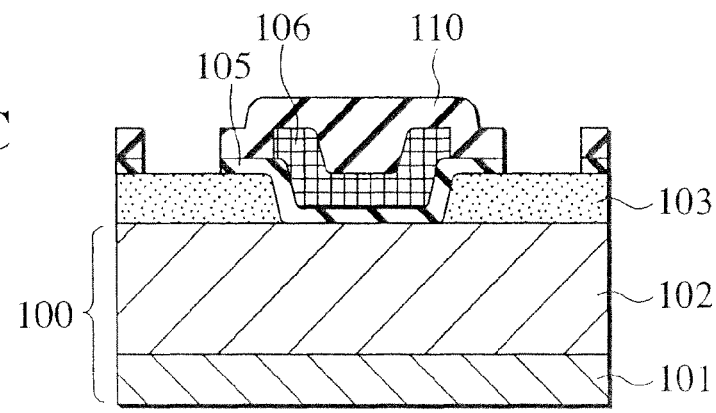

Then, as shown in FIG. 35C, the gate electrode 106 is formed by photolithographic and etching processes, and hereafter an interlayer dielectric 110 is grown. The interlayer dielectric 110 and the gate insulating film 105 are partially removed by lithographic and etching processes, and subsequently contact holes are made.

Figure 35D:
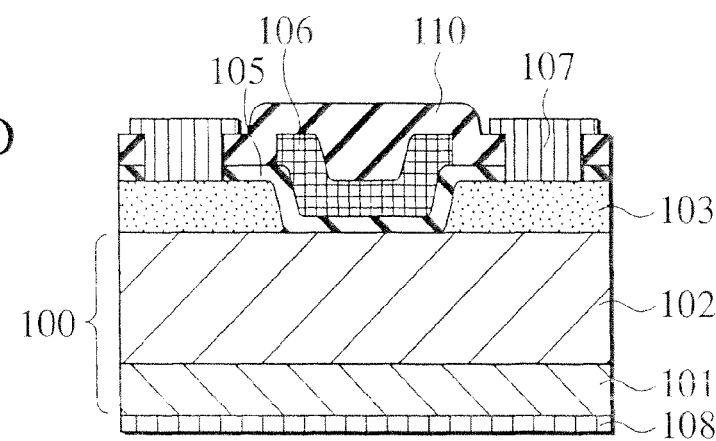

Thence, as shown in FIG. 35D, aluminum is deposited by a sputtering process or the like in a way that the deposited aluminum is in contact with the source region 103 which is made up of the polycrystalline silicon 130, and hereafter the source electrode 107 is formed by lithographic and etching processes. In addition, a titanium and aluminum layer is grown by a sputtering process or the like in a way that the grown layer is in contact with the substrate region 101, and hereby the drain electrode 108 is formed. In this way, the silicon carbide field effect transistor shown in FIG. 33 is completed.

As described above, according to the ninth embodiment of the present invention, the source region 103 is formed by selectively oxidizing the polycrystalline silicon 130 in specified portion and by removing the oxide film 132 produced. For this reason, damages which would be caused by an ion etching process as in a case of employing a dry etching process does not occur in the ninth embodiment. Additionally, capability of controlling is higher and the yields do not decrease in comparison with the case of employing a wet etching process. Consequently, silicon carbide field effect transistors with low on state resistance can be manufactured stably. In addition, since a thermal oxidation process is employed for the oxidizing, the oxidizing can be performed with better capability of controlling and easily. Furthermore, since the oxidizing is performed while partially covering the hetero-semiconductor material by an antioxidant film, the oxide film 132 can be formed in a selective manner with ease. Additionally, since the polycrystalline silicon 130 is used as the hetero-semiconductor material, the oxidizing and the doping can be performed with ease.

Furthermore, if the polycrystalline silicon 130 in a portion where the oxide film 132 is formed is oxidized after being ion-implanted by use of a method according to a tenth embodiment for which a detailed description will be provided later, the oxidizing can be accelerated in the depth direction, and a horizontal expansion of the oxidizing can be decreased. As a result, the oxidizing can be performed in a selective manner with precision.

Tenth Embodiment

Figure 36:
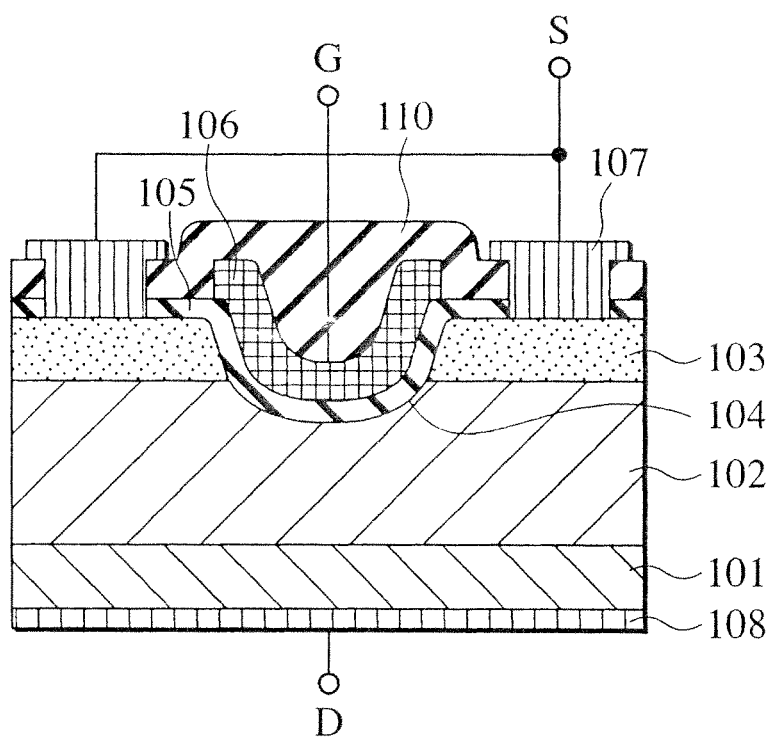
FIG. 36 is a sectional view of a semiconductor device of the tenth embodiment according to the present invention.

FIG. 36 shows a cross sectional view of a silicon carbide field effect transistor which is manufactured by a method according to a tenth embodiment of the present invention. The difference between the field effect transistor shown in FIG. 36 and the field effect transistor shown in FIG. 33 is that the trench 116 is formed in a way that a portion in which the gate insulating film 105 and the gate electrode 106 are formed extends into a part of the drain region 102.

As in the case of the ninth embodiment, the trench 116 is formed as follows. A layer of a hetero-semiconductor material to be a source region 103 is formed on the drain region 102. The layer of the hetero-semiconductor and the drain region 102 in the portion in which the trench 116 is formed is oxidized in a selective manner. Then, the oxide film which is formed by the oxidizing is removed.

Figure 37A:
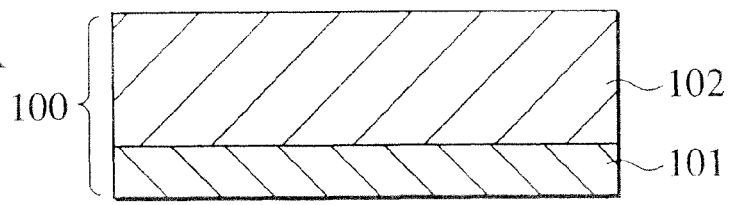
FIGS. 37A, 37B, 37C, 37D, 38A, 38B, 38C, 38D 39A, 39B, and 39C are sectional views for explanation of a manufacturing method of a semiconductor device of the tenth embodiment according to the present invention.

Next, a description will be provided for steps to be taken in the manufacturing of a silicon carbide field effect transistor shown in FIG. 36. First, as shown in FIG. 37A, a silicon carbide body 100 is formed by growing a low concentration n type drain region 102 on a high concentration n type substrate region 101. In this point, concentration of impurities and thickness of the drain region 102 are, for example, $1 \times 10^{16}$ $cm^{-3}$ and 10 μm (micro meter(s)) respectively.

Figure 37B:
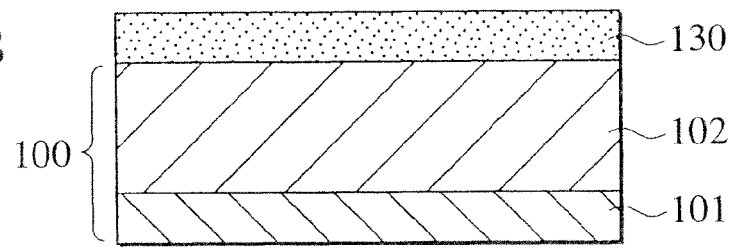

Then, shown in FIG. 37B, a layer of polycrystalline silicon 130 which is a hetero-semiconductor material is grown on the drain region 102 through a low pressure CVD process or the like. In this point, thickness of the polycrystalline silicon 130 is, for example, 500 nm. Incidentally, instead of this, the polycrystalline silicon 130 may be polycrystalline silicon which is recrystallized by a laser anneal process or the like after being grown by an electron beam evaporation process, a sputtering process or the like. A monocrystalline silicon with preferable crystalline properties which is grown heteroepitaxially by a molecular beam epitaxy process may be used instead of the polycrystalline silicon 130.

Figure 37C:
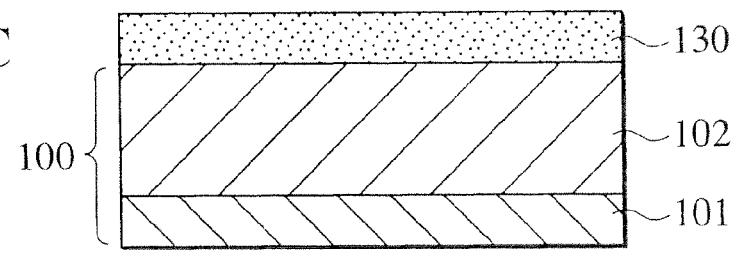

Then, as shown in FIG. 37C, the polycrystalline silicon 130 is doped with phosphorus through a solid phase diffusion process with POCl$_3$. Conditions for the diffusion are, for example, at a temperature of 800° C. (Celsius) and for 20 minutes. Although the conductivity type of the polycrystalline silicon 130 has been described as n type, the type may be p type which is obtained by a solid phase diffusion process with boron. In addition, a combination of an ion implantation process with a thermal process for activation after the ion implantation process may be used for the doping.

Figure 37D:
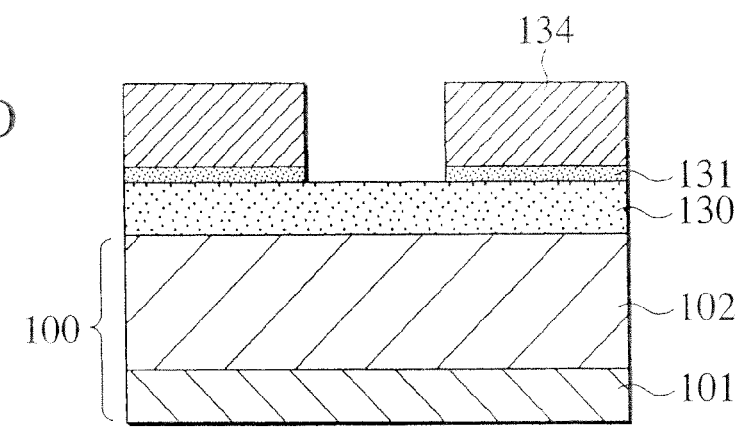

Thence, as shown in FIG. 37D, a silicon nitride film 131 to be an antioxidant film and a silicon oxide film 134 to be a mask plate for an ion plantation process are grown in order on the surface of the layer of the polycrystalline silicon 130 which is a hetero-semiconductor material through a low pressure CVD process or the like. In this point, thickness of each of the silicon nitride film 131 and the silicon oxide film 134 is, for example, 100 nm and 1,500 nm respectively. Incidentally, although the antioxidant film has been described as the silicon nitride film 131, whatever material may be used if the material has a property of barrier inhibiting oxidation and if a film made up of the material can be removed easily. Hereafter, lithographic and etching processes transfer patterns onto the silicon nitride film 131 which is an antioxidant film and the silicon oxide film 134 which is a mask plate for an ion plantation process. This causes the surface of the layer of the polycrystalline silicon 130, which is the hetero-semiconductor material, to be partially covered by the antioxidant film.

Figure 38A:
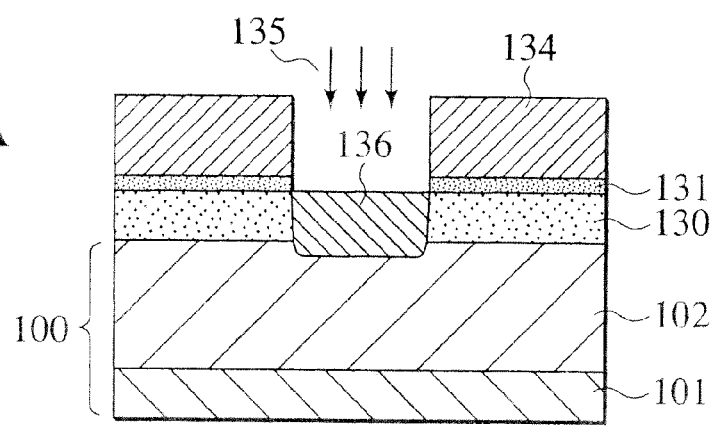

Next, as shown in FIG. 38A, the polycrystalline silicon 130 which is a hetero-semiconductor material and the drain region 102 are ion-implanted, for example, with boron 135. In this point, a condition for the ion-implanting is, for example, a multistep implantation with a total dose of $1.0 \times 10^{16}$ cm$^{-2}$. By this, an ion-planted region 136 is formed.

Figure 38B:
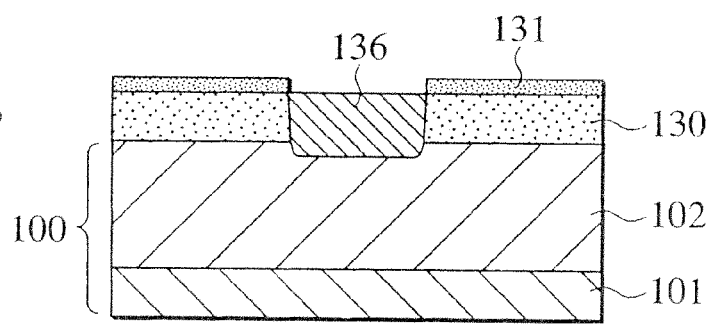

Then, as shown in FIG. 38B, the silicon oxide film 134 which is the mask plate for the ion-implanting is removed, for example, with mixed solutions of ammonium fluoride and hydrofluoric acid.

Figure 38C:
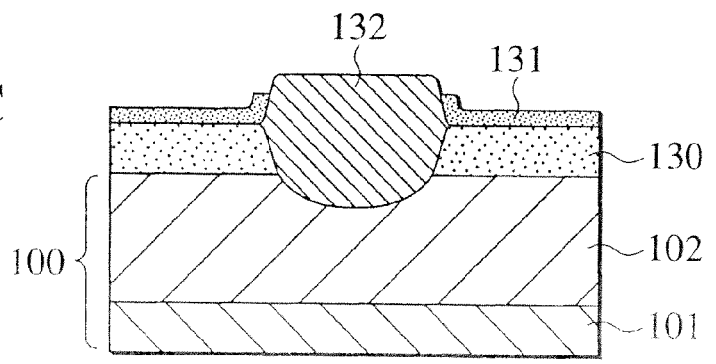

Next, as shown in FIG. 38C, an oxidation film 132 is formed by thermally oxidizing the drain region 102 and the layer of the polycrystalline silicon 130 which is the hetero-semiconductor material that is not covered by the silicon nitride film 131 which is an antioxidant film. At this time, the oxidizing has to be performed in a way that only a part of the ion-implanted region 136 which is located on the side of the drain region 102 is oxidized. This thermal oxidation process is performed, for example, at a temperature of 1,100° C. (Celsius) and in a steamed atmosphere, i.e. in a partial steam pressure of 1.0 atm. In this point, although the thermal oxidation process has been described citing an example of a steam oxidation process, a dry thermal oxidation process, a wet oxidation process, a pyrogenic oxidation process and the like may be used instead. Here, since the drain region 102 and the layer of the polycrystalline silicon 130 which is a hetero-semiconductor material of which the oxide film is formed are ion-implanted with boron 135, crystalline properties and concentration of impurities are different between the ion-implanted region 136 and the region which has not been ion-implanted. For this reason, only a speed at which the oxidizing progresses in the depth direction is accelerated. As a consequence, an expansion of the oxidizing in the horizontal direction can be reduced. Although this embodiment has been described citing a case that an oxidation speed is accelerated by changing crystalline properties and concentration of impurities through an ion-implantation process with boron 135, an element to be used for an ion-implantation process is not limited to this element. For example, if phosphorus is implanted, this can also accelerate an oxidation process since this implantation changes crystalline properties and concentration of impurities. Even if silicon or argon is ion-implanted in a way that only crystalline properties of the ion-implanted region is made different from those of the region which is not ion-implanted, an anisotropy of the oxidizing can be exhibited.

Figure 38D:
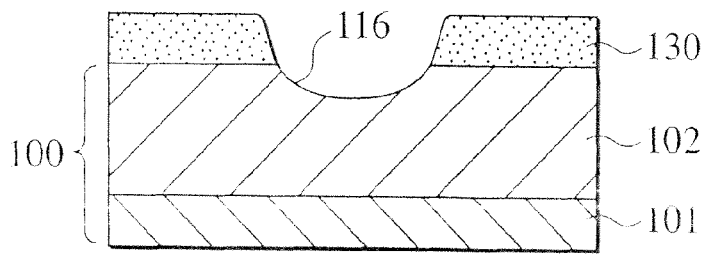

Then, as shown in FIG. 38D, after the silicon nitride film 131 which is an antioxidant film is removed, for example, with phosphoric acid solutions, the oxidation film 132 which is formed, for example, of mixed solutions of ammonium fluoride and hydrofluoric acid is removed. In this way, the trench 116 is formed.

Figure 39A:
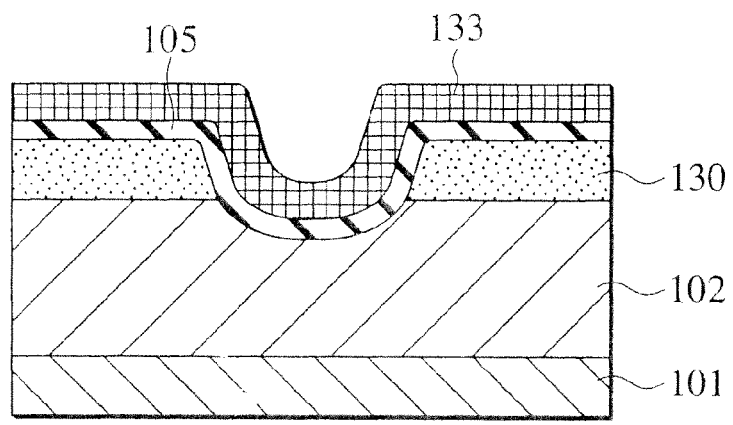

Next, as shown in FIG. 39A, a silicon oxide layer is grown as the gate insulating film 105 by a plasma CVD process or the like, and hereafter a polycrystalline silicon layer 133 to be the gate electrode 106 is grown through a low pressure CVD process or the like. Subsequently, the polycrystalline silicon layer 133 to be the gate electrode 106 is doped with phosphorus through a solid phase diffusion process with POCl$_3$. Conditions for the diffusion are, for example, at a temperature of 950° C. (Celsius) and for 20 minutes. Although the doping has been described citing an example of the solid phase diffusion process, a combination of an ion implantation process with a thermal process for activation after the ion implantation process may be used for the doping.

Figure 39B:
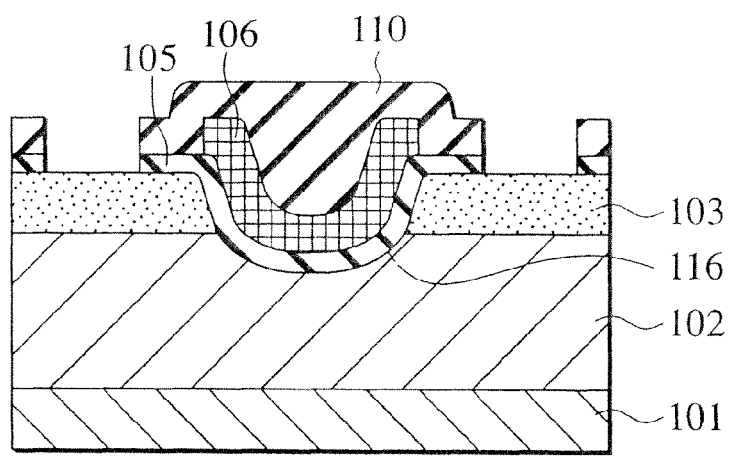

Then, as shown in FIG. 39B, the gate electrode 106 is formed by photolithographic and etching processes, and hereafter an interlayer dielectric 110 is grown. The interlayer dielectric 110 and the gate insulating film 105 are partially removed by lithographic and etching processes, and subsequently contact holes are made.

Figure 39C:
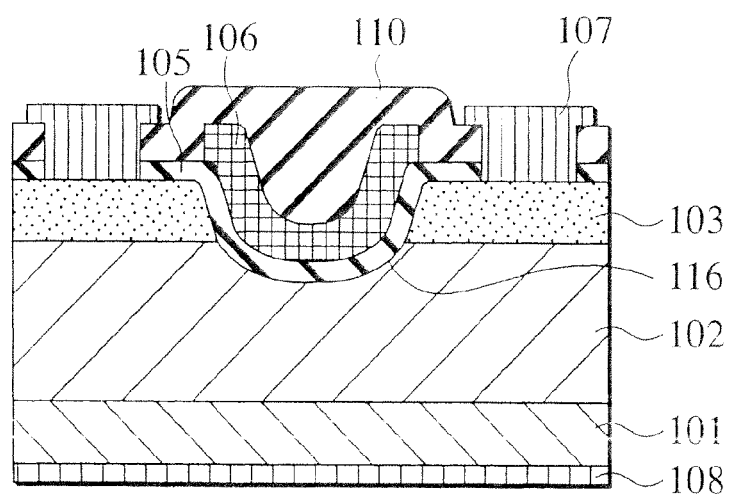

Thence, as shown in FIG. 39C, aluminum is deposited by a sputtering process or the like in a way that the deposited aluminum is in contact with the source region 103 which is made up of the polycrystalline silicon 130, and hereafter the source electrode 107 is formed by lithographic and etching processes. In addition, a titanium and aluminum layer is grown by a sputtering process or the like in a way that the grown layer is in contact with the substrate region 101, and hereby the drain electrode 108 is formed. In this way, the silicon carbide field effect transistor shown in FIG. 36 is completed.

In this manner, the tenth embodiment of the present invention brings about the following effect in addition to the effect which is caused by the ninth embodiment. Neither the drain region 102 nor the source region 103 which is located in the heterojunction interface which is adjacent to the gate insulating film 105 are damaged by an ion etching process as in a case of employing a dry etching process. Accordingly, this is because the trench 116 is formed by removing the oxide film 132 which has been formed by oxidizing, selectively in terms of locations, the drain region 102 and the source region 103 which is made up of a hetero-semiconductor material. This makes it possible to manufacture field effect transistors, with lower on state resistance, which is free from deterioration in transistor properties. Since silicon carbide is used as a semiconductor material of which a semiconductor body is formed, the oxidizing can be performed with ease. In addition, this makes it possible to manufacture high voltage field effect transistors.

If one of a portion in the source region 103 in which the oxide film 132 is formed and a portion in the drain region 102 which is a part of the semiconductor body where the oxide film 132 is formed is oxidized in the above described manner after being ion-implanted, or if both of the two portions is oxidized in the above described manner after being ion-implanted, the oxidizing in the depth direction is accelerated since crystalline properties and concentration of impurities exhibited by a region which is ion-implanted become different from those exhibited by a portion which is not ion-implanted. In other words, an ion implantation process can add anisotropy to an oxidation speed. For this reason, an expansion of the oxidizing in the horizontal direction can be reduced, and accordingly an oxidation process can be performed in a selective manner with precision. In addition, depth of the ion-implanting can be controlled by changing an amount of energy of ions while ion-implanting. This makes it possible to ion-implant any portion in the source region 103 and the drain region 102.

According to this embodiment, if an ion implantation process and an oxidation process are performed while covering a hetero-semiconductor material with an antioxidant film selectively in terms of locations, this enables the selective oxidation process to be performed in self alignment with high precision.

Although this embodiment has been described citing an example of a combination of an ion implantation process, an oxidation process and a process of removing an oxide film by which the trench 116 is formed, these processes may be repeated separately. For example, the following flow of processes is allowed. At first only polycrystalline silicon 130 is oxidized selectively, and the oxide film is removed. Hereafter, a drain region 102 is ion-implanted selectively, and an ion-implanted region 136 is formed. Then, the ion-implanted region 136 is oxidized, and subsequently the oxide film is removed.

According to this embodiment, if a part of a surface of the hetero-semiconductor material is covered with an antioxidant film selectively in terms of locations before an ion implantation process and then is ion-implanted, and if subsequently an oxidation process is performed while being covered by the antioxidant film after the ion implantation process, this enables the selective oxidation process to be performed in self alignment with high precision. Accordingly, an oxidation process and an ion implantation process can be performed in a micronized manner, and furthermore this makes it possible to manufacture silicon carbide field effect transistor with low on state resistance.

It should be noted that, although the aforementioned ninth and tenth embodiments have been described citing a case that polycrystalline silicon 130 is used for a layer of a hetero-semiconductor material of which the source region 103 is formed, a hetero-semiconductor material of which the source region 103 is formed may be comprised of at least, for example, one of monocrystalline silicon, polycrystalline silicon, amorphous silicon and silicon germanium. Although 4H is typical of a silicon carbide crystal group which is used as a semiconductor material of which a semiconductor body is formed, other crystal groups such as 6H and 3C may be used. As a matter of course, a semiconductor material of which a semiconductor body is formed is not limited to silicon carbide.

In addition, although this embodiment has been described citing a case that a conductivity type of a semiconductor body is n type, p type also brings about the same effect. In addition, although this embodiment has been described citing a case that a conductivity type of a hetero-semiconductor material is n type, p type and the same conductivity type with different concentration may be used.

Eleventh Embodiment

Next, a description will be provided for an eleventh embodiment. According to conventional structures, in an n− type polycrystalline silicon layer and a portion of heterojunction which is formed between an n+ type polycrystalline region and an n− type epitaxial region, leakage current which is determined physically by the height of a hetero-barrier is caused. For this reason, reduction in leakage current is restrained.

This embodiment is to provide a semiconductor device (a high voltage field effect transistor) which can reduce leakage current with ease, which is caused in a hetero-interface, while maintaining the same operability as conventional semiconductor devices have. This embodiment causes current to flow in a portion of a heterojunction (hereinafter referred to as a first heterojunction), which constitutes a channel, between a first source region (a first hetero-semiconductor region) of a first conductivity type and a drain region, while in a conduction state. For this reason, this embodiment brings about an effect that an on state resistance which is equivalent to that of conventional semiconductor devices is obtained. In addition, this embodiment causes an effect that leakage current can be reduced in comparison with conventional semiconductor devices, since a portion of heterojunction (hereinafter referred to as a portion of second heterojunction) between a second source region (a second hetero-semiconductor region) and a drain region defines the second source region as a second conductivity type while in a cutoff state.

Figure 40:
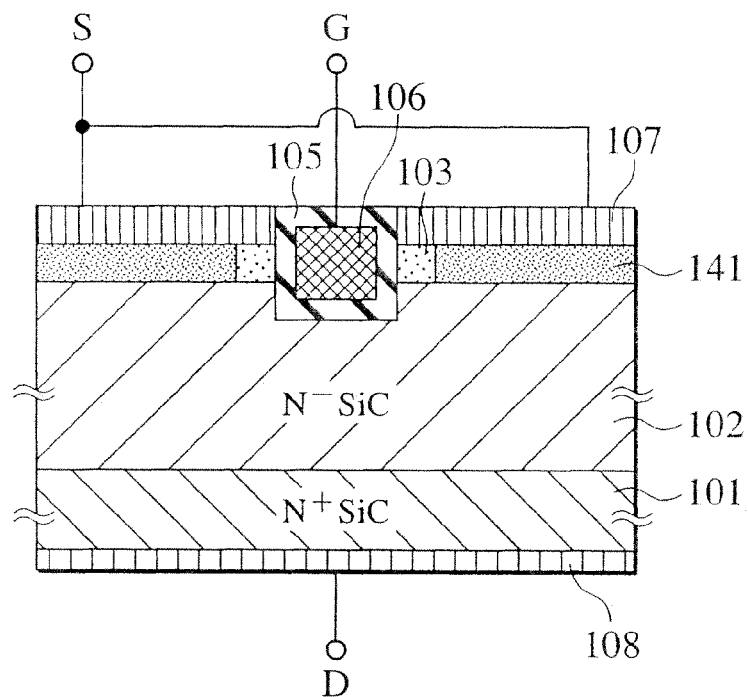
FIG. 40 is a sectional view of a semiconductor device of the eleventh embodiment according to the present invention.

FIG. 40 is a cross sectional view to show the semiconductor device according to the eleventh embodiment. The figure shows a structure in which two cells as structural units are opposite to each other. This embodiment will be described citing an example of a high voltage field effect transistor whose substrate material is silicon carbide. For example, an n− type drain region 102 is formed on an n+ type substrate region 101 whose silicon carbide polytype is 4H type. For example, a first source region 103 (concentration source region) which is made up of n type polycrystalline silicon and a second source region 141 (a second hetero-semiconductor region) which is made up of p type polycrystalline silicon are formed in a way that the first source region 103 and the second source region 141 are in contact with the main surface (the upper surface of the drain region 102 in FIG. 40) which is the opposite side of the drain region 102 relative to the junction surface between the drain region 102 and the substrate region 101. In other words, a portion of junction between the drain region 102 and the first source region 103 as well as a portion of junction between the drain region 102 and the second source region 141 is formed of heterojunction which is made up of silicon carbide and polycrystalline silicon whose bandgaps are different from each other. In addition, energy barrier exists in the junction interface.

In addition, for example, a gate insulating film 105 which is formed of a silicon oxide film is formed in a way that the gate insulating film 105 is connected with the junction surface between the first source region 103 and the drain region 102. Additionally, a gate electrode 106 which is insulated by the gate insulating film 105 is formed. In addition, a source electrode 107 is formed on the surface which is the opposite side of the first source region 103 and the second source region 141 relative to the junction surfaces between the first source region 103 and the drain region 102 and between the second source region 141 and the drain region 102 (the upper surfaces of the first source region 103 and the second source region 141 in FIG. 40). Furthermore, a drain electrode 108 is formed on a substrate region 101 which is made up of silicon carbide in a way that the drain electrode 108 is connected with the substrate region 101.

Figure 41:
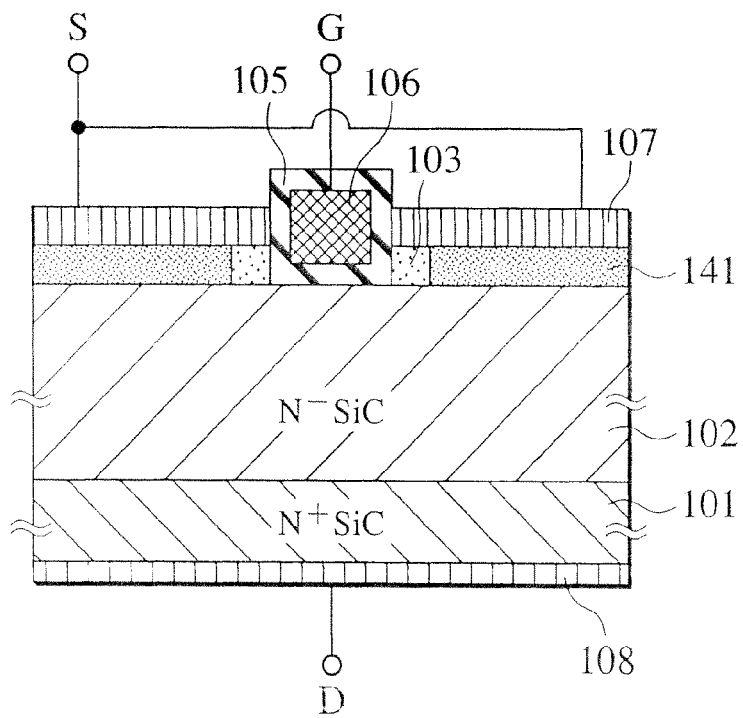
FIG. 41 is a sectional view of another semiconductor device of the eleventh embodiment according to the present invention.

As shown in FIG. 40, this embodiment has been described citing an example of what is called a trench type structure, in which a trench is formed on the surface of the drain region 102 and the gate electrode 106 is formed in the trench with the gate insulating film 105 placed underneath. As shown in FIG. 41, however, what is called a planar type, in which no trench is formed in the drain region 102, may be also used for the structure.

Figure 46A:
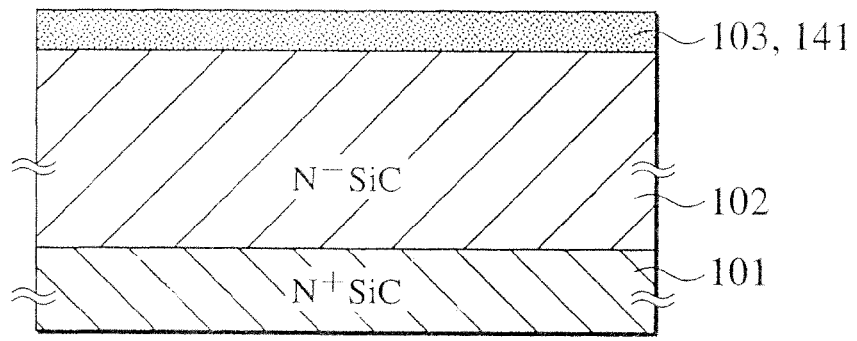
FIGS. 46A, 46B, 46C, 47A, 47B, and 47C are sectional views for explanation of a manufacturing method of a semiconductor device of the eleventh embodiment according to the present invention.

Next, a description will be provided for a method for manufacturing the silicon carbide semiconductor device shown in FIG. 40 according to the eleventh embodiment of the present invention with reference to drawings. First, as shown in FIG. 46A, an n type silicon carbide semiconductor body is formed by growing the n− type drain region 102 on the n+ type substrate region 101 epitaxially. Then, polycrystalline silicon is deposited on the n type silicon carbide semiconductor substrate region 101, for example, by an LP-CDV process. Hereafter, p type polycrystalline silicon layers (corresponding to portions indicated by reference numerals 103 and 141 in FIG. 40) are formed by being doped with boron, for example, in a $BBr^3$ atmosphere. Incidentally, the polycrystalline silicon layer may be formed through being recrystallized by a laser anneal process after depositing silicon by an electron beam evaporation process, a sputtering process, or the like. Or else, the polycrystalline silicon layer may be formed of monocrystalline silicon which has been grown epitaxially by a molecular beam epitaxy process. In addition, a combination of an ion implantation process with a thermal process for activation after the ion plantation process may be used for a doping. With regard to the drain region 102, the concentration of impurities is $1 \times 10^{16}$ cm$^{-3}$, and the thickness is 10 μm (micro meter(s)) respectively. For example, the thickness of the polycrystalline silicon layer is 0.5 μm (micro meter(s)).

Figure 46B:
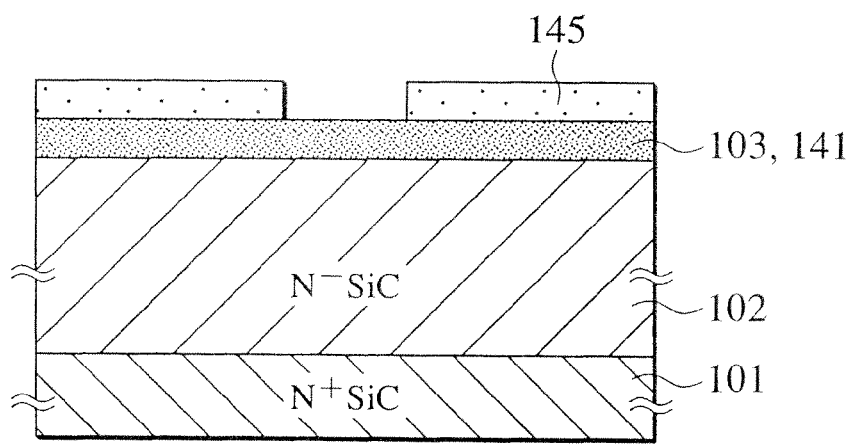

Then, as shown in FIG. 46B, a silicon nitride film is grown on the polycrystalline silicon layers (103 and 141), for example, by an LP-CVD process or the like. Hereafter, a mask plate 145 is formed by lithographic and etching processes. It should be noted that, although the manufacturing method has been described citing a case that a material for the mask plate is a silicon nitride film, whatever material may be used if the material allows an etching process to be performed in a selective manner, and if a layer which is formed of the material can be removed easily.

Figure 46C:
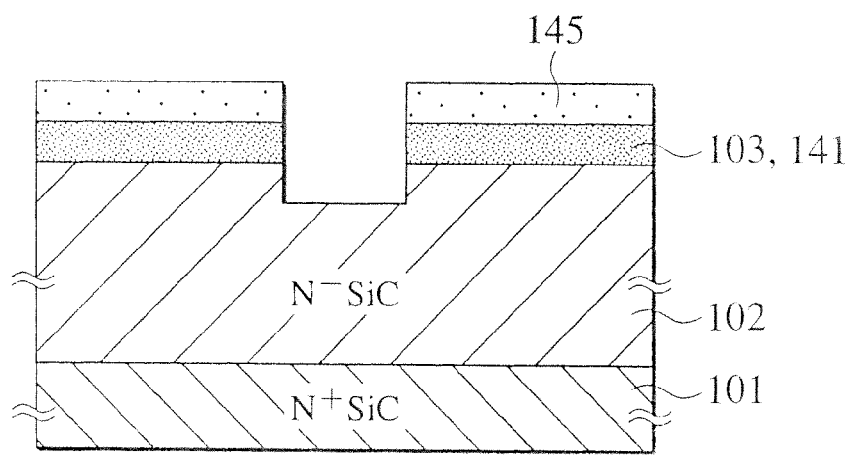

Thence, as shown in FIG. 46C, a trench with a prescribed depth is formed by etching the surfaces of the polycrystalline silicon layers (103 and 141) and the drain region 102 through a reactive ion etching process (a dry etching process). Incidentally, other etching processes such as a wet etching process) may be used as a process for etching the polycrystalline silicon layer.

Figure 47A:
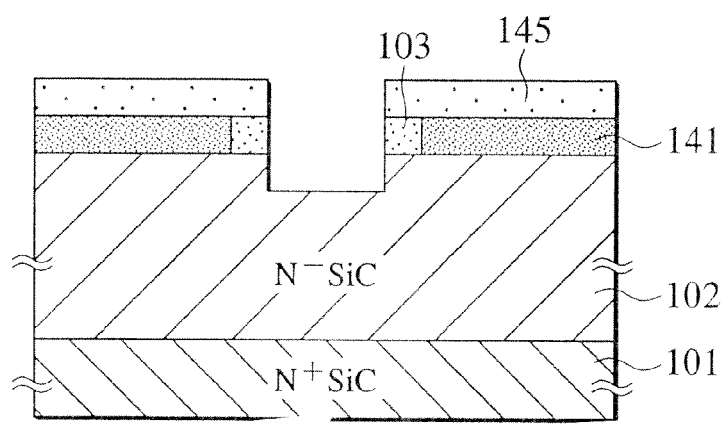

Next, as shown in FIG. 47, the n type polycrystalline silicon layer is formed only in a portion which is in contact with a surface that has been etched, if doped with phosphorus, for example, in a $POCl_3$ atmosphere while covered by the mask plate 145. This is because phosphorus is introduced in the polycrystalline silicon layer through a surface which has been treated by an ion etching process, but not through a portion which is covered by the mask plate 145. In other words, the n type first source region 103 and the p type second source region 141 are formed in this way.

Figure 47B:
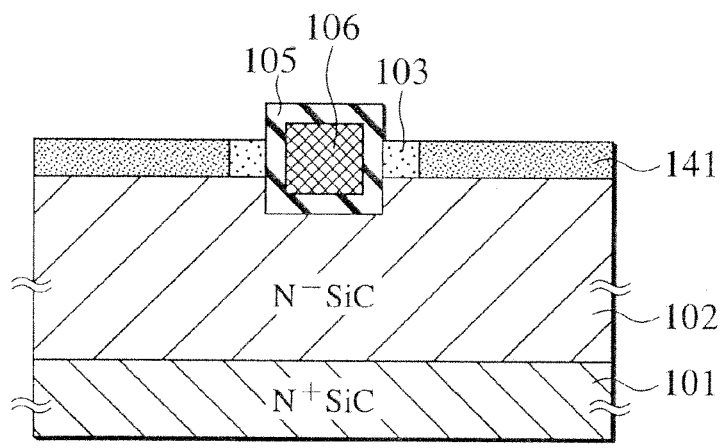

Then, as shown in FIG. 47B, after the mask plate 145 is removed, for example, with phosphoric acid solutions, the gate insulating film 105 is grown on the upper surfaces of the first source region 103 and the second source region 141 and along the inner wall of the trench. Furthermore, a polycrystalline silicon layer to be the gate electrode 106 is grown. Hereafter, the polycrystalline silicon layer to be the gate electrode 106 is doped with phosphorus through a solid phase diffusion process with $POCl_3$. Thence, after the gate electrode 106 is formed by lithographic and etching processes, an interlayer dielectric is laid up. Then, the interlayer dielectric and the gate insulating film 105 are removed by lithographic and etching processes. Next, contact holes are made.

Figure 47C:
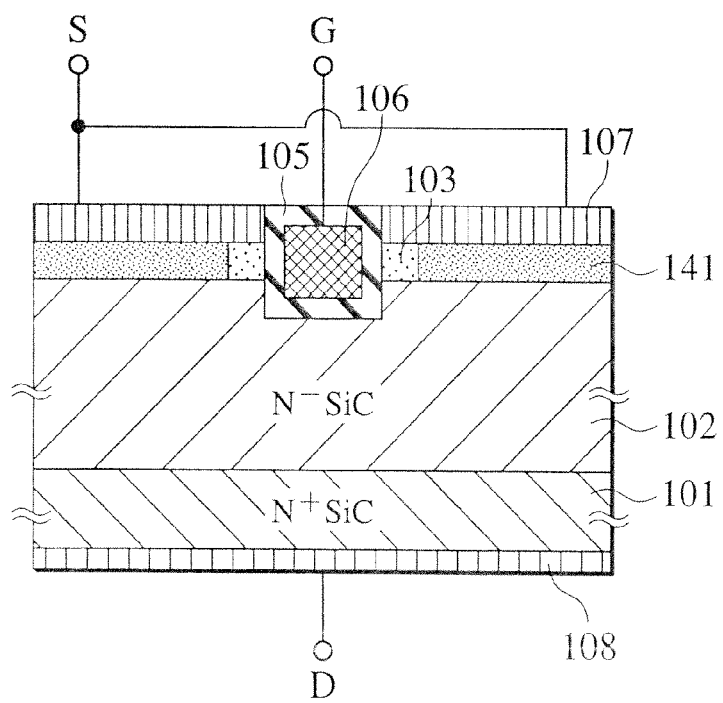

Finally, as shown in FIG. 47C, the drain electrode 108 which is made up, for example, of titanium (Ti) and nickel (Ni) is formed on the substrate region 101 on the rear side. The source electrode 107 is formed by depositing titanium (Ti) and aluminum (Al) in order on the upper surfaces of the first source region 103 and the second source region 141 which is the upper side of the semiconductor device. In this way, the silicon carbide semiconductor device shown in FIG. 40 according to the eleventh embodiment of the present invention is completed.

As described above, semiconductor devices according to the eleventh embodiment can be manufactured easily by use of conventional manufacturing technologies.

Next, a description will be provided for operations of the semiconductor device. According to this embodiment, the semiconductor device is used in a way that, for example, the source electrode 107 is grounded and the drain electrode 108 is applied with positive potential. First, if the gate electrode 106 is applied, for example, with ground state potential or negative potential, a cutoff state is maintained. This is because energy barrier against conductive electrons is formed in each of the heterojunction interfaces between the first source region 103 and the drain region 102 and between the second source region 141 and the drain region 102. In this point, since both the first source region 103 and the second source region 141 are made up of silicon materials, the difference $\Delta EC$ of energy barrier between the first source region 103 and the drain region 102 is equal to the difference $\Delta EC$ of energy barrier between the second source region 141 and the drain region 102.

However, since Fermi energy which is defined as the difference between conduction band and Fermi level is different between the first source region 103 which is n type and the second source region 141 which is p type, the width of the depletion layer expanding towards the junction interface between the first source region 103 and the drain region 102 is different from the width of the depletion layer expanding towards the junction interface between the second source region 141 and the drain region 102. In other words, the width of a depletion layer expanding from the junction interface between the second source region 141 and the drain region 102 is larger than the width of a depletion layer expanding from the junction interface between the first source region 103 and the drain region 102. For this reason, higher cutoff performance can be obtained, and hereby leakage current can be reduced.

Moreover, in a case that, for example, the concentration of impurities in the second source region 141 is made higher than that in the first source region 103, a depletion layer which is caused by a built-in electric field of a PN diode that is formed of the second source region 141 and the first source region 103 expands towards the first source region. For this reason, leakage current in the portion of heterojunction between the first source region and the drain region can be also reduced.

The manufacturing method according to this embodiment enables the first source region 103 to be formed by easily controlling the width of the first source region 103 in a way that the width of the first source region 103 is such that electric field from the gate electrode 106 reaches the first source region 103. For this reason, if, for example, the gate electrode 106 is applied with negative potential and an inversion region is formed throughout the first source region 103, cutoff performance as the semiconductor device can be further improved.

According to this embodiment, while the first source region 103 is formed, impurities are introduced by a self alignment process through a portion in which the gate electrode 106 is in contact with the first source region 103 with the gate insulating film 105 placed in-between. For this reason, even if, for example, a semiconductor element which integrates a plurality of cells is formed, the width of the source region 103 can be controlled with precision, and accordingly unevenness of the cutoff properties can be also inhibited.

In this way, according to this embodiment, higher cutoff properties can be realized in comparison with conventional structures.

Next, in a case that the gate electrode 106 is applied with positive potential in order to switch from a cutoff state to a conduction state, a gate field reaches the heterojunction interface in which the first source region 103 and the drain region 102 is in contact with each other with the gate insulating film 105 in-between. For this reason, a layer in which conductive electrons accumulate is formed in a portion of the first source region 103 and a portion of the drain region 102, which are located in the vicinity of the gate electrode 106. In other words, potential is suppressed in a portion of the junction interface between the first source region 103 and the drain region 102, which is located in the vicinity of the gate electrode 106, and on the side of the first region 103. In addition, energy barrier on the side of the drain region 102 becomes steep. Consequently, conductive electrons can pass through the energy barrier.

In this point, according to this embodiment, while the first source region 103 is formed, impurities are introduced by a self alignment process through a portion in which the gate electrode 106 is in contact with the first source region 103 with the gate insulating film 105 placed in-between. For this reason, even if, for example, a semiconductor element which integrates a plurality of cells is formed, the width of the source region 103 can be controlled with precision, and accordingly unevenness of on state resistance of each cell can be also inhibited. In other words, concentration of current can be inhibited, and thus higher reliability can be obtained.

Next, if the gate electrode 106 is again applied with ground state potential in order to switch from a conduction state to a cutoff state, this terminates the state that conductive electrons accumulate in the heterojunction interface between the first source region 103 and the drain region 102, and hereby the tunneling through the energy barrier ends. Then, conductive electrons stop flowing from the first source region 103 to the drain region 102, and conductive electrons which exist in the drain region 102 are depleted by flowing out to the substrate region 101. Consequently, a depletion layer expands in the drain region 102 from the portion of heterojunction, and this brings about a cutoff state.

In addition, this embodiment can realize conduction in the reverse direction (a return current operation) in which, for example, the source electrode 107 is grounded and the drain electrode 108 is applied with negative potential, as in the case of conventional structures. If, for example, the source electrode 107 and the gate electrode 106 are applied with ground state potential and the drain electrode 108 is applied with prescribed positive potential, the energy barrier against conductive electrons disappears, and accordingly conductive electrons flow from the drain region 102 to the first source region 103 and the second source region 141. This brings about a conduction state. In this point, conduction is caused by conductive electrons only, and without holes injected. This makes smaller loss which is brought about by reverse recovery current that is to occur in a transition from a reverse conduction state to a cutoff state. Incidentally, the above described gate electrode 106 can be used as a control electrode instead of being grounded.

As described above, according to this embodiment, the configuration shown in FIG. 40 can realize the same operations as conventional structures do. In addition, this configuration has the following advantages in comparison with conventional structures. Since the second source region 141 is formed as a second conductivity type, the portion of heterojunction between the second source region 141 and the drain region 102 enables leakage current to be reduced in comparison with conventional structures.

Moreover, in a case that, for example, the concentration of impurities in the second source region 141 is made higher than that in the first source region 103, a depletion layer which is caused by a built-in electric field of a PN diode that is formed of the second source region 141 and the first source region 103 expands towards the first source region 103. For this reason, leakage current in the portion of heterojunction between the first source region 103 and the drain region 102 can be also further reduced.

In addition, expansion of the depletion layer in the first source region 103 in the horizontal direction can be inhibited. For this reason, if the width of a channel which electric field from the gate electrode 106 reaches is controlled to an extent of being sufficiently minimum, this makes it possible to easily reduce leakage current in the portion of the first heterojunction between the first source region 103 and the drain region 102.

Moreover, the expansion of the depletion layer in the first source region 103 in the horizontal direction can be formed in self alignment. For this reason, even if a plurality of unit cells are integrated, the first source region 103 can be formed homogeneously. As a result, maldistribution of leakage current hardly occurs while in a cutoff state, and maldistribution of on state resistance hardly occurs while in a conduction state. Accordingly, reliability is improved.

Twelfth Embodiment

Figure 42:
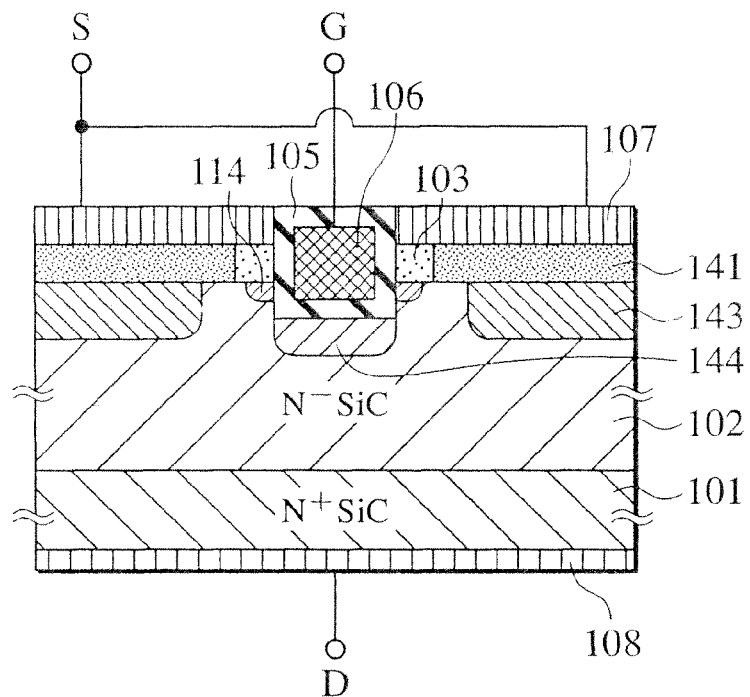
FIG. 42 is a sectional view of a semiconductor device of the twelfth embodiment according to the present invention.

FIG. 42 is a cross sectional view of a semiconductor device according to a twelfth embodiment of the present invention, and corresponds to FIG. 40 of the eleventh embodiment. For this embodiment, descriptions of operations which are the same as operations which are performed as shown in FIG. 40 will be omitted, and detailed descriptions will be provided for features which are different from those which have been described in FIG. 40.

According to this embodiment, as shown in FIG. 42, an n+ type conduction region 114 whose concentration is higher than that of a drain region 102 is formed in a prescribed portion of a drain region 102 which is in contact with a gate electrode 106 (with a gate insulating film 105 placed in-between) and which is in contact with a first source region 103. In addition, a first field relaxation region 143 is formed in the surface of the drain region 102, in a prescribed distance away from a portion in which a gate electrode 106 and the source region 103 are opposite to each other, and in a way that the first field relaxation region 143 is in contact with the first source region 103 or a second source region 141. In addition, a second field relaxation region 144 is formed underneath the bottom of a trench on which the gate electrode 106 is formed in a way that the second field relaxation region 144 is in contact with the gate electrode 106 with the gate insulating film 105 placed in-between.

While in a conduction state, this construction relaxes energy barrier in a heterojunction interface between the first source region 103 and the conduction region 114, and accordingly higher conduction properties can be obtained. In other words, on state resistance becomes further smaller, and accordingly conduction performance is improved.

In addition, while in a cutoff state, a depletion layer which corresponds with drain potential expands between the first field relaxation region 143 and the drain region 102 and between the second field relaxation region 144 and the drain region 102. In other words, although a drain field is applied to the heterojunction interface between the first source region 103 and the drain region 102 and between the second source region 141 and the drain region 102 according to the eleventh embodiment, the twelfth embodiment causes the drain field to be relaxed by the first field relaxation region 143. For this reason, leakage current is further reduced, and accordingly cutoff performance is further improved. In addition, since drain field which is applied to the gate insulating film 105 is relaxed by the second field relaxation region 144, this relaxation enables dielectric breakdown of the gate insulating film 105 to hardly occur. Accordingly, reliability of the gate insulating film 105 can be improved.

Furthermore, the thickness of the above described semiconductor body (the drain region 102) underneath the second field relaxation region 144 is equal to that of the semiconductor body underneath the first field relaxation region 143. For this reason, steps of the manufacturing can be simplified.

Incidentally, although this embodiment has been described citing a case that all of the conduction region 114, the first field relaxation region 143 and the second field relaxation region 144 are formed, if one of the regions is formed, this serves for the object of this embodiment.

Thirteenth Embodiment

Figure 43:
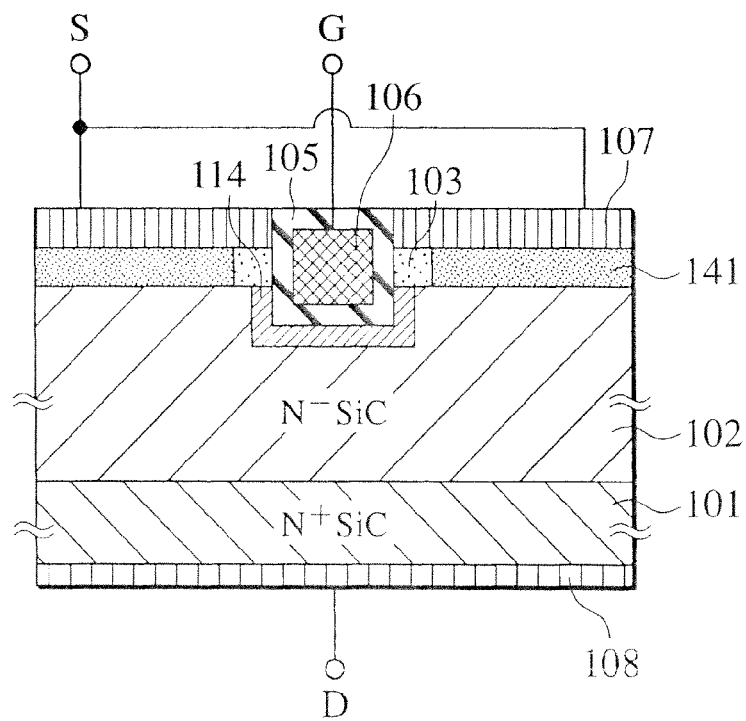
FIG. 43 is a sectional view of a semiconductor device of the thirteenth embodiment according to the present invention.

FIG. 43 is a cross sectional view of a semiconductor device according to a thirteenth embodiment of the present invention, and corresponds to FIG. 40 of the eleventh embodiment. For this embodiment, descriptions of operations which are the same as operations which are performed as shown in FIG. 40 will be omitted, and detailed descriptions will be provided for features which are different from those which have been described in FIG. 40.

According to this embodiment, as shown in FIG. 43, an n+ type conduction region 114 whose concentration is higher than that of a drain region 102 is formed in a prescribed portion of a drain region 102 which is in contact with a gate electrode 106 (with a gate insulating film 105 placed in-between) and which is in contact with a first source region 103. Unlike the twelfth embodiment, the conduction region 114 is formed, also, underneath the bottom of a trench on which a gate electrode 106 is formed with the gate insulating film 105 placed in-between.

Figure 48A:
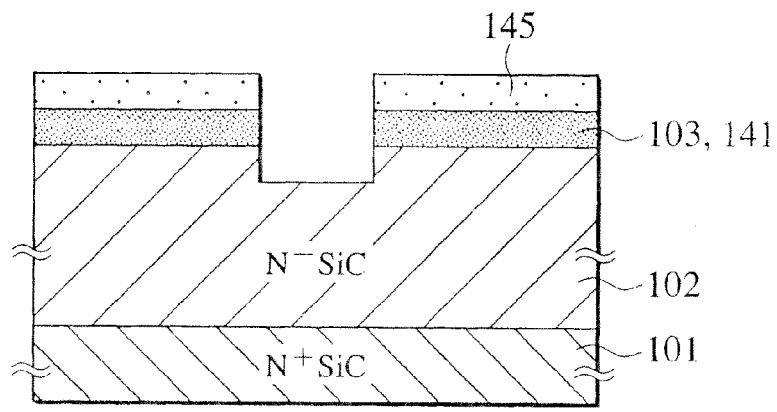
FIGS. 48A, 48B, and 48C are sectional views for explanation of a manufacturing method of a semiconductor device of the thirteenth embodiment according to the present invention.
Figure 48B:
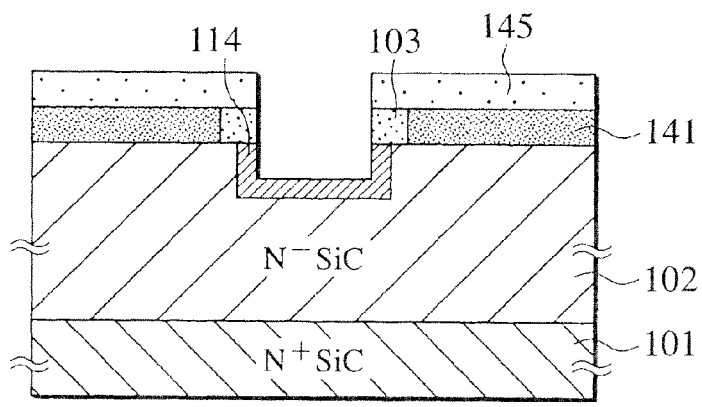

An aspect of the manufacturing method will be described below with reference to FIG. 48. Manufacturing steps to be taken up to a step shown in FIG. 48A is the same as steps up to a step shown in FIG. 46C of the eleventh embodiment. Next, if doped with phosphorus, for example, in a POCl$_3$ atmosphere and at a higher temperature while covered by the mask plates 145, as shown in FIG. 48B, phosphorus is introduced in the polycrystalline silicon layer through a surface which has been treated by an ion etching process, and additionally phosphorus is introduced in the silicon carbide layer through a surface of silicon carbide which has been treated by an ion etching process. As in the case of the eleventh embodiment, however, phosphorus is not introduced through a surface which has been covered by the mask plate 145. For this reason, the n type polycrystalline silicon layer and the n+ type conduction region 114 are formed, at the same time, in the portions which are in contact with the surfaces that have been treated by the ion etching process.

Incidentally, although this embodiment has been described citing a case that introduction of impurities is carried out through a solid phase diffusion, other methods for introducing impurities such as an ion implantation method may be used.

Figure 48C:
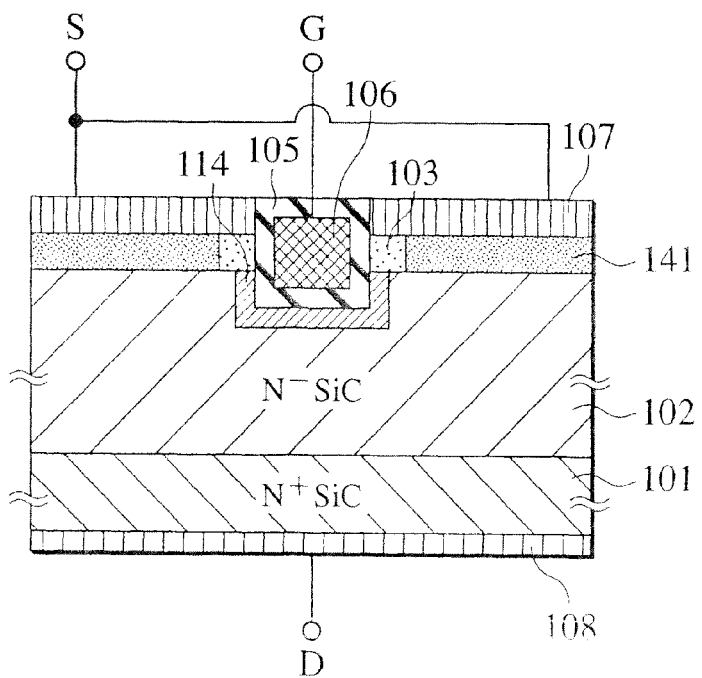

Next, as shown in FIG. 48C, the gate insulating film 105, the gate electrode 106, the source electrode 107 and the drain electrode 108 are formed as in the case of the eleventh embodiment, and hereby the silicon carbide semiconductor device shown in FIG. 43 according to the thirteenth embodiment of the present invention is completed.

As described above, the semiconductor device according to this embodiment can be realized by use of conventional technologies with ease.

While in a conduction state, this construction relaxes energy barrier in a heterojunction interface between the first source region 103 and the conduction region 114, which is the same effects as the conduction region 114 brings about as shown in the twelfth embodiment, and accordingly higher conduction properties can be obtained.

In addition, the construction method shown in this embodiment enables the width of a portion, where the conduction region 114 is in contact with the first source region 103, to be formed so that the width is sufficiently minimum with precision by a self alignment process at the same time. This makes it possible to inhibit maldistribution of current between each two cells while in a conduction state and while in the cutoff state. In addition, leakage current in the heterojunction interface between the first source region 103 and the conduction region 114 can be reduced to the utmost while in a cutoff state. Consequently, on state resistance can be reduced without cutoff performance being impaired to a large extent.

Fourteenth Embodiment

Figure 44:
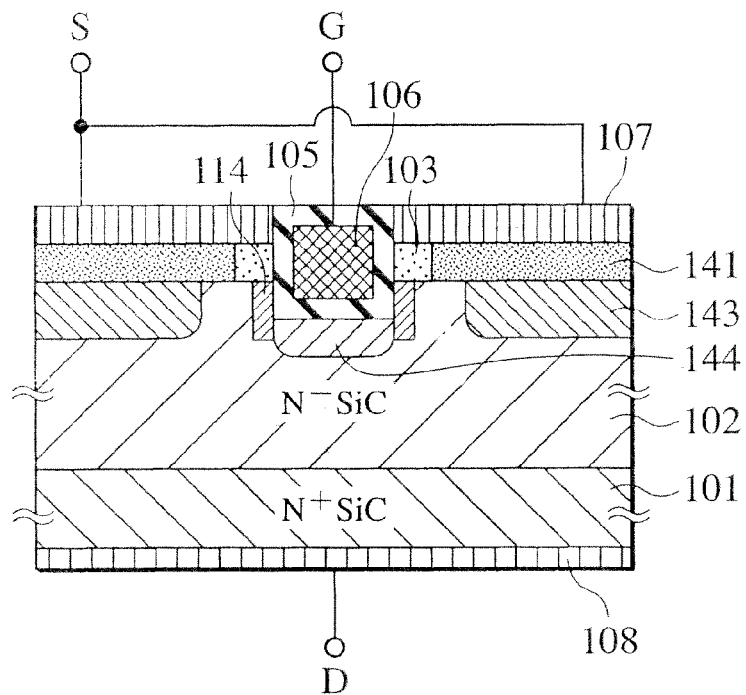
FIG. 44 is a sectional view of a semiconductor device of the fourteenth embodiment according to the present invention.

FIG. 44 is a cross sectional view of a semiconductor device according to a fourteenth embodiment of the present invention, and corresponds to FIG. 42 of the twelfth embodiment. For this embodiment, descriptions of operations which are the same as operations which are performed as shown in FIG. 42 will be omitted, and detailed descriptions will be provided for features which are different from those which have been described in FIG. 42.

As shown in FIG. 44, the semiconductor device of this embodiment is configured to include a conduction region 114, a first field relaxation region 143 and a second field relaxation region 144, as in the case of the twelfth embodiment. The semiconductor device is characterized in that the conduction region 114 and the second field relaxation region 144 can be formed by a self alignment process.

Hereafter, a description will be provided for a method for manufacturing the semiconductor device according to this embodiment with reference to drawings. Before starting a manufacturing step shown in 49A, the following processes need to be completed. Before, for example, the polycrystalline silicon layer is formed in the step shown in FIG. 46A of the eleventh embodiment, the first field relaxation region 143 has been formed. Hereafter, the same step as shown in FIG. 46A of the eleventh embodiment is followed.

Figure 49A:
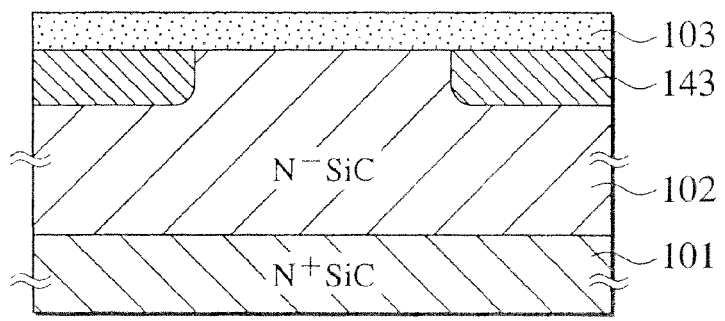
FIGS. 49A, 49B, 49C, 50A, and 50B are sectional views for explanation of a manufacturing method of a semiconductor device of the fourteenth embodiment according to the present invention.
Figure 49B:
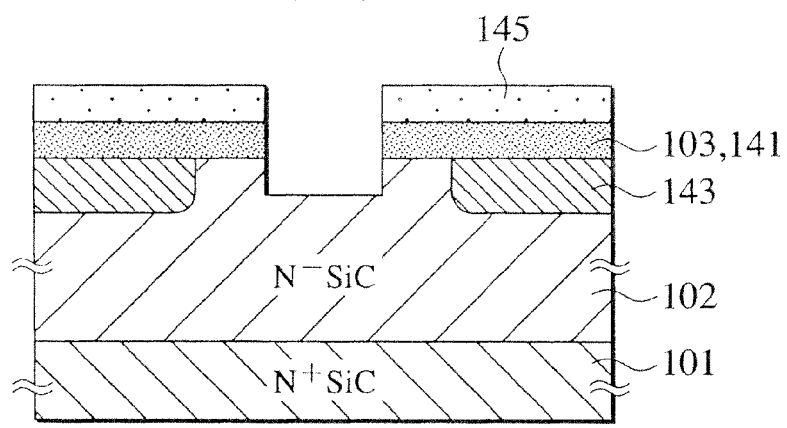

Next, as shown in FIG. 49B, a mask plate 145 is formed, and hereafter a trench is formed by an ion etching process, in the same manner as shown in FIG. 46B and FIG. 46C of the eleventh embodiment.

Figure 49C:
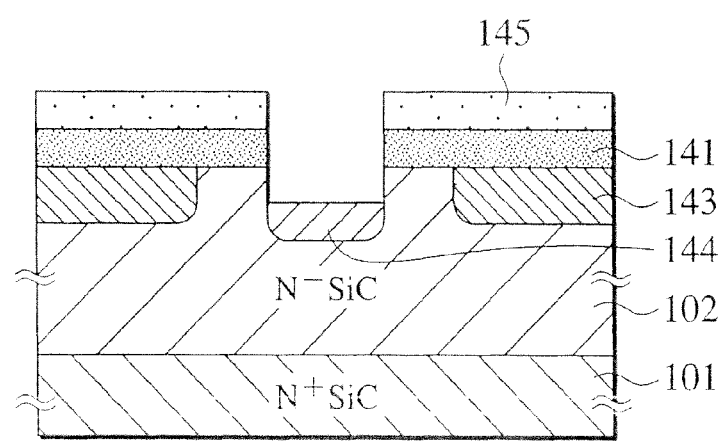

Then, as shown in FIG. 49C, a second field relaxation region 144 is formed, for example, by an ion implantation process with aluminum ions or boron ions while covered by the mask plate 145.

Figure 50A:
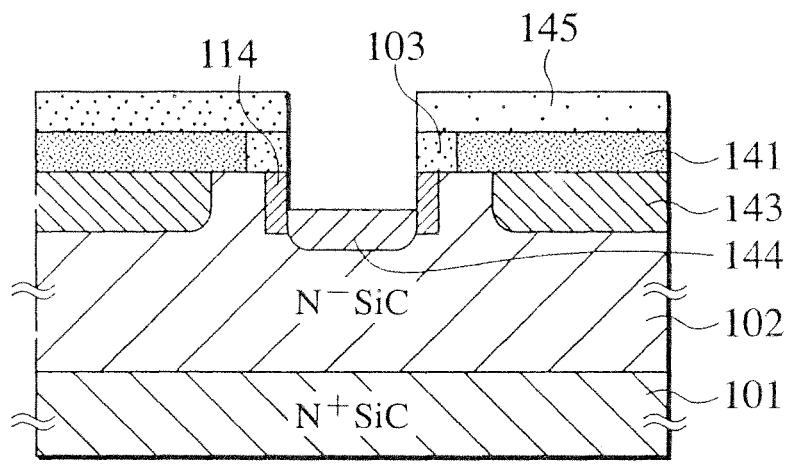

Furthermore, as shown in FIG. 50A, an n type polycrystalline silicon layer and an n+ type conduction region 114 are formed at the same time through the following processes. A polycrystalline silicon layer is doped with phosphorus, for example, in a $POCl_3$ atmosphere at a high temperature while covered by the mask plate 145, and hereby phosphorus is introduced through a silicon carbide surface of the polycrystalline silicon layer which has been ion-etched.

It should be noted that, although this embodiment has been described citing a case that the second source region 141 and the conduction region 114 are formed after the second field relaxation region 144 is formed, it does not matter whether the second source region 141 and the conduction region 114 or the second field relaxation region 144 are formed first.

Figure 50B:
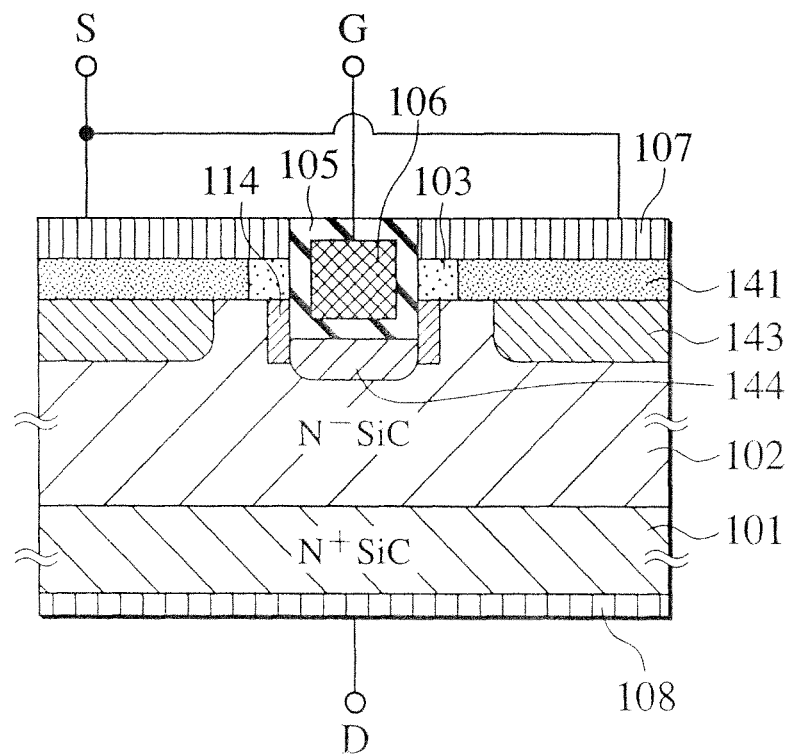

Finally, as shown in FIG. 50B, the silicon carbide semiconductor device shown in FIG. 44 according to the fourteenth embodiment of the present invention is completed by forming the gate insulating film 105, the gate electrode 106, the source electrode 107 and the drain electrode 108, as in the case of the eleventh embodiment.

Figure 45:
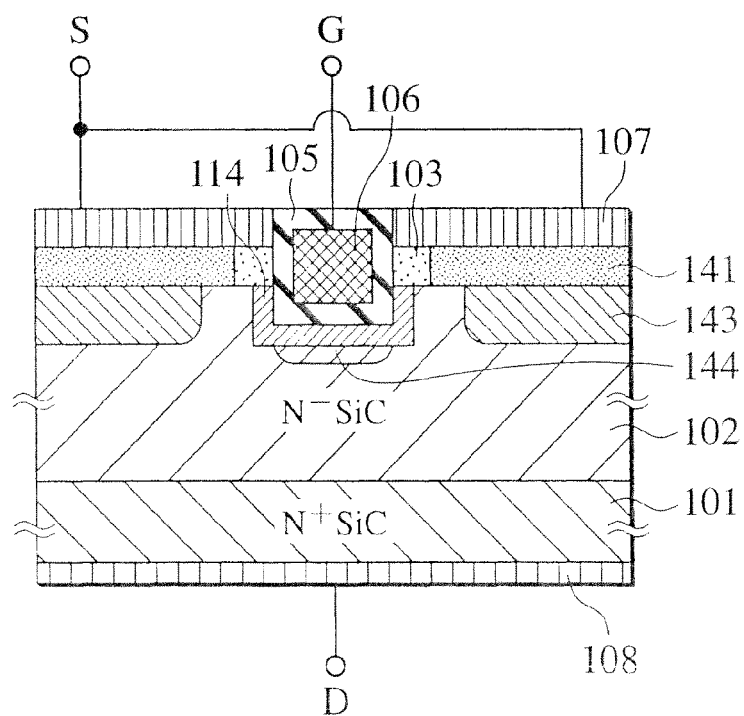
FIG. 45 is a sectional view of another semiconductor device of the fourteenth embodiment according to the present invention.

It should be noted that, if the conduction region 114 is formed in a way that the concentration of impurities exhibited by the conduction region 114 is lower than the concentration of impurities exhibited by the second field relaxation region 144 in the step shown by FIG. 50B, a structure shown in FIG. 44 is obtained. If the conduction region 114 is formed in a way that the concentration of impurities exhibited by the conduction region 114 is higher than the concentration of impurities exhibited by the second field relaxation region 144 in the step shown by FIG. 50B, a structure shown in FIG. 45 is obtained.

As described above, the semiconductor device according to this embodiment can be realized by use of conventional technologies with ease.

While in a conduction state, this construction relaxes energy barrier in a heterojunction interface between the first source region 103 and the conduction region 114, and accordingly higher conduction properties can be obtained, which is the same effect as the conduction region 114 brings about as shown in the twelfth embodiment. This construction also enables dielectric breakdown of the gate insulating film 105 to hardly occur, since drain field which has been applied onto the gate insulating film 105 is relaxed by the second field relaxation region 144.

In addition, the construction method shown in this embodiment enables the width of a portion, where the conduction region 114 is in contact with the first source region 103, to be formed so that the width is sufficiently minimum with precision by a self alignment process at the same time. This construction method also enables the second field relaxation field 144 to be formed by a self alignment process. This makes it possible to inhibit maldistribution of current between each two cells while in a conduction state and while in a cutoff state. Accordingly, leakage current in the heterojunction interface between the first source region 103 and the conduction region 114 can be reduced to the utmost while in a cutoff state, and drain field in the gate insulating film 105 can be relaxed in a compatible manner. Consequently, on state resistance can be reduced without cutoff performance being impaired and without reliability being damaged.

Incidentally, although the eleventh to fourteenth embodiments have been described citing an example of a semiconductor device whose substrate material is silicon carbide, other semiconductor materials such as silicon, silicon germanium, gallium nitride and diamond may be used as substrate materials.

In addition, although all the embodiments have been described citing a case that a polytype of the silicon carbide is 4H, other polytypes such as 6H and 3C may be also used.

Again, although all the embodiments have been described citing an example of what is called a vertically structured transistor, where the drain electrode 108 and the source electrode 107 are arranged to be opposite to each other with the drain region 102 placed in-between, which causes drain current to flow in the vertical direction, it does not matter that the semiconductor device is manufactured of what is called a horizontally structured transistor, where the drain electrode 108 and the source electrode 107 are arranged on the same main surface, and which causes drain current to flow in the horizontal direction.

Additionally, although all the embodiments have been described citing a case that polycrystalline silicon is used as a material for the first source region 103 and the second source region 141, whatever material, i.e. germanium and silicon germanium, may be used if the material forms heterojunction with silicon carbide.

Moreover, although all the embodiments have been described citing a case that the drain region 102 is formed of n type silicon carbide and the first source region 103 is formed of n type polycrystalline silicon, any one of a combination of n type silicon carbide for the drain region 102 with p type polycrystalline silicon for the first source region 103, a combination of p type silicon carbide for the drain region 102 with p type polycrystalline silicon for the first source region 103 and a combination of p type silicon carbide for the drain region 102 with n type polycrystalline silicon for the first source region 103 may be employed.

The entire contents of Japanese patent applications P2003-331246 filed Sep. 24, 2003, P2003-331262 filed Sep. 24, 2003, P2004-65468 filed Mar. 9, 2004 and P2004-65958 filed Mar. 9, 2004 are hereby incorporated by reference.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method of manufacturing a semiconductor device, comprising:
    (1) growing a source region on a surface of a semiconductor body;
    (2) growing a low resistance region contacting with the source region;
    (3) etching the low resistance region and the source region with the same mask pattern in a selective manner; and
    (4) forming a gate insulating film contacting with the low resistance region, the source region and the semiconductor body.

2. The method as claimed in claim 1, further comprising after the step (1),
    growing an interlayer separating film; and
    etching the interlayer separating film in a selective manner.

3. The method as claimed in claim 1, wherein
    the gate insulating film is formed of a deposited layer.

4. The method as claimed in claim 3, further comprising:
forming a second conductivity type field relaxation region in the semiconductor body,
wherein the source region is formed in contact with the field relaxation region.

5. The method as claimed in claim 3, further comprising:
forming a first conductivity type conduction region in the semiconductor body, the concentration of impurities of the conduction region being higher than that of the semiconductor body,
wherein the source region is formed in contact with the conduction region.

6. The method as claimed in claim 3, wherein the step (1) is:
growing a first source region on the surface of a semiconductor body and forming a second source region in the first source region, concentration of impurities of the second source region is different from that of the first source region.

7. The method as claimed in claim 3, wherein
the deposited layer is a silicon oxide film which is grown by chemical vapor deposition process with TEOS for a material gas.

8. The method as claimed in claim 3, wherein
the semiconductor body is made of widegap semiconductor.

9. The method as claimed in claim 3, wherein
the main ingredient of the source region is one of monocrystalline silicon, polycrystalline silicon, and amorphous silicon.

10. The method as claimed in claim 1, wherein the forming the source region comprises:
   (1) depositing the source region on the semiconductor body;
   (2) selectively etching the source region using mask pattern; and
   (3) introducing impurities into the source region by the etching portion.

11. The method as claimed in claim 10, wherein
the step (3) is carried out using the mask pattern of step (2).

12. The method as claimed in claim 10, wherein
the introducing impurities is carried out through ion-implantation.

13. The method as claimed in claim 10, wherein
the introducing impurities is carried out through solid phase diffusion.

14. The method as claimed in claim 10, wherein the depositing the source region comprises, before the selectively etching:
introducing impurities into a portion in the source region to form a withstanding voltage region.

15. The method as claimed in claim 1, wherein the forming the source region comprises:
   (1) depositing the source region on the semiconductor body;
   (2) selectively etching the source region using mask pattern; and
   (3) introducing impurities into the semiconductor body from the etching portion to form a conduction region or/and a field relaxation region.

16. The method as claimed in claim 1, wherein the depositing the source region comprises:
   (1) depositing the source region on the semiconductor body;
   (2) selectively etching the source region using mask pattern; and
   (3) introducing impurities into the source region and a conduction region and/or a field relaxation region by the etching portion.

* * * * *